(12) United States Patent
Strongin et al.

(10) Patent No.: US 6,381,672 B1
(45) Date of Patent: Apr. 30, 2002

(54) SPECULATIVE OPENING OF A NEW PAGE WHEN APPROACHING PAGE BOUNDARY DURING READ/WRITE OF ISOCHRONOUS STREAMS

(75) Inventors: Geoffrey S. S. Strongin, Austin; Qadeer Ahmad Qureshi, Round Rock, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/569,039

(22) Filed: May 11, 2000

(51) Int. Cl.$^7$ ............................ G06F 13/00; G11C 7/00
(52) U.S. Cl. .................. 711/105; 711/154; 365/238.5
(58) Field of Search .................. 711/105, 154, 711/167; 365/193, 238.5

(56) References Cited

U.S. PATENT DOCUMENTS

| | | | |
|---|---|---|---|
| 5,745,913 A | 4/1998 | Pattin et al. ................ | 711/105 |
| 5,907,860 A | 5/1999 | Garibay, Jr. et al. ........ | 711/117 |
| 6,199,138 B1 * | 3/2001 | Jeddeloh ..................... | 711/105 |
| 6,199,145 B1 * | 3/2001 | Ajanovic et al. ........... | 711/149 |

OTHER PUBLICATIONS

Micron Technology, Inc., "Double Data Rate SDRAM", 1999, pp. 1–53.
Micron Technology, Inc., "Rambus™ DRAM", 1999, pp. 1–4.
Micron Technology, Inc., "Rambus® RIMM™", 1999, pp. 1–6.
Micron Technology, Inc., "Synchronous DRAM", 1999, pp. 1–53.
Rambus, Inc., "Rambus® Technology Overview", Feb. 1999, pp. 1–10.
Rambus, Inc., Direct Rambus™ System and Board Design Considerations, May 1998, pp. 1–3.
Micron Technology, Inc., "SDRAM Write to Active Command Timing", 1998, pp. 1–4.
U.S. Patent application No. 09/208,569, filed Dec. 9, 1998, entitled "Method and System for Generating and Utilizing Speculative Memory Access Requests in Data Processing Systems", by Geoffrey S. S. Strongin and Qadeer A. Qureshi.
U.S. Patent application No. 09/207,971, filed Dec. 9, 1998, entitled "Method and System for Page–State Sensitive Memory Control and Access in Data Processing Systems", by Geoffrey S. S. Strongin and Qadeer Ahmad Qureshi.

* cited by examiner

*Primary Examiner*—David L. Robertson
(74) *Attorney, Agent, or Firm*—Zagorin, O'Brien & Graham, LLP

(57) ABSTRACT

A memory controller detects an approaching end of a currently open page for an access operation for a particular data stream. The memory controller, in response to detecting the approaching end of the currently open page and if the particular data stream is of a predetermined type, such as an isochronous data stream, the memory controller speculatively opens a next page in the memory.

26 Claims, 39 Drawing Sheets

| FIG. 6A | FIG. 6B |
|---|---|

FIG. 6

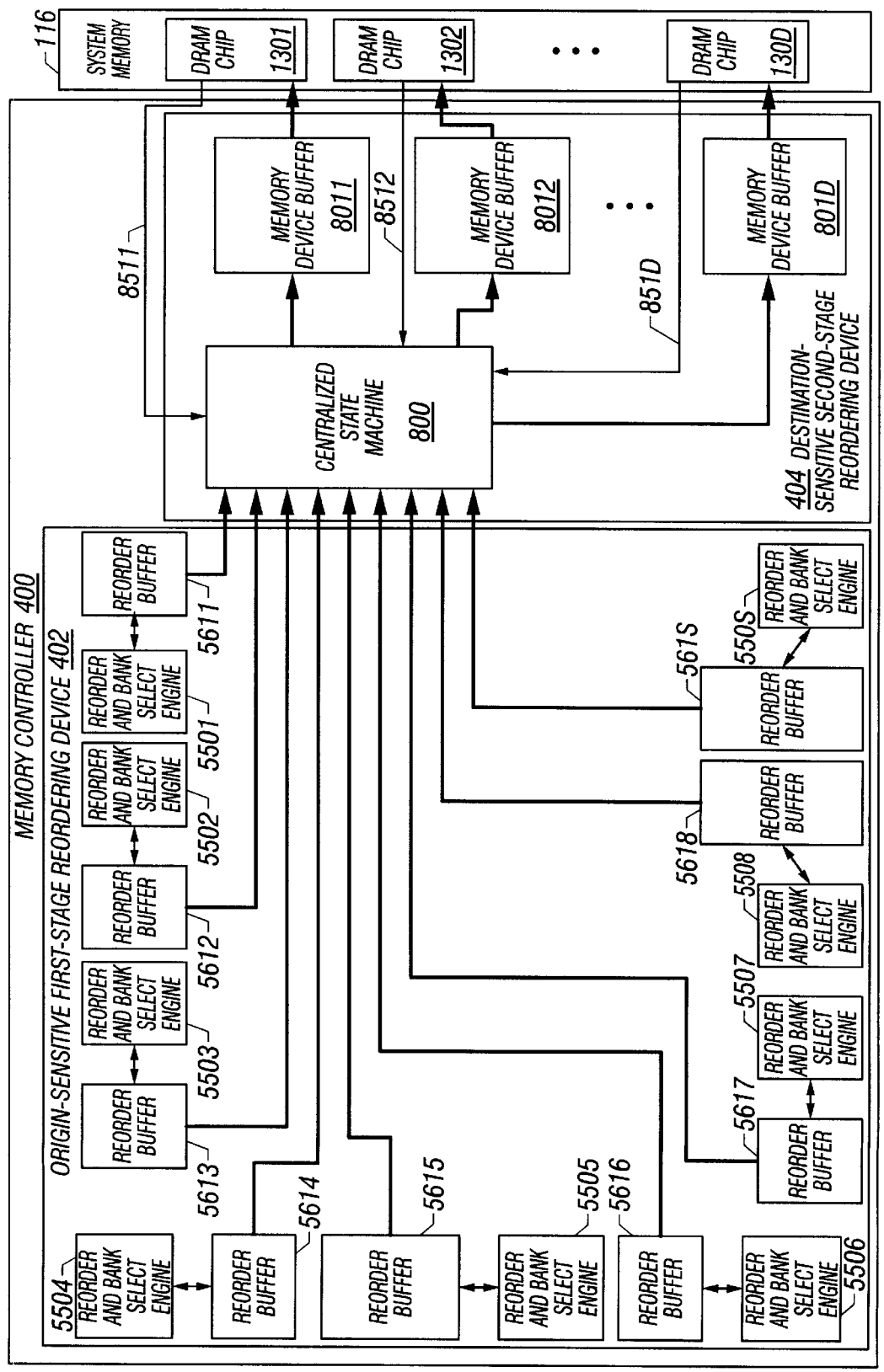
FIG. 8A1

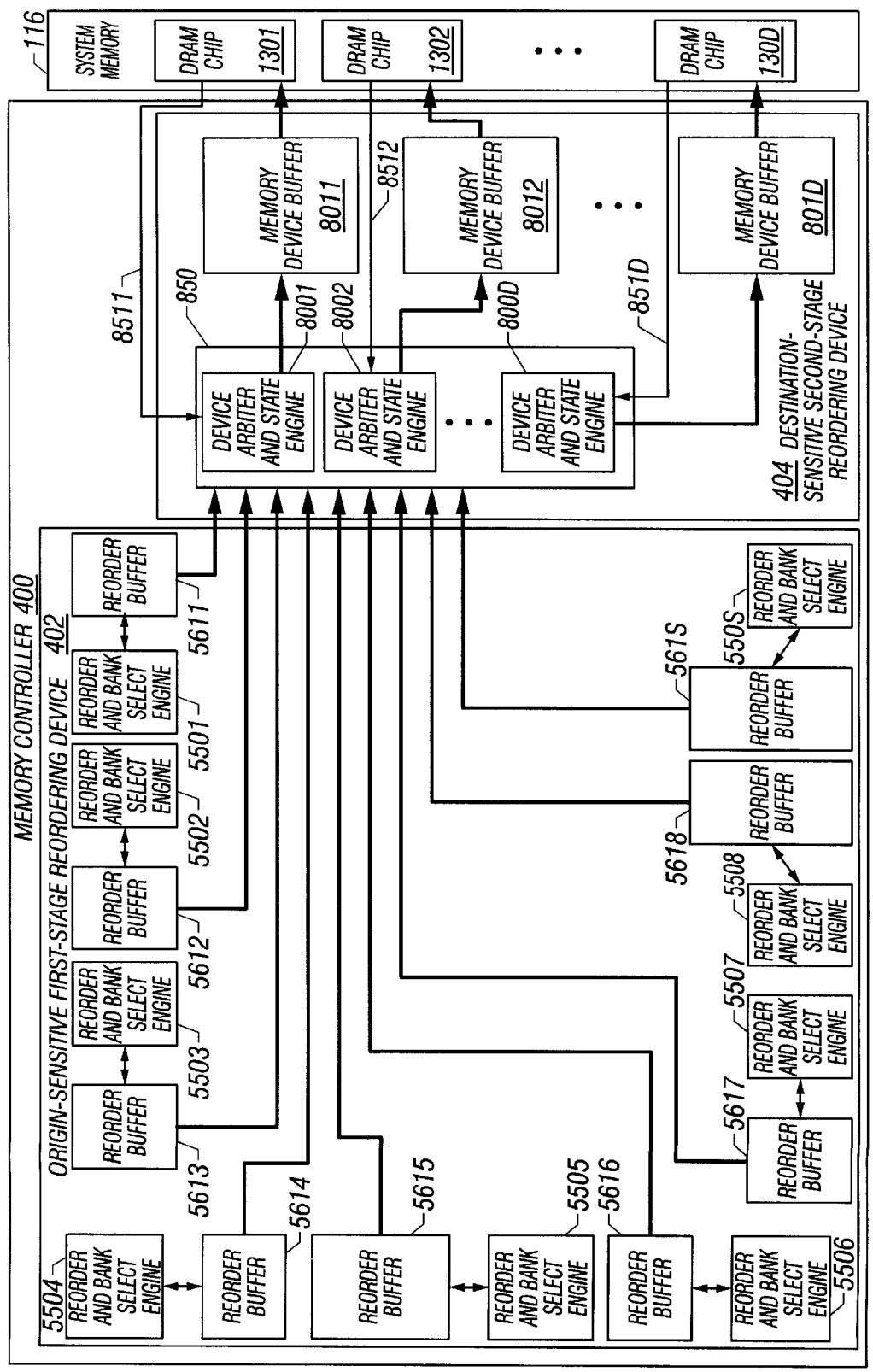
FIG. 8A2

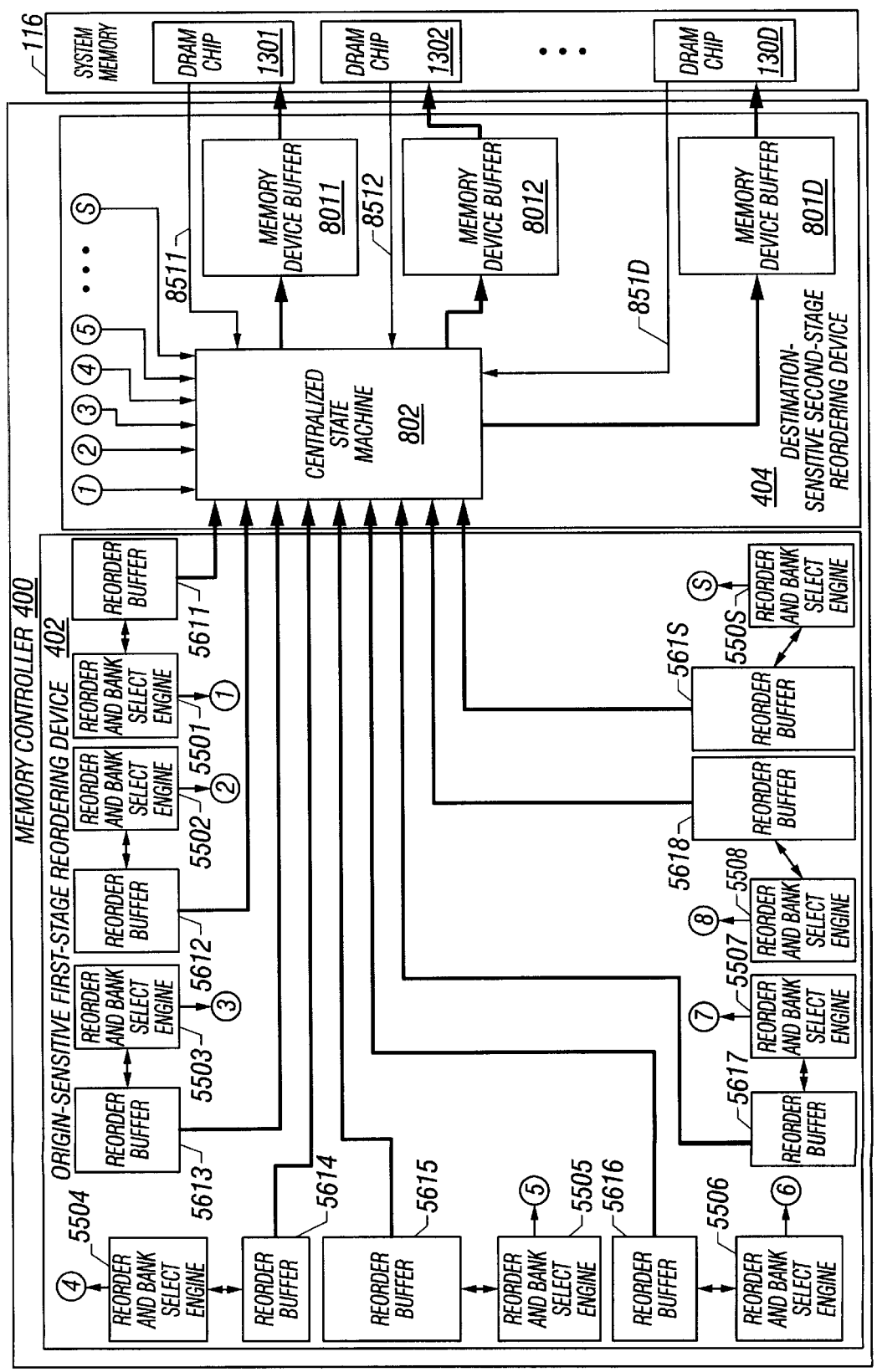
FIG. 8B1

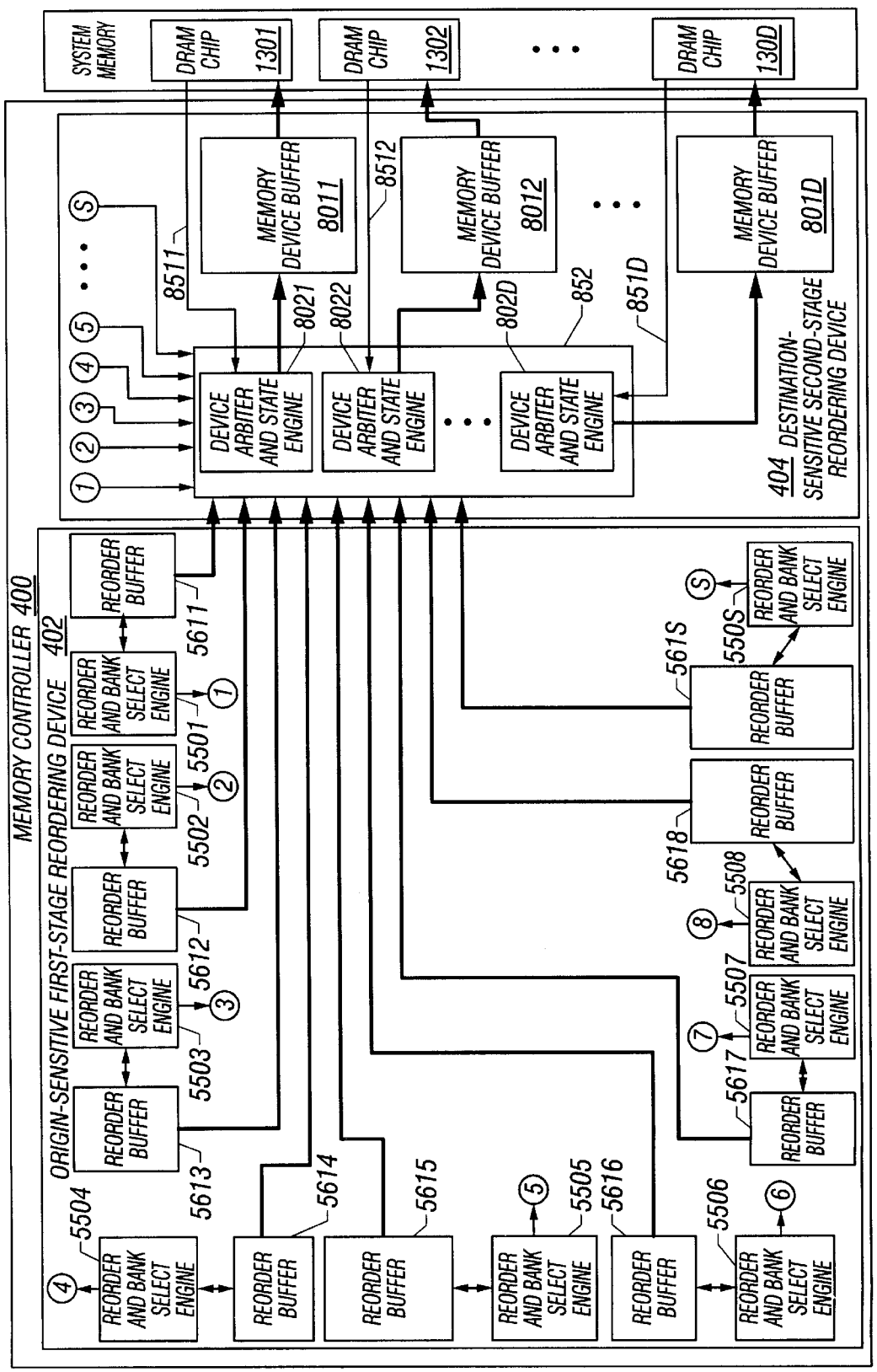
FIG. 8B2

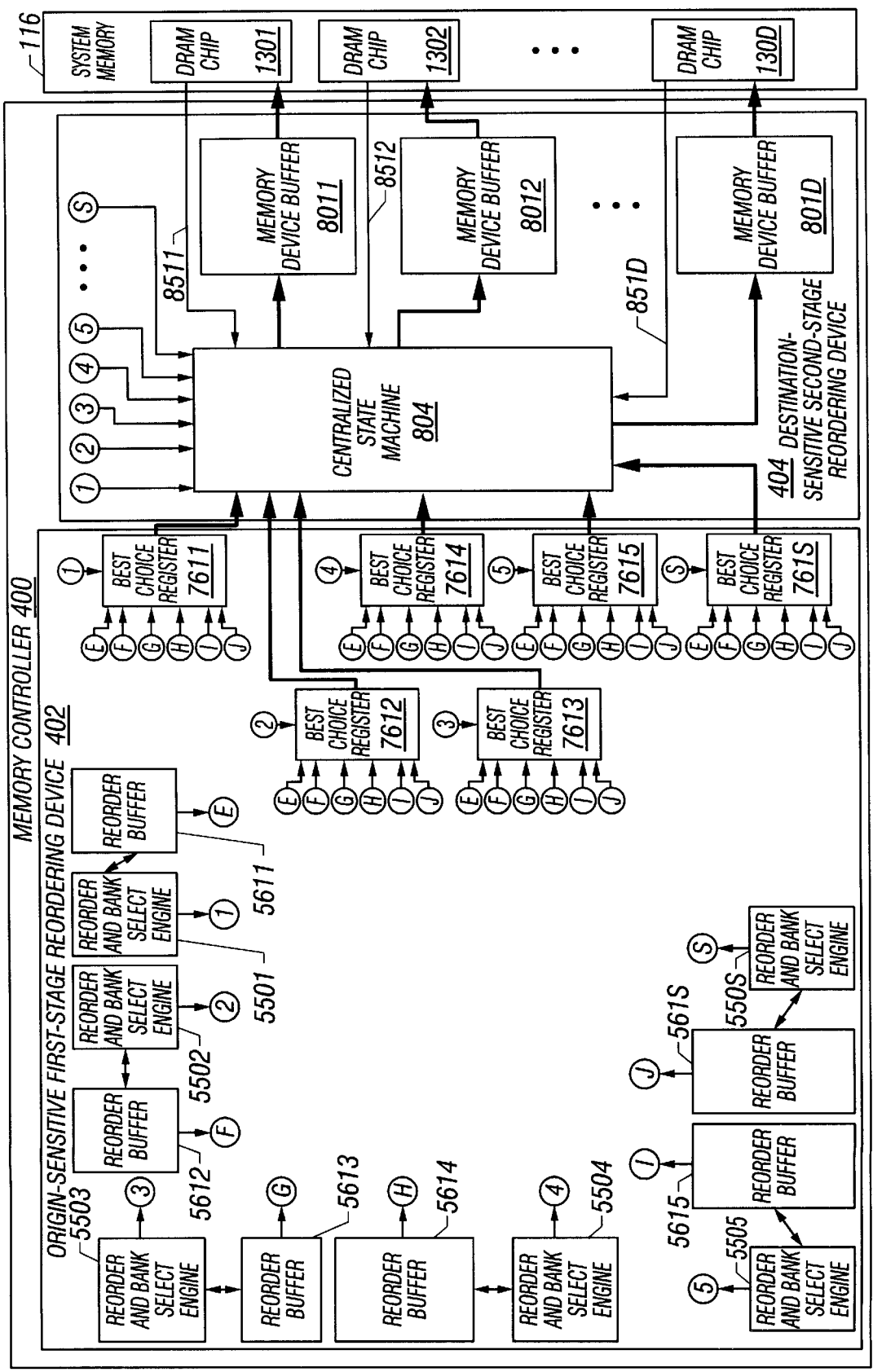
FIG. 8C1

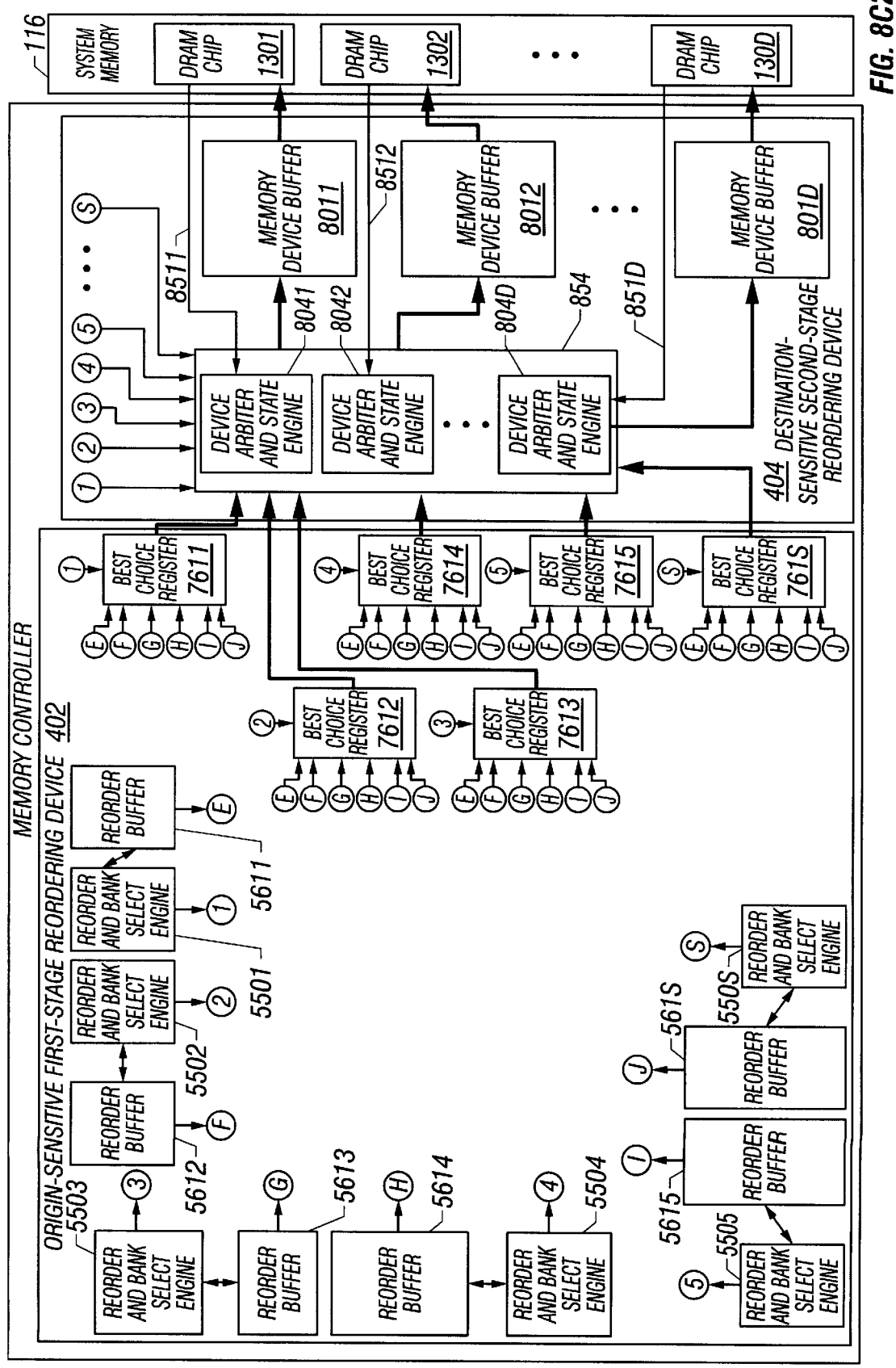
FIG. 8C2

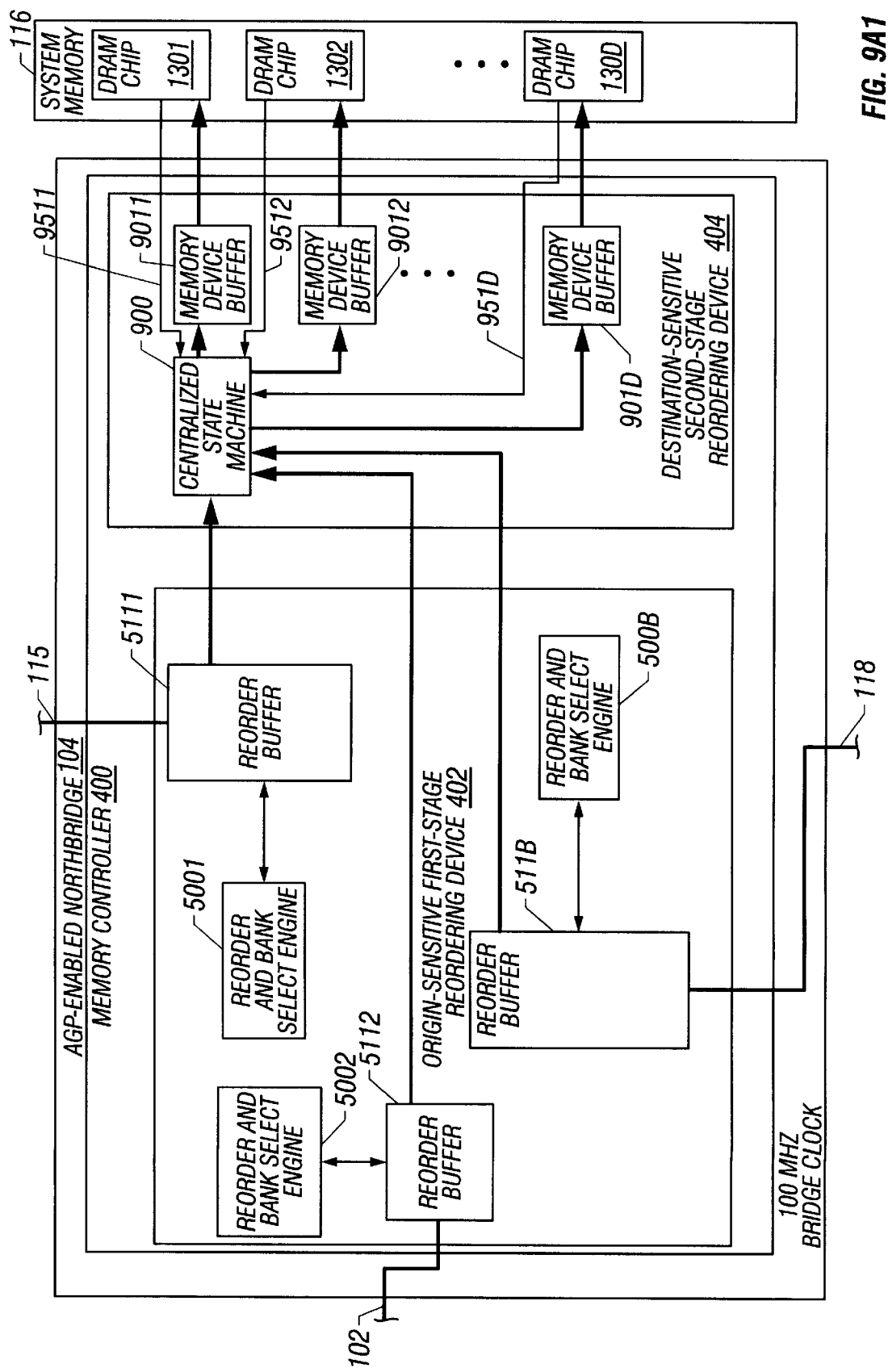
FIG. 9A1

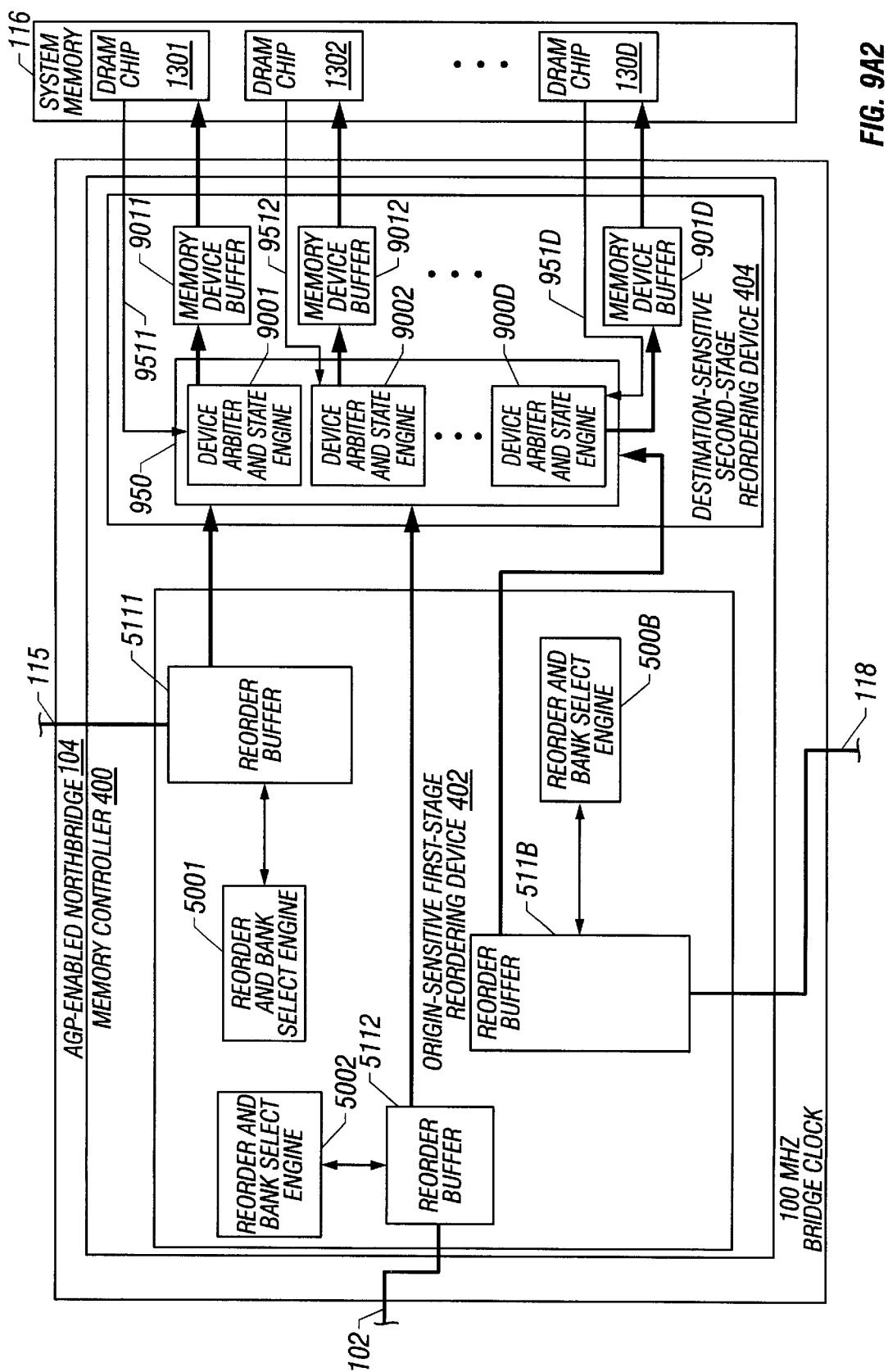
FIG. 9A2

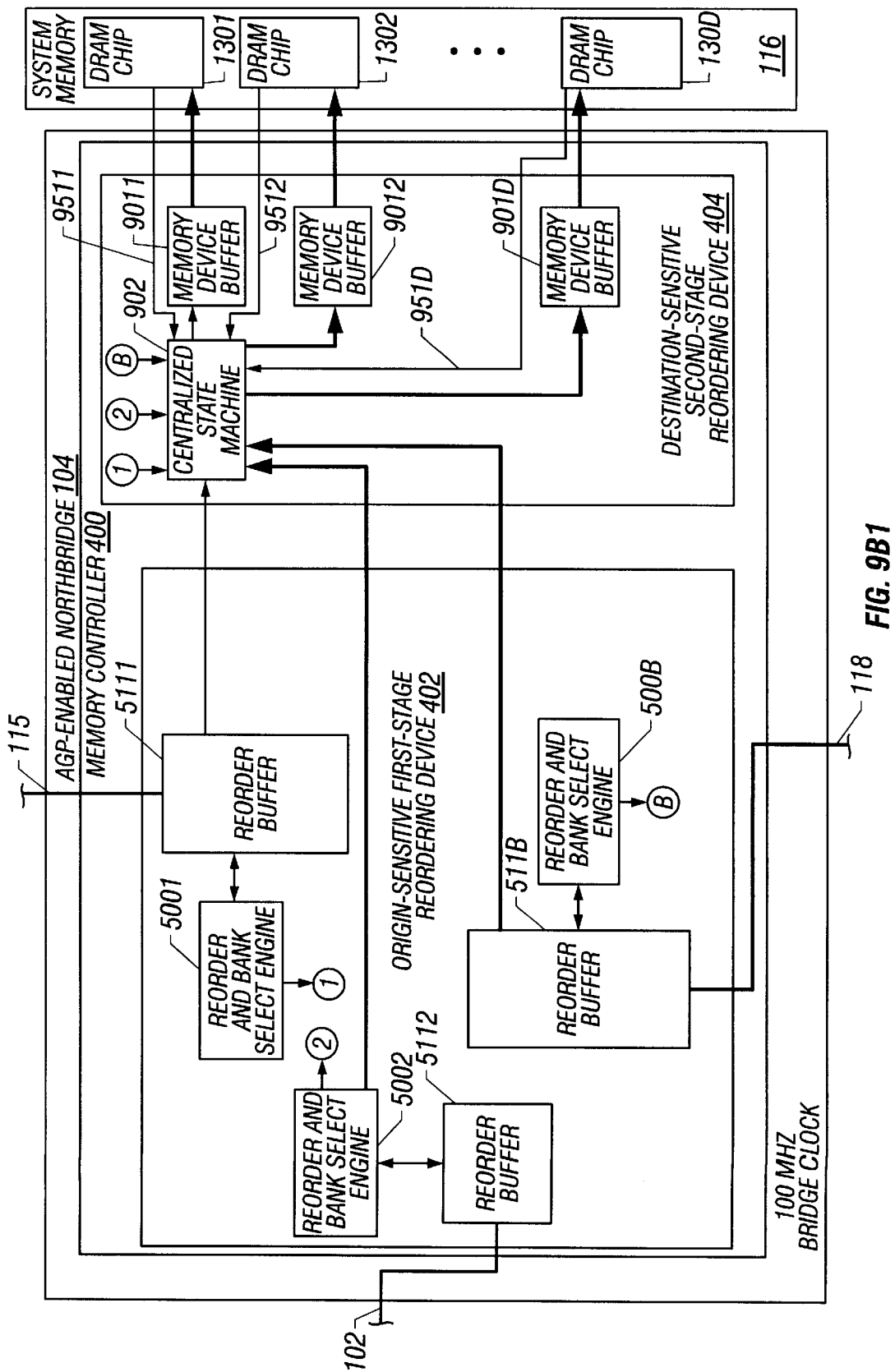
FIG. 9B1

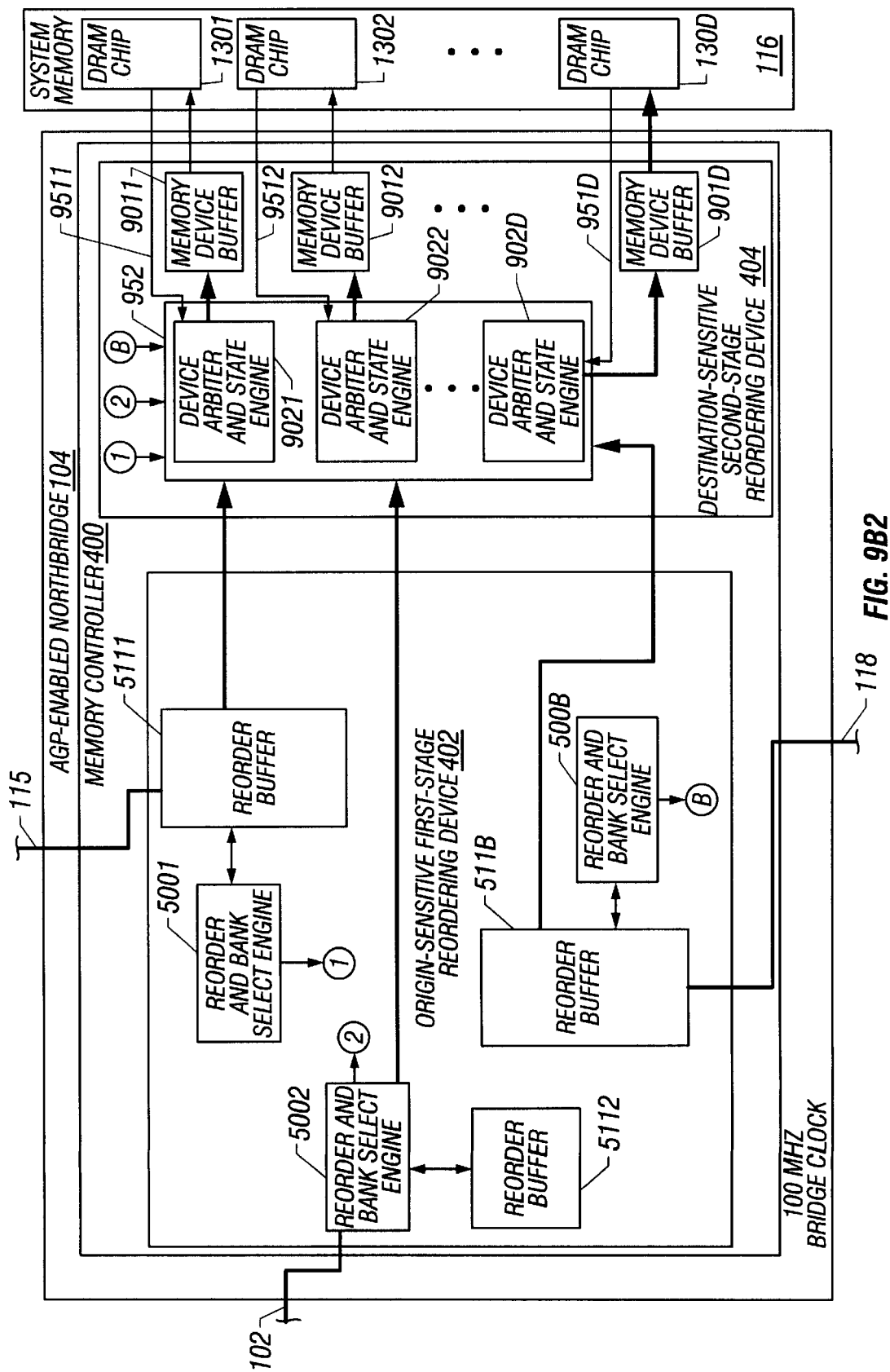
FIG. 9B2

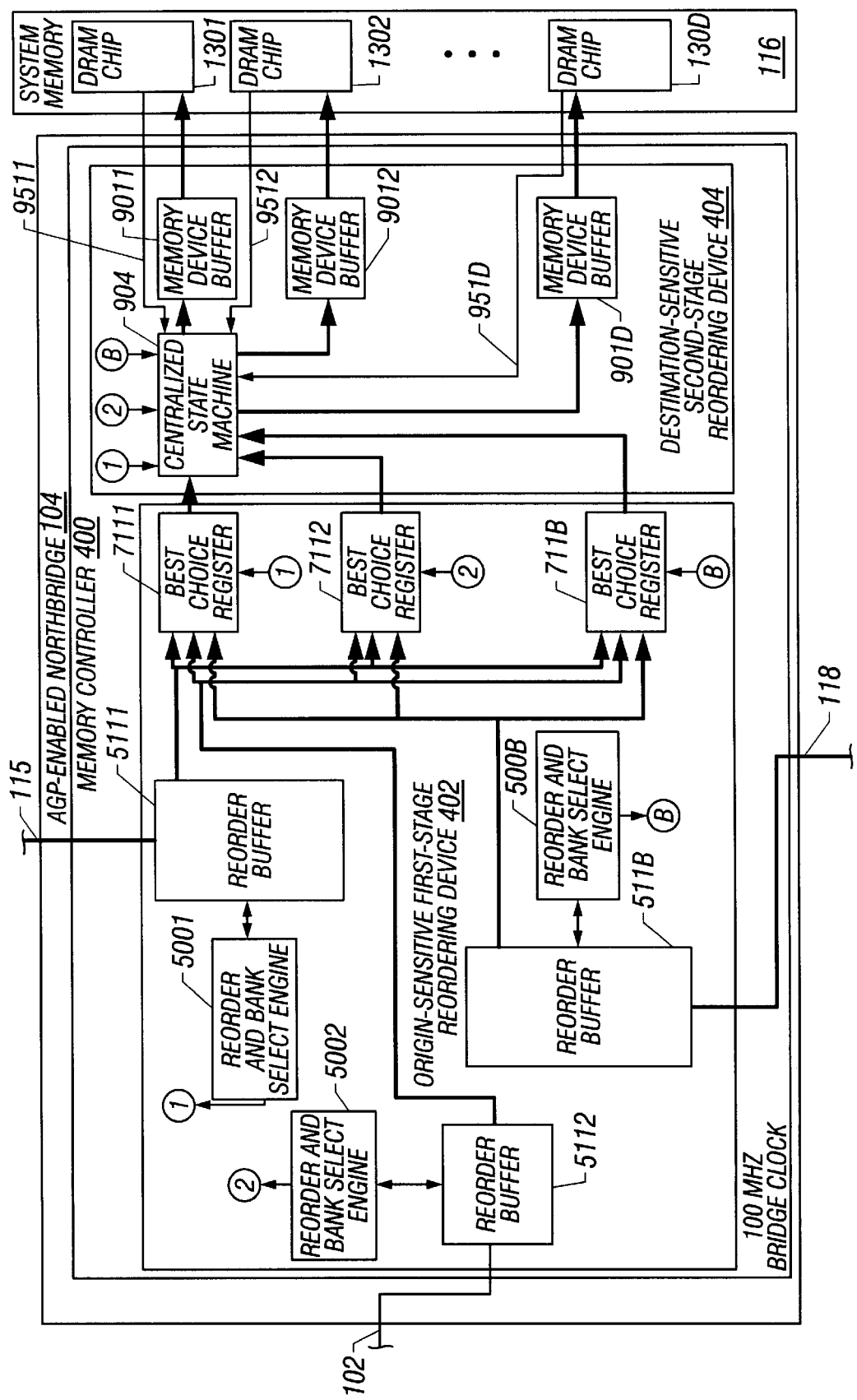
FIG. 9C1

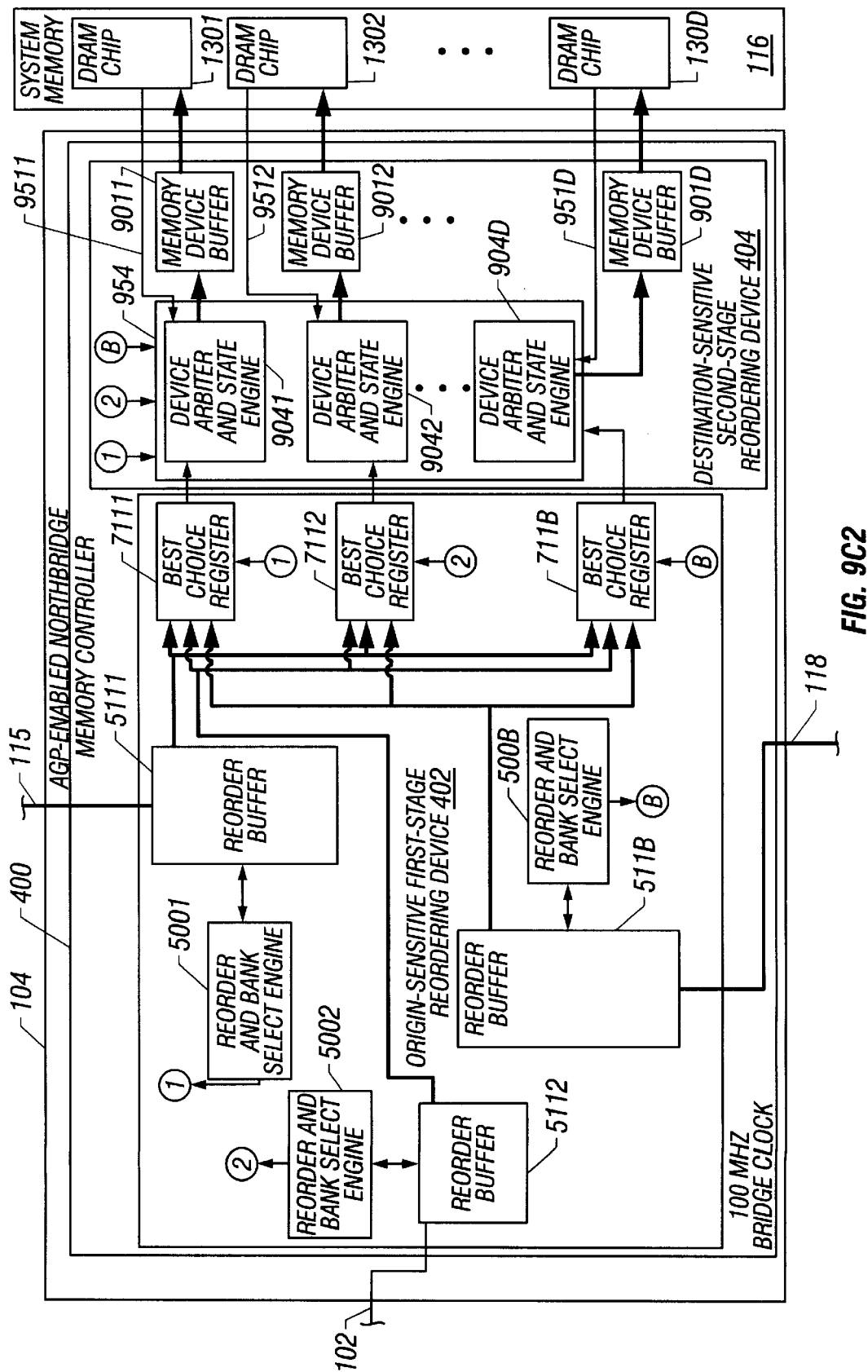
FIG. 9C2

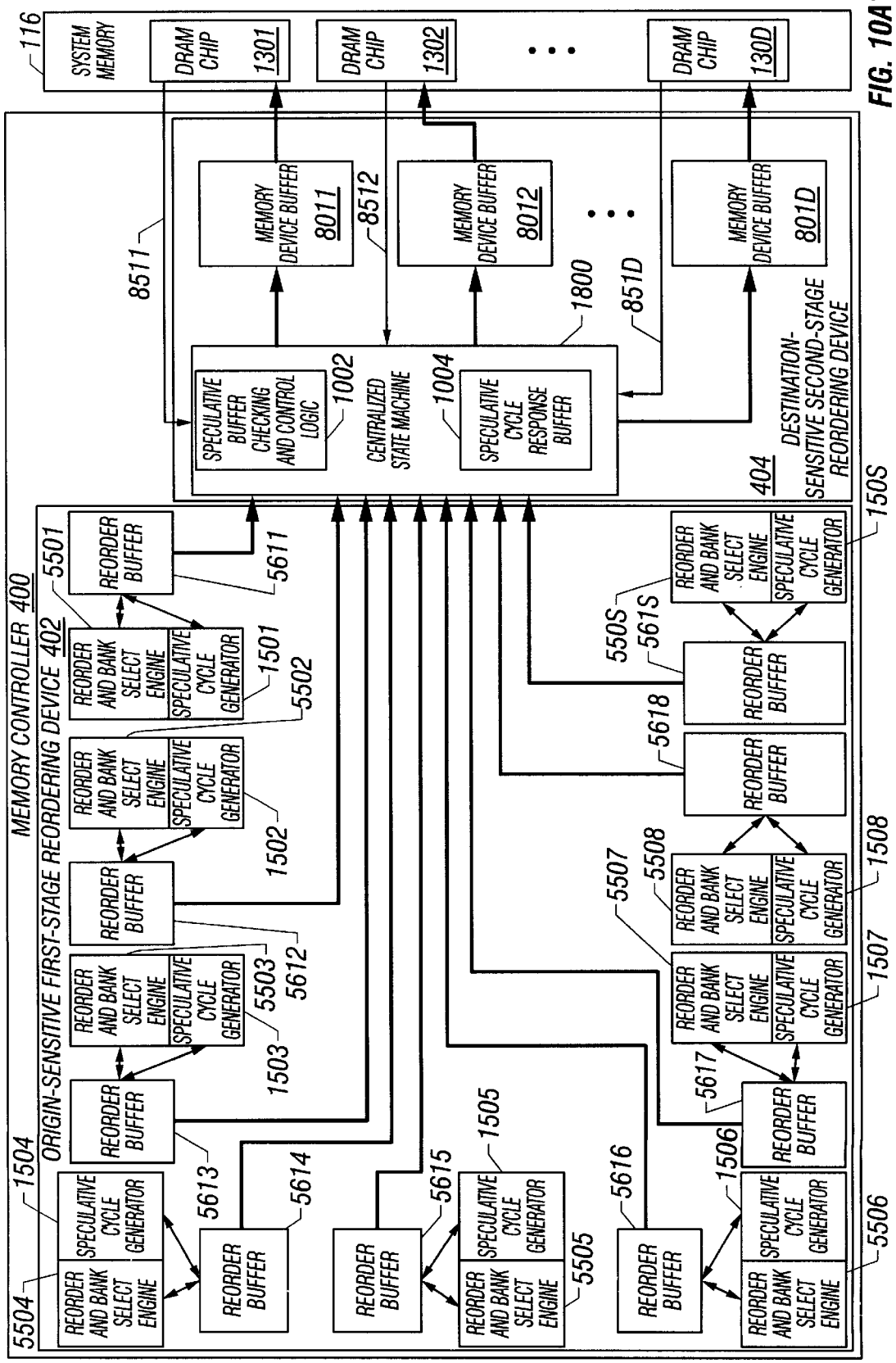

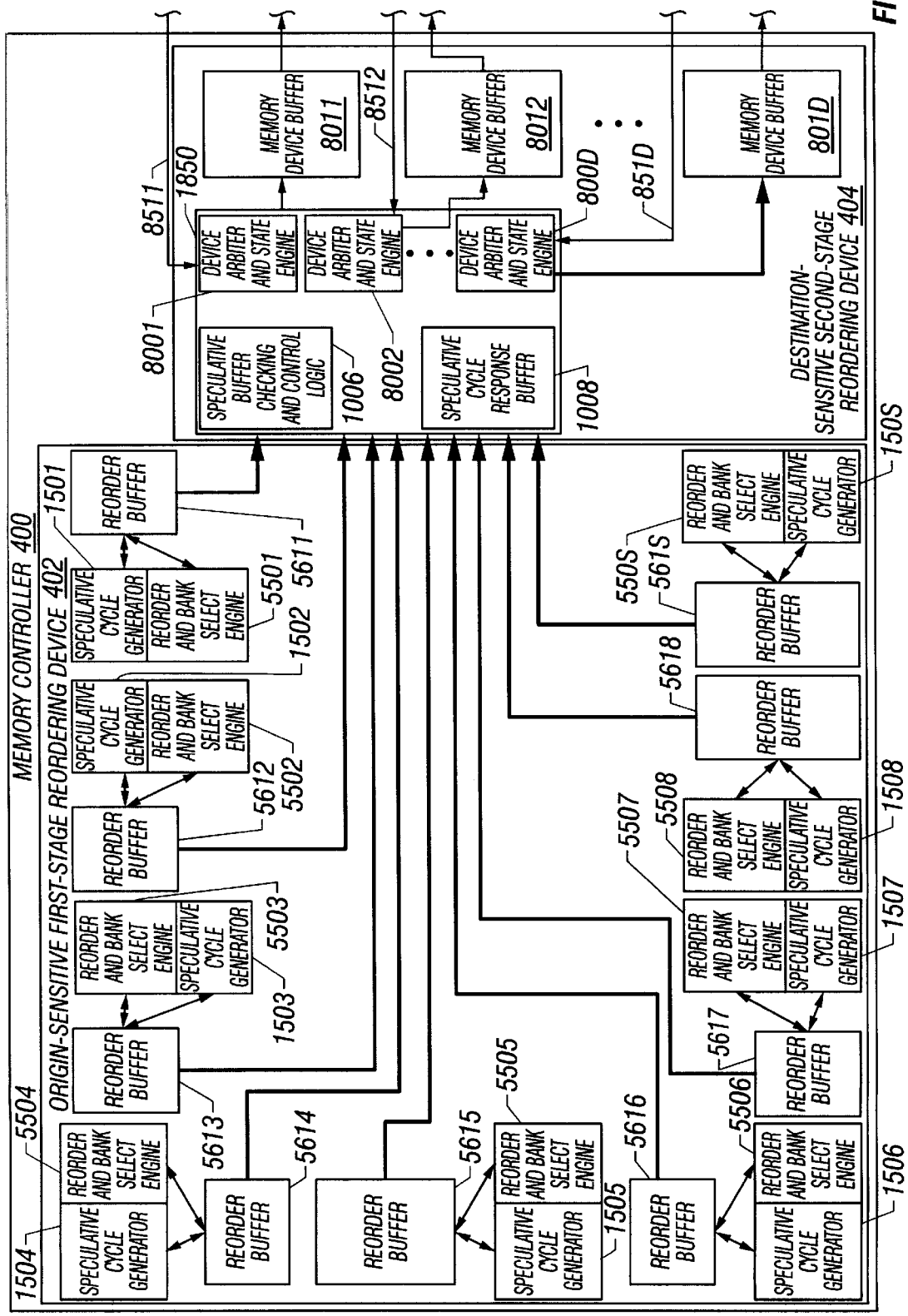
FIG. 10A2

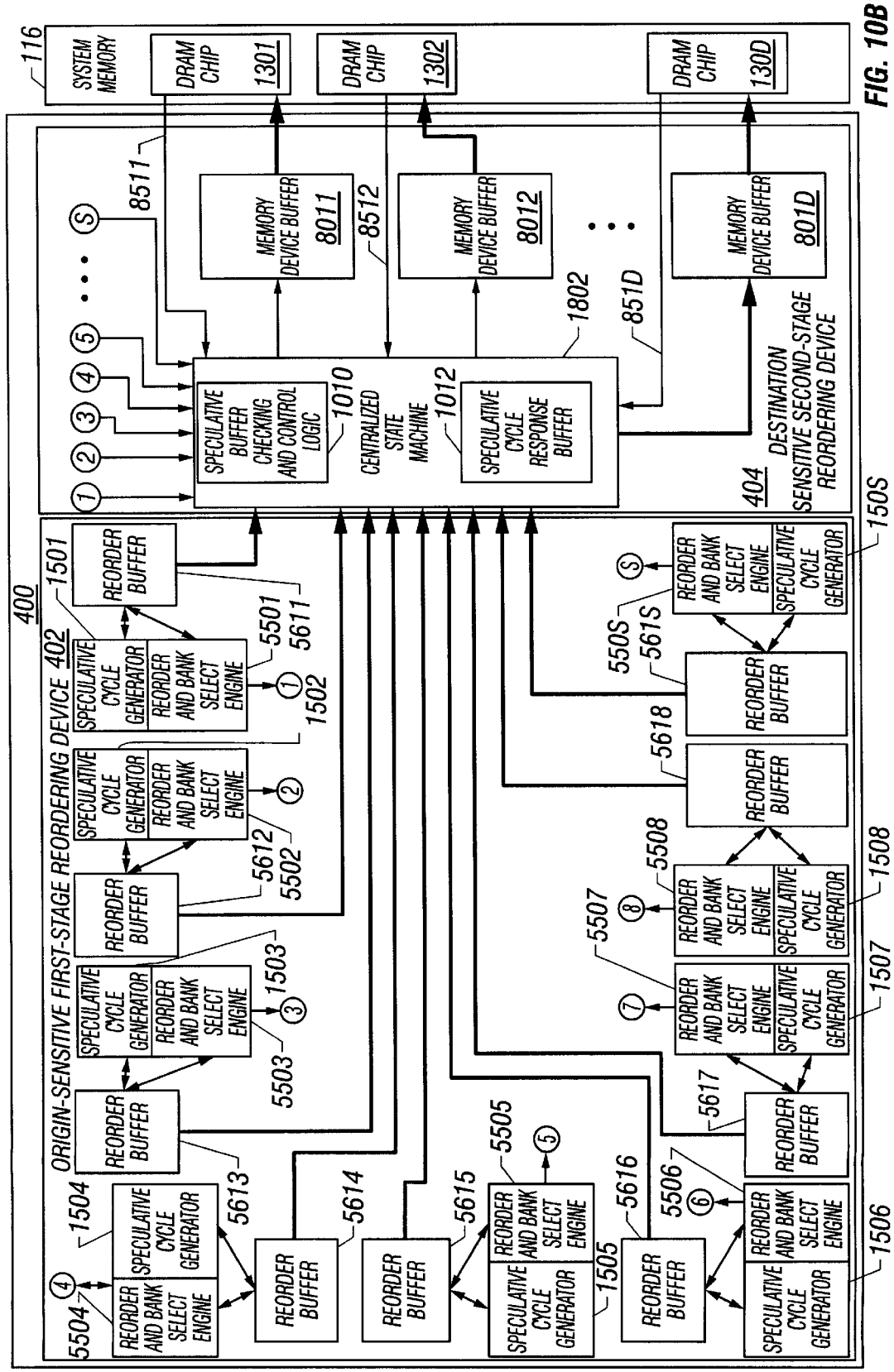
FIG. 10B1

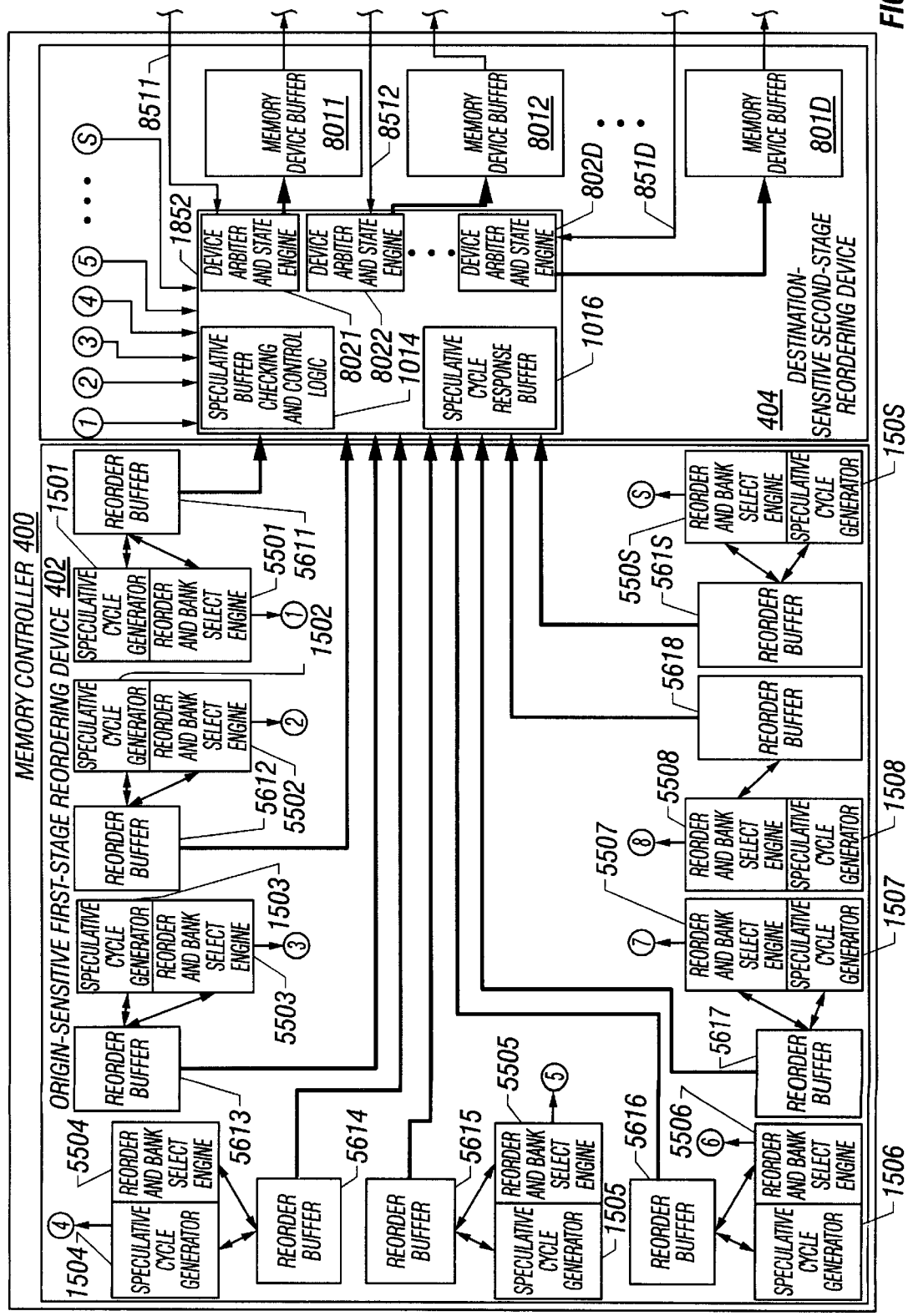
FIG. 10B2

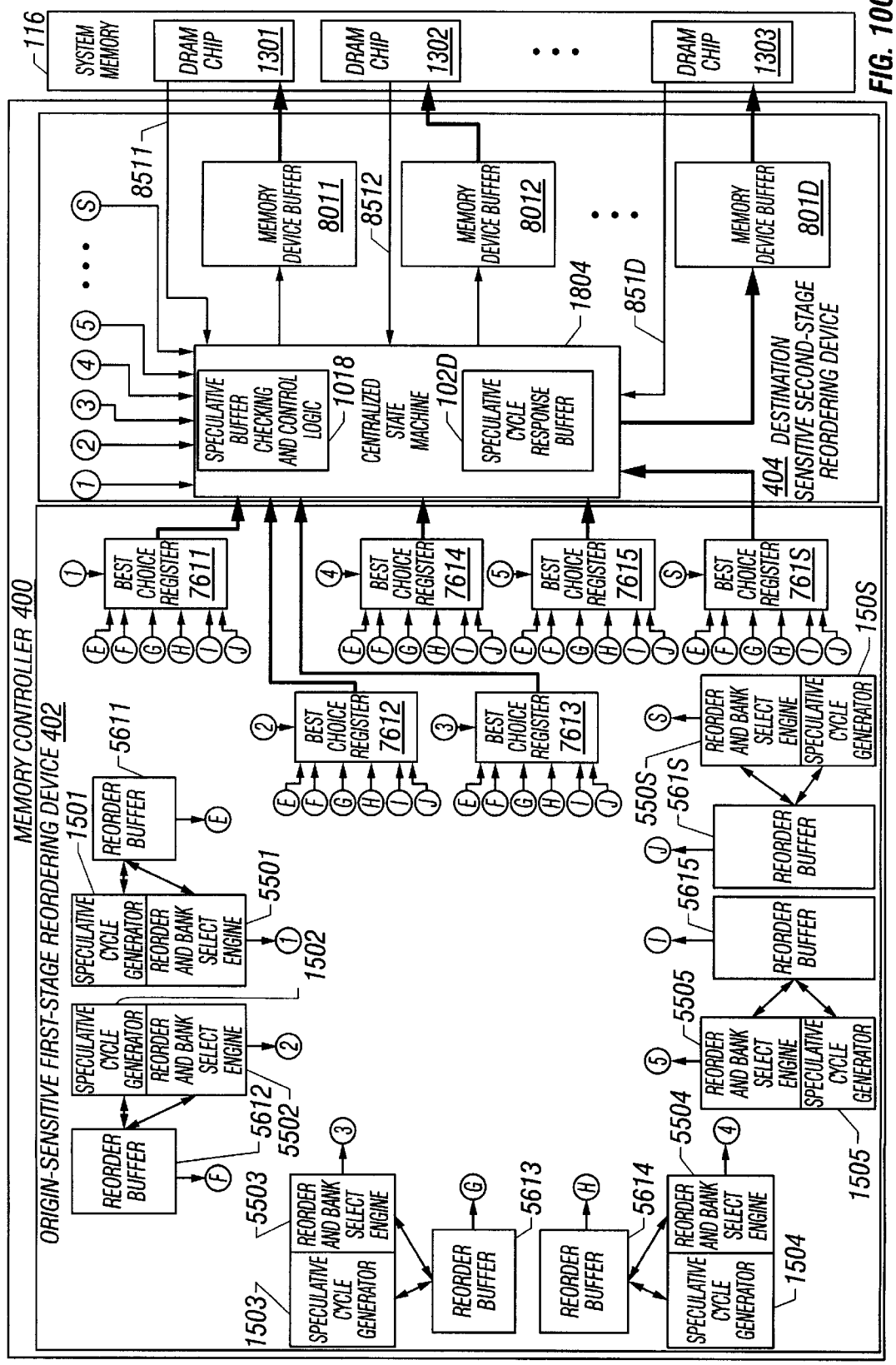
FIG. 10C1

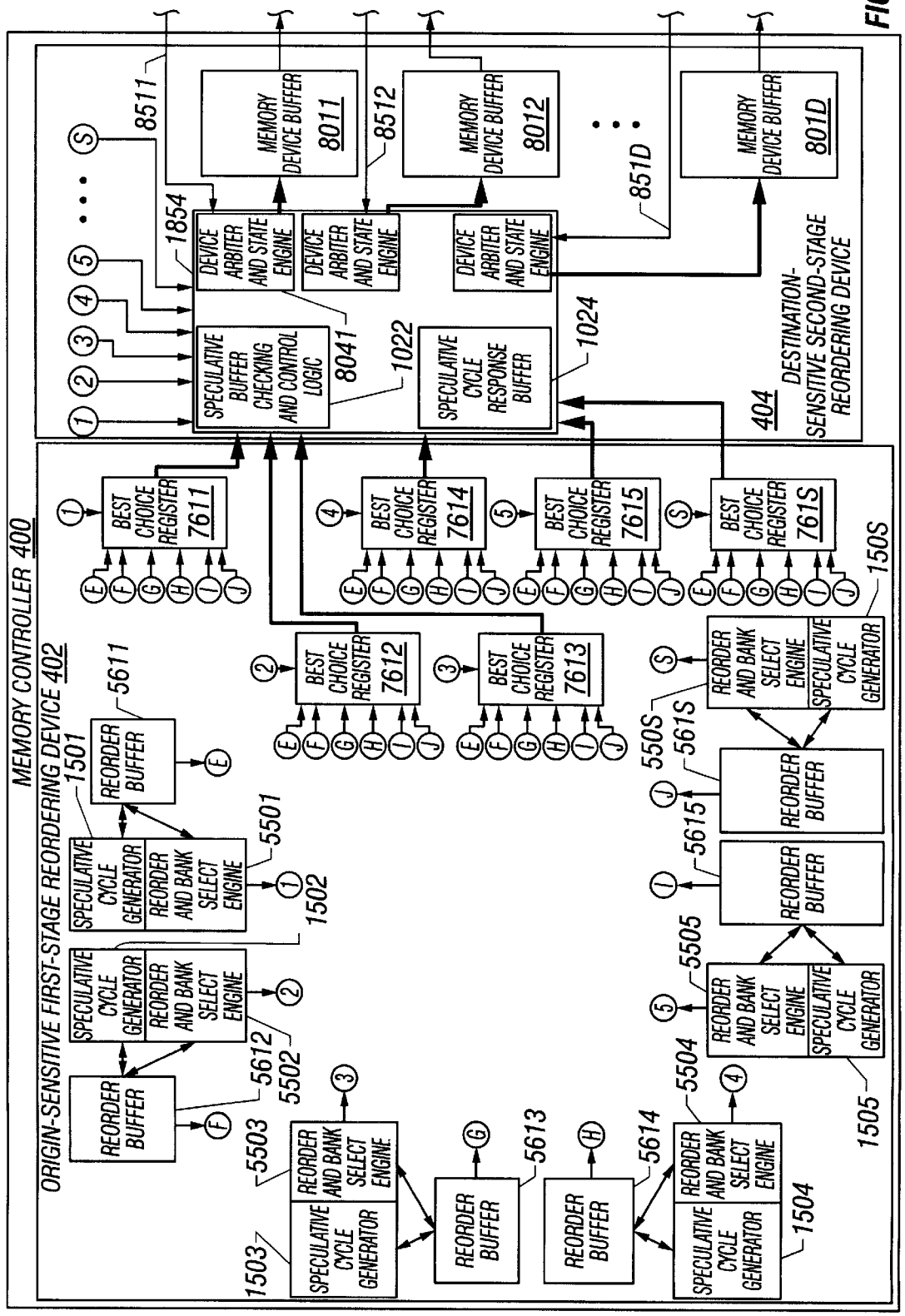
FIG. 10C2

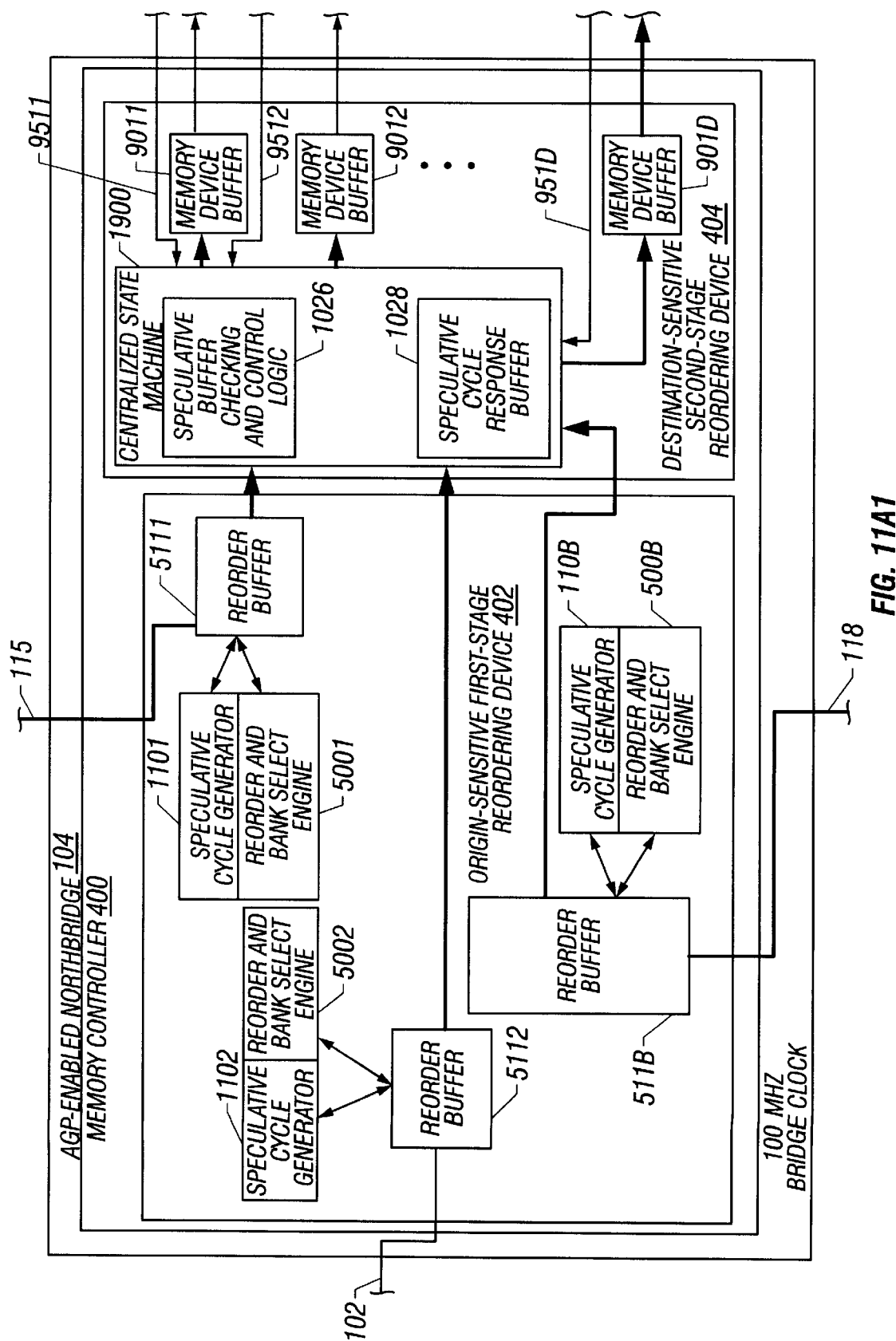
FIG. 11A1

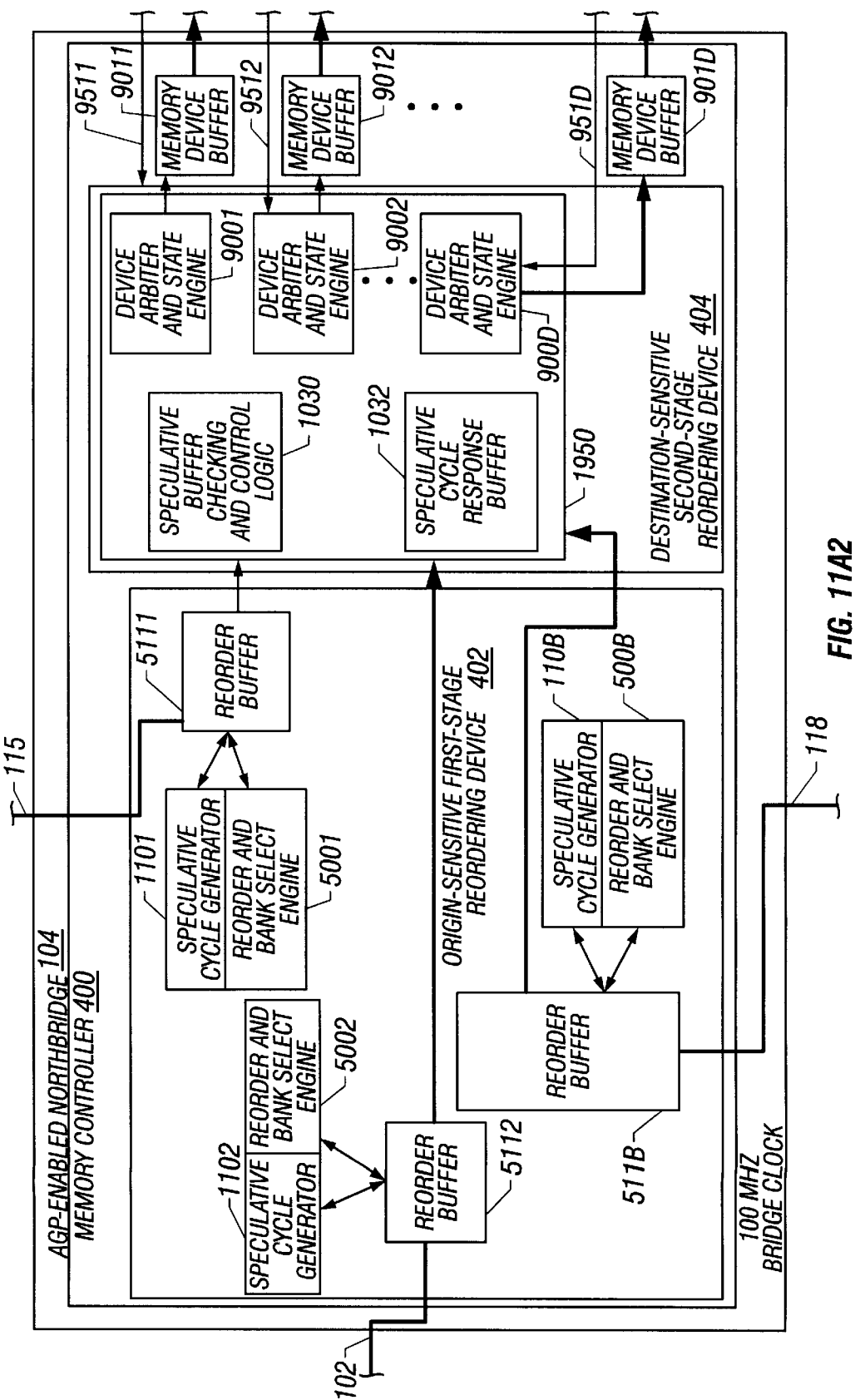
FIG. 11A2

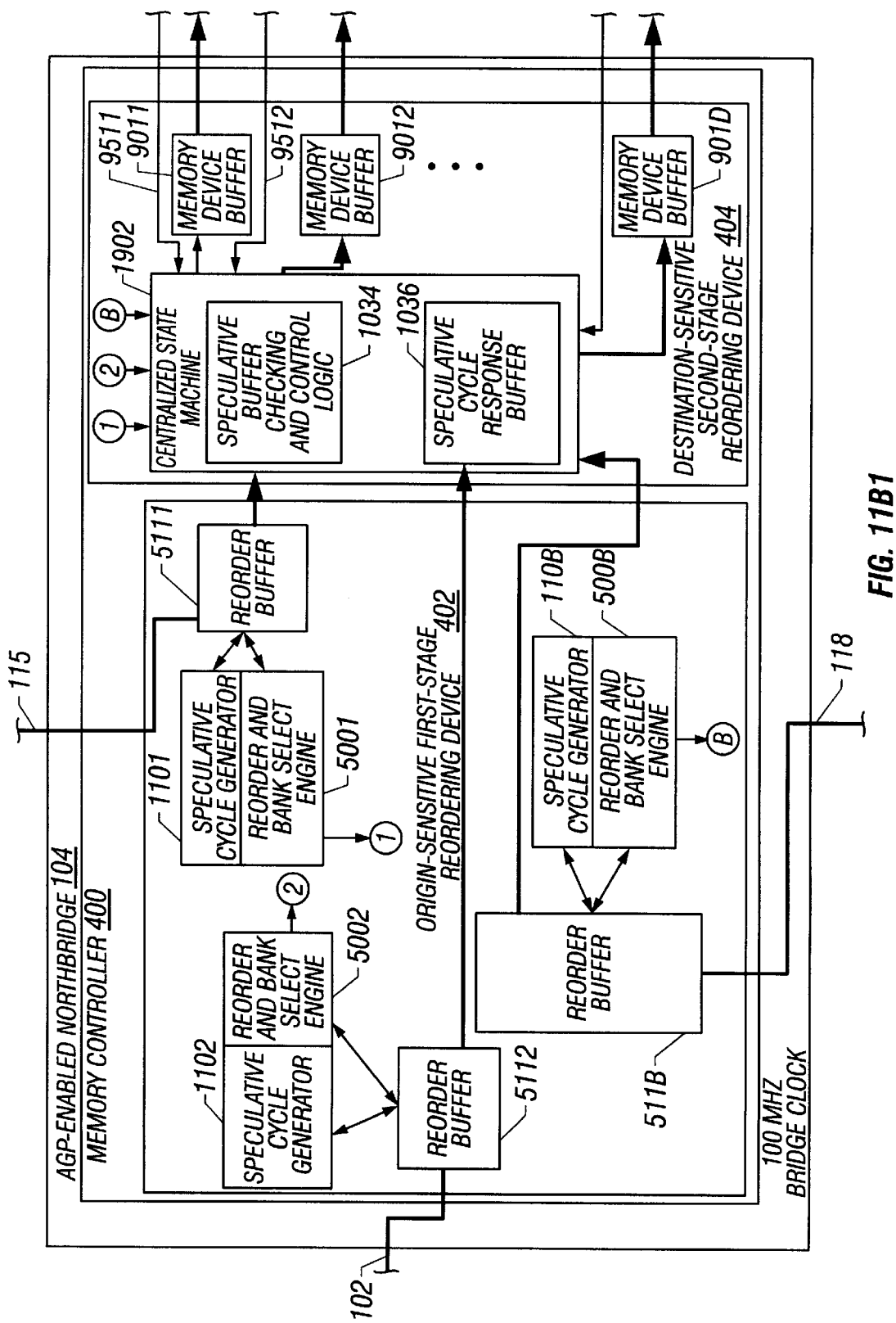
FIG. 11B1

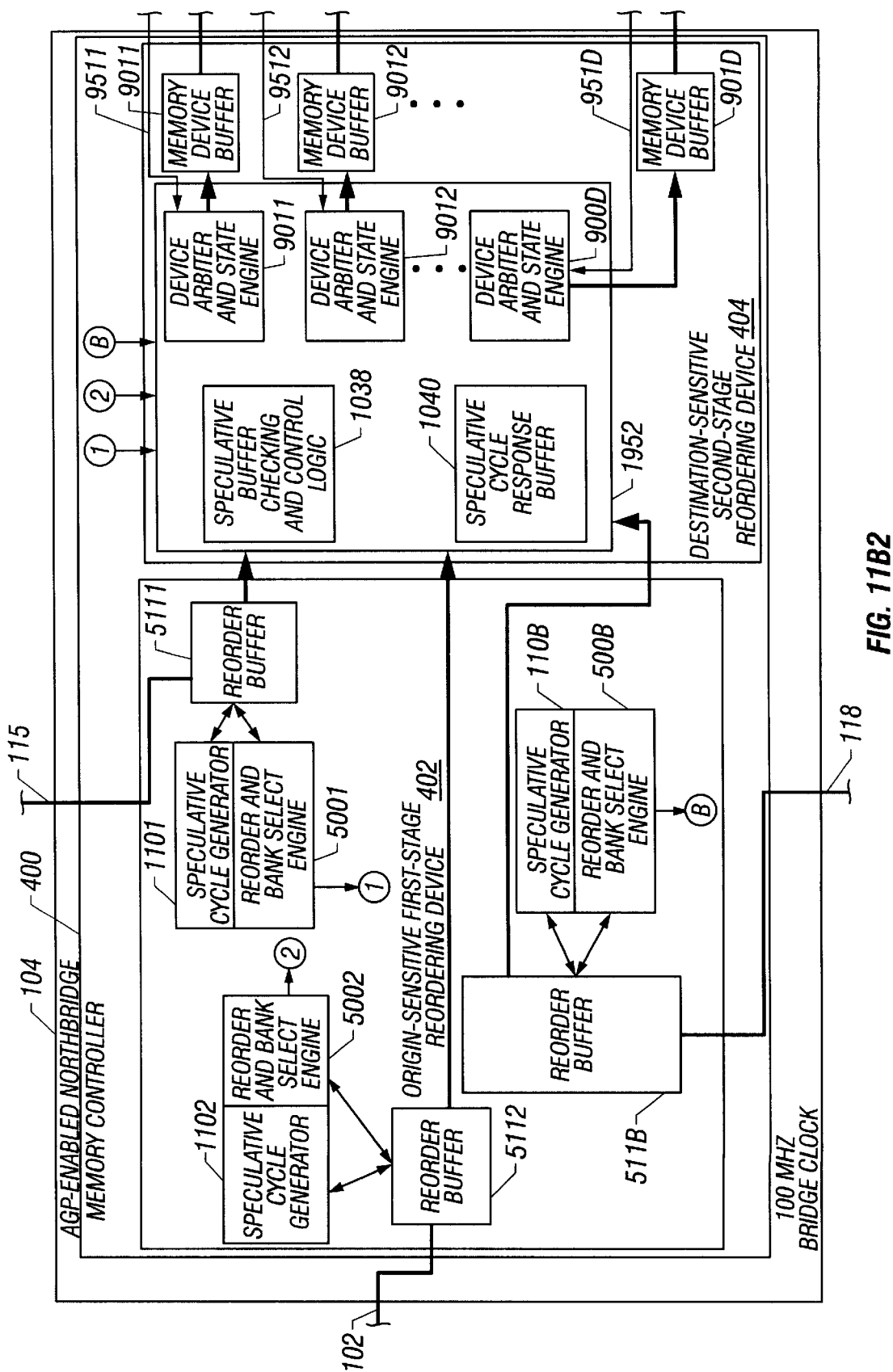
FIG. 11B2

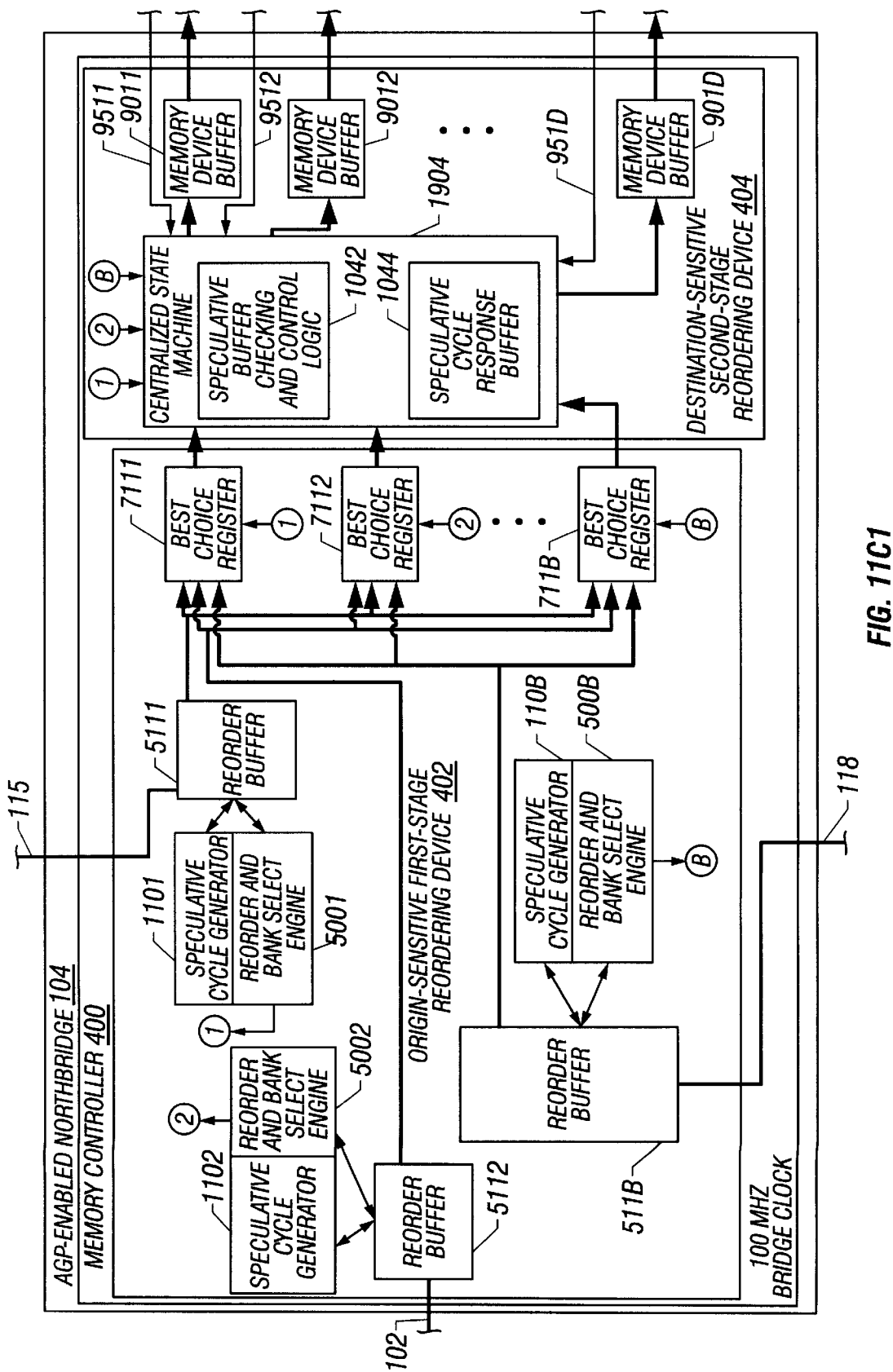
FIG. 11C1

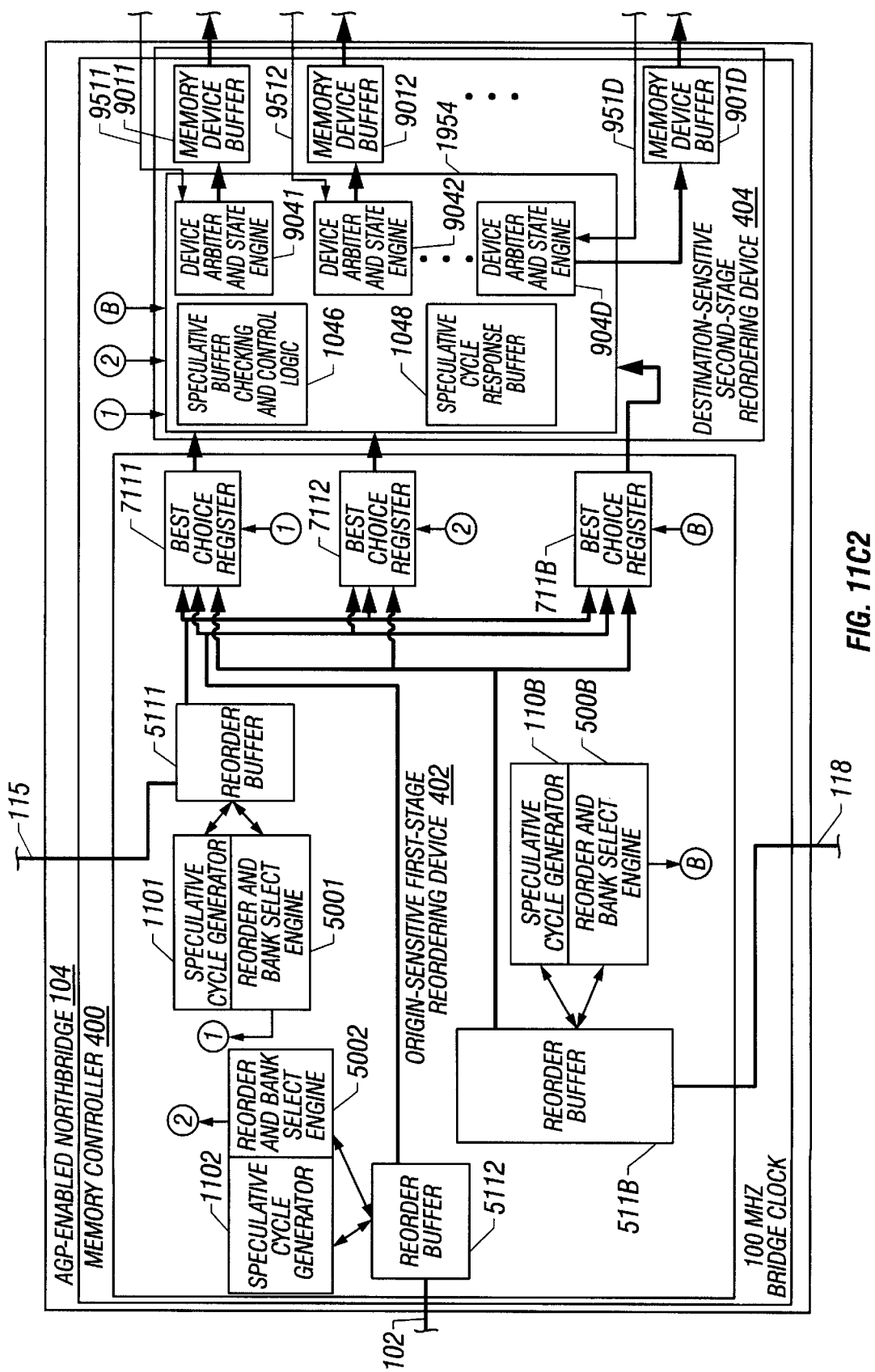
FIG. 11C2

SPECULATIVE OPENING OF A NEW PAGE WHEN APPROACHING PAGE BOUNDARY DURING READ/WRITE OF ISOCHRONOUS STREAMS

CROSS-REFERENCE TO RELATED APPLICATIONS

The present invention is related to subject matter disclosed in, U.S. patent application entitled, "Method And System For Generating and Utilizing Speculative Memory Access Requests in Data Processing Systems", application Ser. No. 09/208,569, now U.S. Pat. No. 6,226,721 naming Geoffrey S. S. Strongin and Qadeer A. Qureshi as inventors and filed Dec. 9, 1998; and to U.S. patent application entitled, "Method and Apparatus for Page-State Sensitive Memory Control and Access in Data Processing Systems", application Ser. No. 09/207,971, naming Geoffrey S. S. Strongin and Qadeer A. Qureshi as inventors and filed Dec. 9, 1998, which applications are incorporated herein by reference.

BACKGROUND OF THE INVENTION

1. Field of the Invention

The present invention relates generally to computer systems and more particularly to memory control functions within computer systems.

2. Description of the Related Art

In conventional computer systems, such as personal computer systems utilizing x86 based processors, the processor, along with other components in the computer system, are coupled to main system memory through an integrated circuit known in the art as the "North Bridge." The North Bridge provides a memory control function as well as a bridge function between the host bus connected the processor and system input/output buses such as the Peripheral Component Interconnect (PCI) bus and the devices connected to the PCI bus.

In current architectures, the PCI bus provides the major I/O bus for the computer system. Other buses are commonly found in conventional computer systems. One such bus is the Universal Serial Bus (USB) bus and another bus is the IEEE 1394 bus. USB and 1394 traffic typically communicate with memory through a South Bridge integrated circuit, which is coupled to the PCI bus. The South Bridge provides a bridge function between the PCI bus and other buses. In addition, the South Bridge provides for communication with a variety of legacy devices, provides power management functions, etc. In any case, the buses at issue, and the devices which couple to those buses access system memory through the PCI bus.

One exception is a graphics bus, the Accelerated Graphics Port (AGP), which has been developed to both (1) reduce the load on the PCI bus systems, and (2) extend the graphics capabilities of systems. The AGP interface standard (defined by *Accelerated Graphics Port Interface Specification*, Revision 1.0 (Jul. 31, 1996) from Intel corporation, allows the graphics processor to retrieve graphics information from system memory independently of the PCI.

In current industry architecture s, the host bus, the AGP interconnect, and the PCI bus access system memory through the memory controller in the North Bridge. The memory controller maps logical addresses used by the processor to physical locations in system memory. The system memory controlled by the North Bridge is typically made up of a plurality of Direct Random Access Memory chips (DRAMs). There are a number of different types of DRAMs including RDRAM (Rambus DRAMS), SDRAM (Synchronous DRAMs), DDRSDRAM (Double data rate SDRAMs). DRAM technology continues to evolve.

DRAMs are organized into various banks. Each bank is comprised of a matrix of storage locations organized in rows and columns. Each of the rows typically shares sense amplifiers. When a memory access occurs, such as a read cycle, the memory controller receives an address over one of the buses, maps the received address into an approriate physical address and performs the access operation to system memory. Consequently, an address, which for sake of illustration will be assumed to be 16 bits long, customarily is conceived of as being composed of two parts: a first 8-bit portion of the address which is associated with a row address, and a second 8-bit portion which is associated with a column address (again, the bit lengths are hypothetical and merely utilized here for illustrative purposes). This separation of the address into row and column portions allows the address to correctly specify a storage location, or cell, by its row and column.

In order to minimize the number of pins on the DRAM, memory accesses in conventional DRAMs typically place the row portion of the address on the address bus to select the appropriate row, and then place the column portion of the address on the address bus to select the appropriate column. At some time after the row and column information have both been specified, the data from the memory location specified by the row and column address appears on the DRAM data bus.

From the foregoing, it can be seen that in order to make a single memory access there are three phases: a row address phase, a column address phase, and a data retrieval phase. In the past, it was noticed that typical programs tend to operate sequentially, so if there is a memory address accessed, it is likely that the next memory address accessed will be the very next cell, which means that the column address is likely to change, while the row address is not likely to change. Consequently, typical DRAMs are structured such that once the row address has been provided, thereafter DRAMS can continue to access the row (also referred to herein as page) that is "open" in the DRAM.

As an access approaches a last column address in a row, it is typical that the next sequential physical address is located in another bank. That is because accessing another page or row in the same bank requires that the currently open page be closed. Thus, the row in the new bank, if not already open, has to be precharged and then the new row in that bank can be opened and accessed. The new row may be opened using an appropriate command for the memory device after it is precharged and accessed.

In the event that a memory controller has several memory accesses to be done sequentially, then once a page is open it would make sense (but it is not currently done in the art) from an efficiency standpoint to examine pending as well as current memory accesses in order to determine which of those pending memory accesses will be to memory locations that are within a currently open page (that is, the row of the request is the row from which a memory controller is currently reading within a DRAM). In other words, assuming a page X is open, if there are four memory accesses A, B, C, and D, waiting to be performed, and assuming the first access A is to page Z, the second access B is to page X, the third access C is to page Y, and the fourth access D is to page W, it is preferable from a memory efficiency standpoint that the data access (i.e., access B) appropriate to the page that is open (i.e., page X) be made first.

Current memory controllers do not typically "look ahead" to see if certain pending memory accesses are destined for currently open pages based on the type of stream that is currently accessing memory. Furthermore, at any given time, typically more than one page of memory is generally open and in future systems this will become more likely. For example, under the Direct RDRAM scheme, it is expected that up to 8 pages per RDRAM chip will be open simultaneously. Thus, if a system has eight RDRAM chips (a reasonable assumption), it will be possible to have up to 64 pages open simultaneously.

Controlling memory access via the use of "look ahead" would be undeniably valuable. Furthermore, as the foregoing has shown, the prospective ability of the memory controllers to schedule memory access on the basis of look ahead is likely to become even more important in that future system memories are likely to be able to provide a very large number of open pages of memory simultaneously. It is therefore apparent that a need exists in the art for a method and system which will provide data processing systems, having memory controllers, with the ability to look ahead and intelligently schedule accesses to system memory utilizing information gained from such looking ahead.

In addition to the foregoing, it has been noted that multiple devices (e.g., one or more CPUs, PCI bus devices, 1394 devices, and network devices) communicate over various different buses in order to access data processing system memory through a memory controller. Further, there is an increase in applications having isochronous data, such as from multimedia streams. Isochronous data has throughput requirements that must be met or the user of the application will be negatively impacted. For example, if the next frame in a video steam is late, the picture can be degraded. In contrast to isochronous streams, asynchronous streams do not have specific throughput requirements but the goal is generally to keep latency for asynchronous streams to a minimum to maximize system performance.

Different types of devices have different types of memory access needs as do different data buses. At present, current data processing system memory controllers do not recognize and/or utilize the differing memory access requirements of the various devices, do not recognize or utilize information regarding different types of data streams, or the different access requirements of the buses over which the devices communicate, in order to efficiently schedule data processing system memory access. It is therefore apparent that a need exists for a method and system which will provide data processing systems, having memory controllers, with the ability to recognize and take advantage of the varying needs of differing data streams, differing devices and/or the needs of the various data buses through which such devices communicate with data processing system memory.

SUMMARY OF THE INVENTION

In one embodiment the invention provides a method of operating a memory controller to more efficiently access memory. The method includes detecting an approaching end of a currently open page in memory for a memory access operation for a data stream. The memory controller, in response to detecting the approaching end of the currently open page and if the data stream is of a predetermined type, such as an isochronous data stream, speculatively opens a next page in the memory assuming that the data stream is going to continue sequential accesses.

In another embodiment, the invention provides an integrated circuit that includes a memory controller. The memory controller includes at least a first end of page detecting circuit, which corresponds to one of the banks of a multi-bank memory. The first end of page detecting circuit responds to an approaching end of an open page in a corresponding bank, caused by a memory access by a data stream by generating an approaching end of open page indication at a predetermined number of memory locations, e.g., 8 bytes, before a last location in the open page. The memory controller also includes page opening logic which is coupled to receive both a type of data stream indication corresponding to the data stream, and the approaching end of page indication. The speculative page opening logic responds to an asserted approaching end of page indication and the type of data stream indication indicating a predetermined type of data stream, to cause a next page to be opened.

BRIEF DESCRIPTION OF THE DRAWINGS

The present invention may be better understood, and its numerous objects, features, and advantages made apparent to those skilled in the art by referencing the accompanying drawings.

FIG. 8A1 illustrates an expanded view of an embodiment of a destination-sensitive second-stage memory access request reordering device.

FIG. 8A2 shows yet another embodiment of a destination-sensitive second-stage memory access request reordering device.

FIG. 8B1 depicts another embodiment of a destination-sensitive second-stage memory access request reordering device.

FIG. 8B2 illustrates yet another embodiment of a destination-sensitive second-stage memory access request reordering device.

FIG. 8C1 shows yet another embodiment of a destination-sensitive second-stage memory access request reordering device.

FIG. 8C2 depicts yet another embodiment of a destination-sensitive second-stage memory access request reordering device.

FIG. 9A1 illustrates an expanded view of an embodiment of a destination-sensitive second-stage memory access request reordering device.

FIG. 9A2 shows yet another embodiment of a destination-sensitive second-stage memory access request reordering device.

FIG. 9B1 depicts another embodiment of a destination-sensitive second-stage memory access request reordering device.

FIG. 9B2 illustrates yet another embodiment of a destination-sensitive second-stage memory access request reordering device.

FIG. 9C1 shows yet another embodiment of a destination-sensitive second-stage memory access request reordering device.

FIG. 9C2 depicts yet another embodiment of a destination-sensitive second-stage memory access request reordering device.

FIG. 10A1 illustrates an expanded view of an embodiment of a memory controller wherein is contained an embodiment of a speculative memory access request generation and utilization structure and operation.

FIG. 10A2 shows an expanded view of another embodiment of a memory controller wherein is contained an embodiment of a speculative memory access request generation and utilization structure and operation.

FIG. 10B1 an expanded view of another embodiment of a memory controller wherein is contained an embodiment of a speculative memory access request generation and utilization structure and operation.

FIG. 10B2 illustrates an expanded view of another embodiment of a memory controller wherein is contained an embodiment of a speculative memory access request generation and utilization structure and operation.

FIG. 10C1 shows an expanded view of another embodiment of a memory controller wherein is contained an embodiment of a speculative memory access request generation and utilization structure and operation.

FIG. 10C2 depicts an expanded view of another embodiment of a memory controller wherein is contained an embodiment of a speculative memory access request generation and utilization structure and operation.

FIG. 11A1 illustrates an expanded view of another embodiment of a memory controller wherein is contained an embodiment of a speculative memory access request generation and utilization structure and operation.

FIG. 11A2 shows an expanded view of another embodiment of a memory controller wherein is contained an embodiment of a speculative memory access request generation and utilization structure and operation.

FIG. 11B1 depicts an expanded view of another embodiment of a memory controller wherein is contained an embodiment of a speculative memory access request generation and utilization structure and operation.

FIG. 11B2 illustrates an expanded view of another embodiment of a memory controller wherein is contained an embodiment of a speculative memory access request generation and utilization structure and operation.

FIG. 11C1 shows an expanded view of another embodiment of a memory controller wherein is contained an embodiment of a speculative memory access request generation and utilization structure and operation.

FIG. 11C2 shows an expanded view of another embodiment of a memory controller wherein is contained an embodiment of a speculative memory access request generation and utilization structure and operation.

The use of the same reference symbols in different drawings indicates similar or identical items.

DETAILED DESCRIPTION

I. Environment for Methods and System

Figure 1:
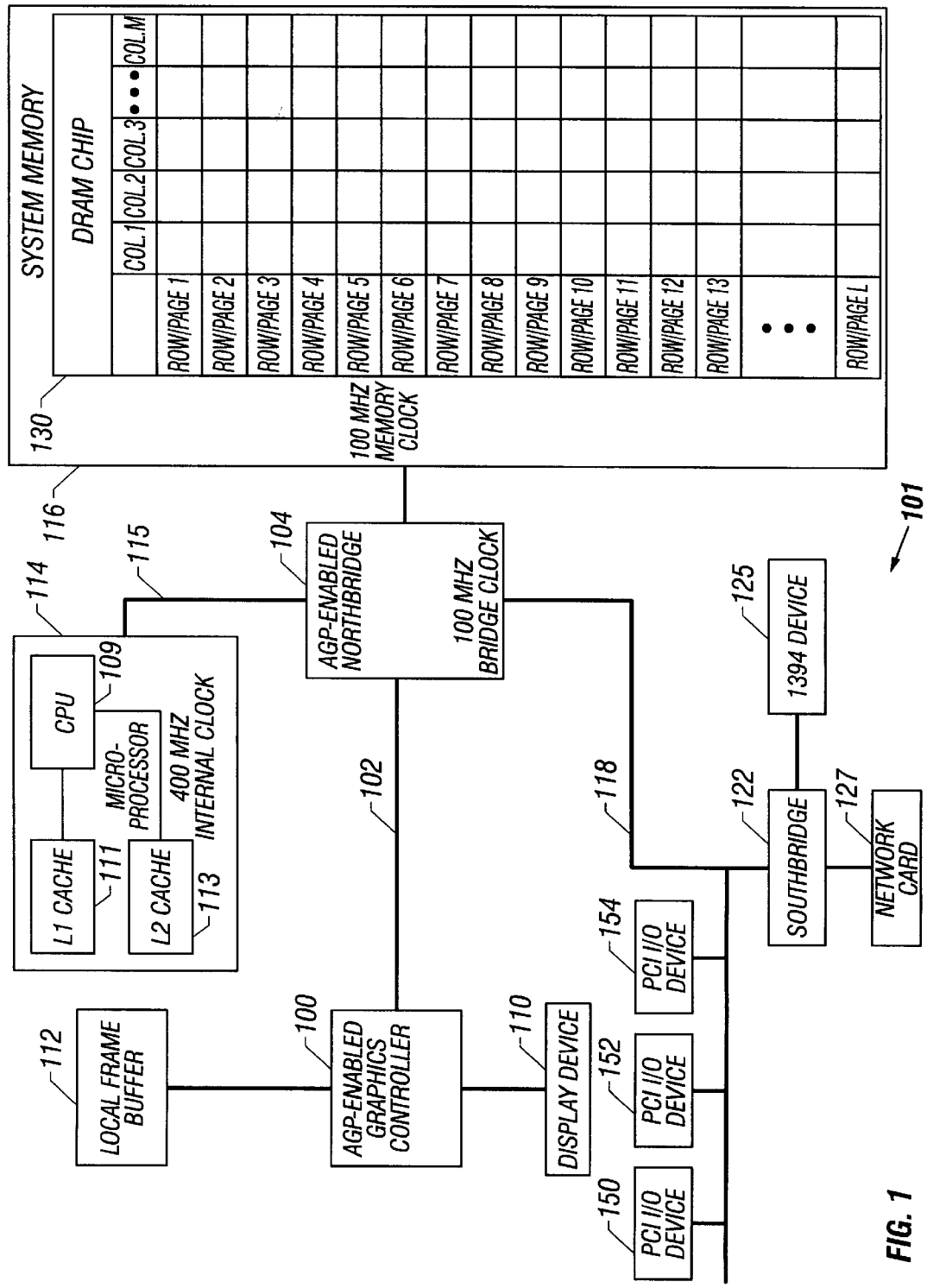
FIG. 1 shows a high-level component diagram depicting a related art data processing system which forms an environment wherein one or more embodiments of the present invention may be practiced.

Referring now to FIG. 1, a high-level component diagram depicts an exemplary data processing system 101 providing an environment in which one or more embodiments of the present invention may be practiced. Data processing system 101 includes graphics controller 100, AGP interconnect 102 (a data bus), and Northbridge 104. The computer system further includes display device 110, local frame buffer 112, microprocessor 114 (which includes central processing Unit (CPU) 109, L1 Cache 111, and L2 Cache 113), CPU host bus 115, system memory 116, Peripheral Component Interconnect (PCI) bus 118, various PCI Input-Output (I/O) devices 150, 152, and 154, Southbridge 122, 1394 Device 125, and network card 127.

Note that processor 114 is exemplary of any general processing unit, including but not limited to multiprocessor units; CPU bus 115 (also referred to as host bus) is exemplary of any processing bus, including but not limited to multiprocessor buses; PCI bus 118 is exemplary of any input-output device attached to an I/O bus; AGP Interconnect 102 is exemplary of any graphics bus; graphics controller 100 is exemplary of any graphics controller; Northbridge 104 and Southbridge 122 are exemplary of any type of bridge; 1394 device 125 is utilized as exemplary of any type of isochronous source; and network card 127, even though the term "network" is used, is intended to serve as exemplary of any type of synchronous or asynchronous input-output cards. Consequently, as used herein these specific examples are intended to be representative of their more general classes. Furthermore, in general, use of any specific example herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of Northbridge 104, in that it is to be understood that it translates and coordinates between the various data buses which communicate through Northbridge 104.

Notwithstanding the issue of differing bus protocols, further illustrated in FIG. 1 is that various system components operate off of various internal clocks, where each internal clock can vary from others present. Regarding the non-limiting exemplary clock speeds shown, it will be understood by those within the art that, typically, processor 114 multiplies a bus clock (an external clock, not shown) in order to generate an internal clock that is faster (e.g., twice, three time, four times, etc.) than the bus clock. In contrast, Northbridge 104 and system memory 116 typically use the bus clock as their respective internal clocks without multiplying the bus clock. Specifically, shown is that processor 114 operates off an internal clock whose speed is illustrated at 400 MHz, Northbridge 104 operates off an internal bridge clock whose speed is illustrated at 100 MHz, and system memory 116 operates off an internal memory clock whose speed is illustrated at 100 MHz. Those skilled in the art will recognize that these clock speeds are non-limiting, exemplary only and can vary widely, and that each described component can have a clock speed varying from each of the other described components.

Those skilled in the art will recognize that CPU 109 sends a request to memory only when the data it is seeking to access is not resident in either L1 cache 111 or L2 cache 113. That is, CPU 109 only seeks to read from system memory 116 when a miss occurs with respect to L1 cache 111 or L2 cache 113. One problem that arises when CPU 109 must access system memory 116 is that while the processor is running at an internal speed of 400 MHz, Northbridge 104 and system memory 116 are only running at 100 MHz, so when processor 109 has to access system memory 116, the internal clock speeds of Northbridge 109 and system memory 116 become the factors ultimately controlling the speed of system memory 116 access. Thus, when processor 114 has to go outside processor 114 to access data, the speed of access becomes controlled by the 100 MHz bridge and memory clocks. Those skilled in the art will recognize that typically Northbridge 104 may require up to two bridge clock cycles to determine what to do with a specific memory request from processor 109. Notice that in the example shown this translates into 8 processor 114 internal clock cycles in that the processor 114 internal clock is running 4 times faster than the bridge clock.

Once Northbridge 104 has determined that it has received a request from processor 109 to access system memory 116, Northbridge 104 thereafter sends the request to system memory 116. Upon receipt of the request, system memory 116 has to drive the address on a DRAM chip 130 address bus, and DRAM chip 130 has to decode the address, access the location, and drive the data back to Northbridge 104 which thereafter drives the data back to processor 114.

Those skilled in the art will recognize that the foregoing operations generally require anywhere from 5 to 15 bridge/memory clock cycles (bridge and memory clocks are shown as running at the same speed in FIG. 1, but those skilled in the art will recognize that this is not necessarily the case) between processor 109 requesting data from system memory 116, and processor 109 receiving the data in response to its request. The foregoing noted clock cycles translate into a very substantial latency from the standpoint of processor 114 (e.g., 20–60 processor 114 internal clock cycles). Consequently, processor 114 often spends a significant amount of time waiting for system memory 116 to respond to a request for data. Furthermore, it is significant that the foregoing described example was based on an assumption that DRAM 130 in system memory 116 was in a state in which it could service a request, and those skilled in the art will recognize that if DRAM 130 had not been in a state wherein it could service a request (e.g., a page in DRAM 130 had been closed or had been in a transitional "refresh" state), the foregoing described latency could have been much, much greater than that illustrated.

Those skilled in the art will recognize that another problem, in addition to the foregoing described problem of latency, is that typically a memory request on CPU bus 115 tends to function as a blocking cycle, so data processing system 101 tends to come to a halt while processor 109 is waiting to access system memory 116. Thus, the foregoing has demonstrated via non-exclusive examples that main memory latency is one of the most significant issues limiting the performance of current data processing systems.

In addition to the foregoing, newer systems have AGP subsystems which can put a significant amount of extra loading on system memory 116. Under the current specification, AGP-based devices can put up to 1 Gbyte per second of load on system memory 116. Thus, in systems where AGP-devices are present (such as data processing system 101), when a memory controller (not shown) is servicing AGP requests, it is apparent that the foregoing described latencies will tend to go even higher. In addition, PCI bus 118 also adds yet more loading onto system memory 116. Thus, in the presence of AGP devices and PCI devices, system memory 116 latency becomes even more of an issue than that previously described, which as can be seen was actually effectively a "best case" (or least latency) scenario.

It has been discovered that significant reductions in main memory latency can be achieved by taking advantage of correlations internal to multiple independent streams of memory accesses. As used herein, the term "correlation" means that different addresses corresponding to different accesses tend to fall within a relatively narrow range. For non-limiting example, when graphics controller 100 accesses system memory 116, such accessing tends to be highly correlated in that the memory locations accessed tend to be in closely situated addresses. The present invention, among other things, improves the ability to take advantage of calculations present in order to reduce memory latency.

Figure 2:
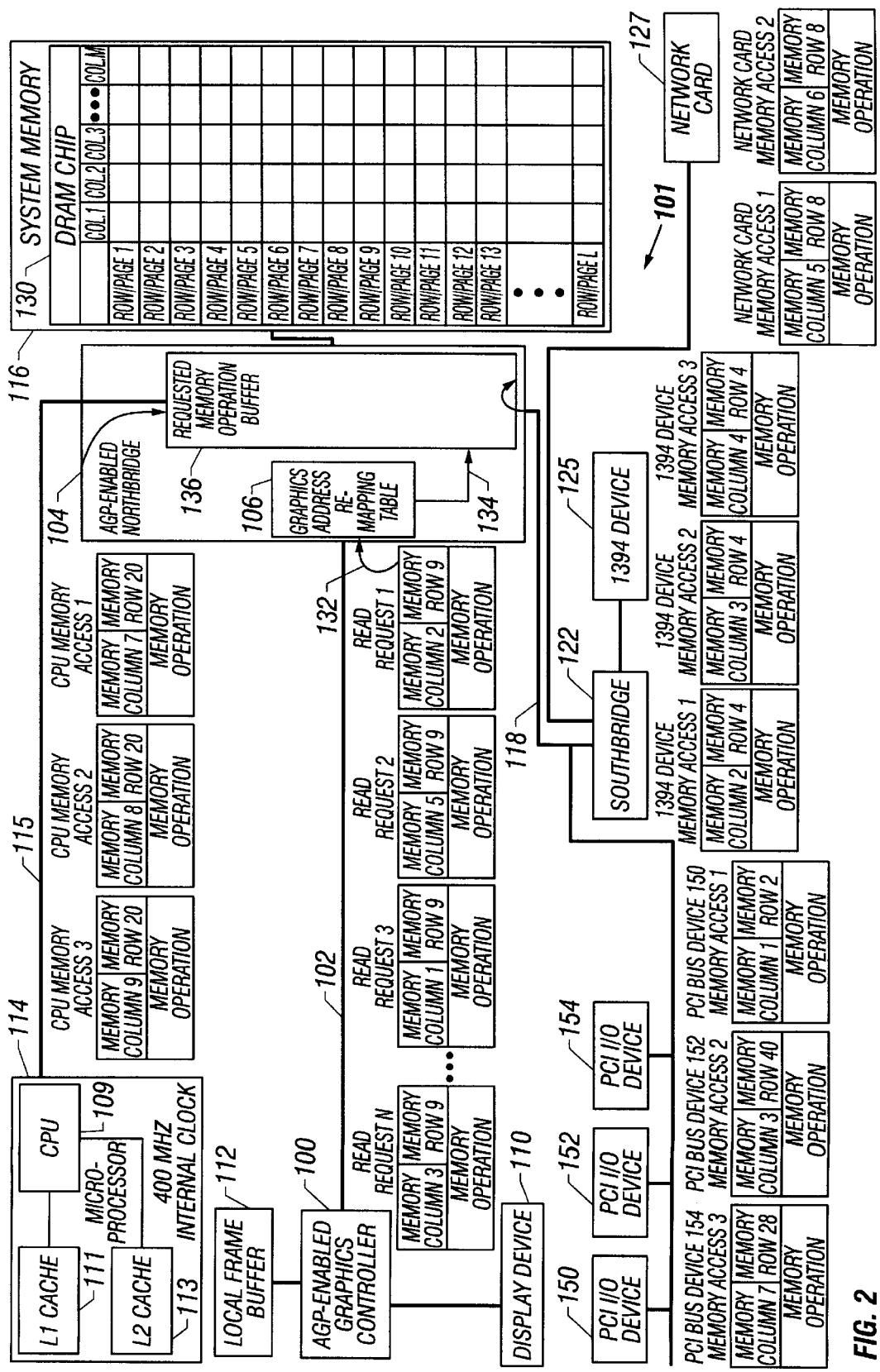
FIG. 2 depicts a high-level block diagram illustrating in broad overview how data requests may arise within the system of FIG. 1, which forms an environment wherein one or more embodiments of the present invention may be practiced.

Referring now to FIG. 2, the high-level block diagram illustrates in broad overview how data requests may arise within system 101 of FIG. 1, which forms an environment wherein one or more embodiments of the present invention may be practiced. The components shown function similarly to the like-numbered components described in relation to FIG. 1.

Under the AGP interface standard a graphics controller is free to issue pipelined requests for data. The graphics controller issues N (where N is some positive integer) read requests to read data from a particular cell, or row and column location, from DRAM chip 130 in system memory 116 prior to any of the N−1 outstanding read requests being answered. It should be noted that although for conceptual clarity the read requests are shown in FIG. 1 as labeled requests 1 through N, under the AGP standard there is no such labeling, and under the AGP standard such ordering is merely denoted by transmission order of the requests.

Further illustrated is that within DRAM chip 130 each row can be conceptualized as a "page" in memory.

Those skilled in the art will recognize that the AGP interface standard allows devices to treat AGP memory as if it were one contiguous whole, while it may actually be several discontiguous regions of system memory. Accordingly, under the AGP-interface standard read requests to system memory first transit 132, 134 Graphics Address Re-mapping Table (GART) 106 prior to being loaded into requested memory operation buffer 136. Ordinarily, GART 106 re-maps the row and column AGP-memory addresses for which accesses are requested into row and column physical memory addresses. However, for sake of clarity of presentation and understanding, herein GART 106 will be treated as if it is transparent to the process. That is, while those skilled in the art will recognize that GART 106 will typically re-map requested addresses, in the present detailed description GART 106 will be treated as if it merely passes the addresses through without re-mapping them so that the embodiments discussed herein can be more clearly understood.

In addition, it should be recognized that the memory controller typically maintains tables which map logical addresses utilized by the processor into physical addresses in system memory. Thus for example, a page in the processor may comprise 4K contiguous bytes in logical as well as physical memory. However, the next page, i.e., the next 4K of logical addresses may reside in a completely unrelated physical location.

Under some host bus protocols, processor 114 can issue pipelined memory accesses. In FIG. 2 processor 114 issues 3 pipelined memory accesses, each of which is to a particular cell, or row and column location, within DRAM chip 130 in system memory 116. For illustrative purposes, each of the accesses are shown referencing a particular row and column location in DRAM chip 130. Those skilled in the art will understand that each memory request is for an address which is translated appropriately by Northbridge 104 to a row and column for a specific device. For conceptual clarity, the read requests are shown in FIG. 1 as labeled requests 1 through 3. Under the CPU bus standards, there may be such labeling.

Three PCI bus devices 150–154 which are shown to have placed 3 separate memory access requests on PCI bus 118. It will be understood by those within the art that ordinarily only one such PCI bus device memory access may be resident on PCI bus 118 at any particular time. Consequently, it will be understood by those within the art that the depicted 3 PCI bus 118 memory access requests are illustrative of the three requests occurring at three distinct different instances in time.

Historically, any PCI bus device requesting memory access via PCI bus 118 had to wait for the requested memory access to be completed prior to relinquishing PCI bus 118. This was found to result in inefficiency due to PCI bus 118 being monopolized by any such PCI bus device waiting for an access to complete. It has been found that a way around the monopolization problem is to terminate each PCI request to access memory without waiting for the data to be manipulated by the request to travel all the way from/to memory (i.e., without waiting for the cycle to complete). For example, it is conceivable to have multiple PCI requests outstanding within Northbridge 104 by mandating that Northbridge 104, in response to a request for memory access from PCI bus device 150–154, direct the PCI master to retry, which will result in the PCI master releasing the bus thus freeing PCI bus 118 so that other PCI masters can issue requests. Any subsequently retried accesses will often be completed quickly because Northbridge 104 will typically have the data ready when the request is retried. Thus, the foregoing schemes demonstrate that there could be multiple memory transactions pending within Northbridge 104 from various PCI devices at any given time, even though PCI bus 118 can ostensibly support only one transaction at a given time.

Likewise with the five remaining accesses depicted. Although FIG. 2 depicts three 1394 device 125 memory access requests, those within the art understand that ordinarily only one such memory access may be resident on PCI bus 118 at any particular time. In like fashion, although FIG. 2 depicts two network cards 127 memory access requests those within the art would understand that ordinarily only one such memory access may be resident on PCI bus 118 at any particular time. Consequently, it will be understood by those within the art that the depicted five remaining memory access requests are illustrative of the five requests occurring at five distinct instances in time. FIG. 2 also shows that 1394 device 125 requests and network card 127 requests travel to and from Northbridge 104 through Southbridge 122 in conjunction with PCI bus 118.

Figure 3:
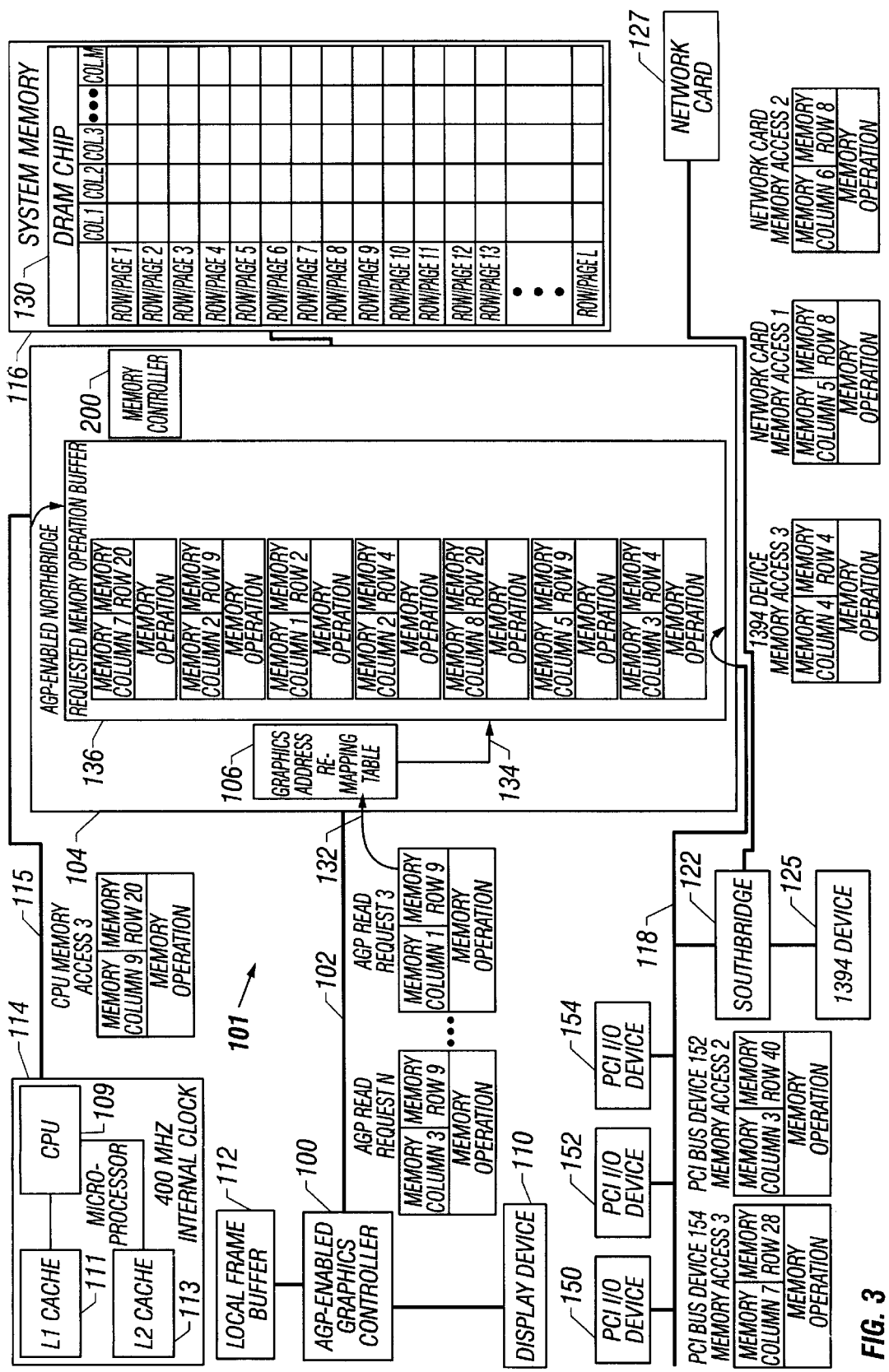
FIG. 3 illustrates a high-level block diagram showing in broad overview how the system of FIG. 1, which forms an environment wherein one or more embodiments of the present invention may be practiced, accesses memory and manipulates data within the memory locations specified by the memory access requests illustrated in FIG. 2.

Referring now to FIG. 3, shown is a high-level block diagram illustrating in broad overview how the system 101 of FIG. 1, accesses memory and manipulates data within the memory locations specified by the memory access requests illustrated in FIG. 2. Shown are graphics controller 100, AGP interconnect 102 (a data bus), and Northbridge 104. The remaining shown components function substantially similar to the like-numbered components described in relation to FIGS. 1 and 2.

As has been shown in relation to FIG. 2, in a typical data processing system multiple devices are often vying for access to system memory, a fact illustrated in FIG. 2 by the fact that various and different requests to access system memory are simultaneously present on CPU bus 115, AGP interconnect 102, and PCI bus 118. Those skilled in the art will recognize that there are a myriad of ways in which the various requests vying for system memory access can be serviced. For sake of illustration, FIG. 3 shows the requests being serviced in counter-clockwise "round-robin" fashion, starting with the requests on CPU bus 115. That is, FIG. 3 depicts CPU memory access 1 as the first requested memory operation loaded into requested memory operation buffer 136; thereafter, in accordance with a counter-clockwise round robin scheme, appear within requested memory operation buffer 136 AGP read request 1, PCI I/O device 150 request, 1394 device memory access 1, CPU memory access 2, AGP read request 2, and 1394 device memory access 2. The order in which the requests appear in requested memory operation buffer 136 is consistent with the round-robin scheme, with the understanding that 1394 device memory access 2 appears on PCI bus 118 before PCI bus device memory access 2, and thus that is why 1394 device memory access 2 is shown as loaded in requested memory operation buffer 136.

With the requested memory operations so loaded, memory controller 400 can thereafter service the requests in requested memory operation buffer 136 in the fashion dictated by the system. Various ways of servicing such requests are set forth below in the various following embodiments.

II. Structure and Operation for Memory Control and Access in Data Processing Systems It has been discovered that the efficiency of memory controller 400 can be enhanced by separating the servicing decisions made by memory controller 400 into two different stages: (1) an "origin-sensitive" first stage which uses information not directly related to the state of system memory 116, but rather uses information, available at various interfaces within data processing system 101, regarding specific qualitative aspects of each memory request (such information including but not limited to identification of an access initiator, identification of which stream or thread resulted in an access, whether or not an access is speculative, the urgency or priority of an access, and whether or not an access can be completed out of order); and (2) a "destination-sensitive" second stage which utilizes information and decisions gleaned from the first stage, in conjunction with, among other things, the state of system memory, to ultimately determine the order in which memory accesses will be carried out. The embodiments described herein will set forth various mechanisms by which such information can be conveyed. Utilizing the two stage mechanism, memory controller 400 can reorder memory transactions to substantially maximize memory efficiency. This approach can, among other things, increase the page-hit rate, thus improving the memory subsystem performance. Similarly, among transactions from a given source, the memory controller may reorder transactions such that accesses to currently open pages are completed ahead of transactions that are targeted to pages not currently open.

Figure 4:
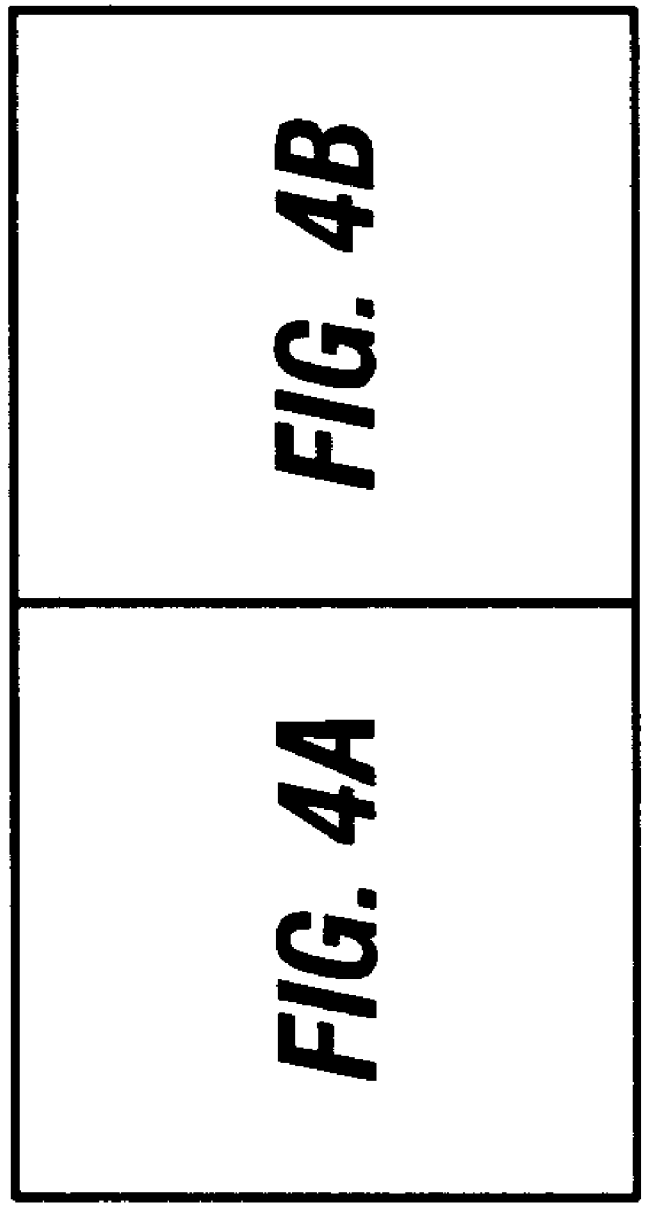
FIG. 4 shows a high-level pictographic representation of an embodiment of structure and operation for memory control and access in data processing systems.
Figure 4A:
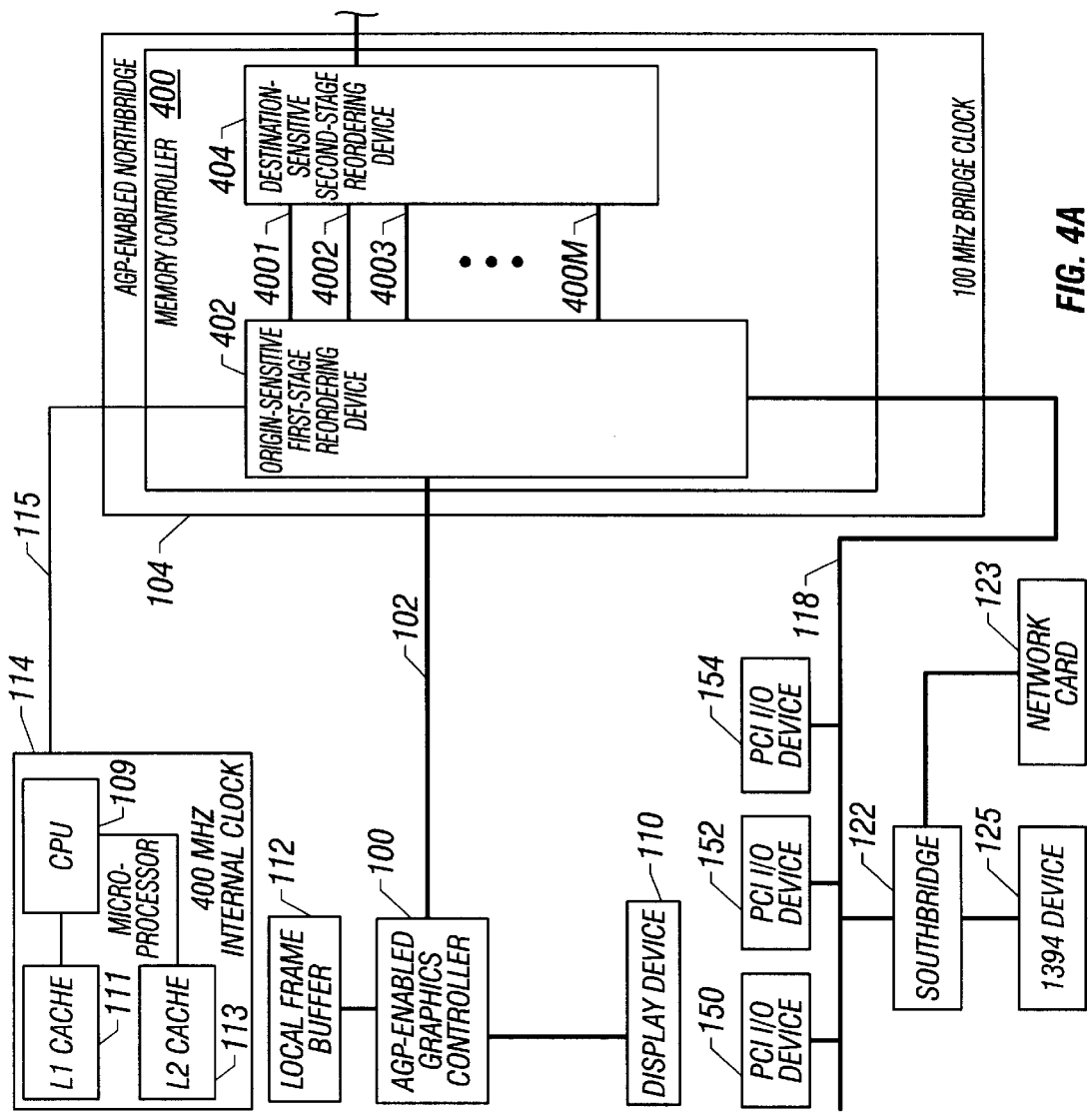
Figure 4B:
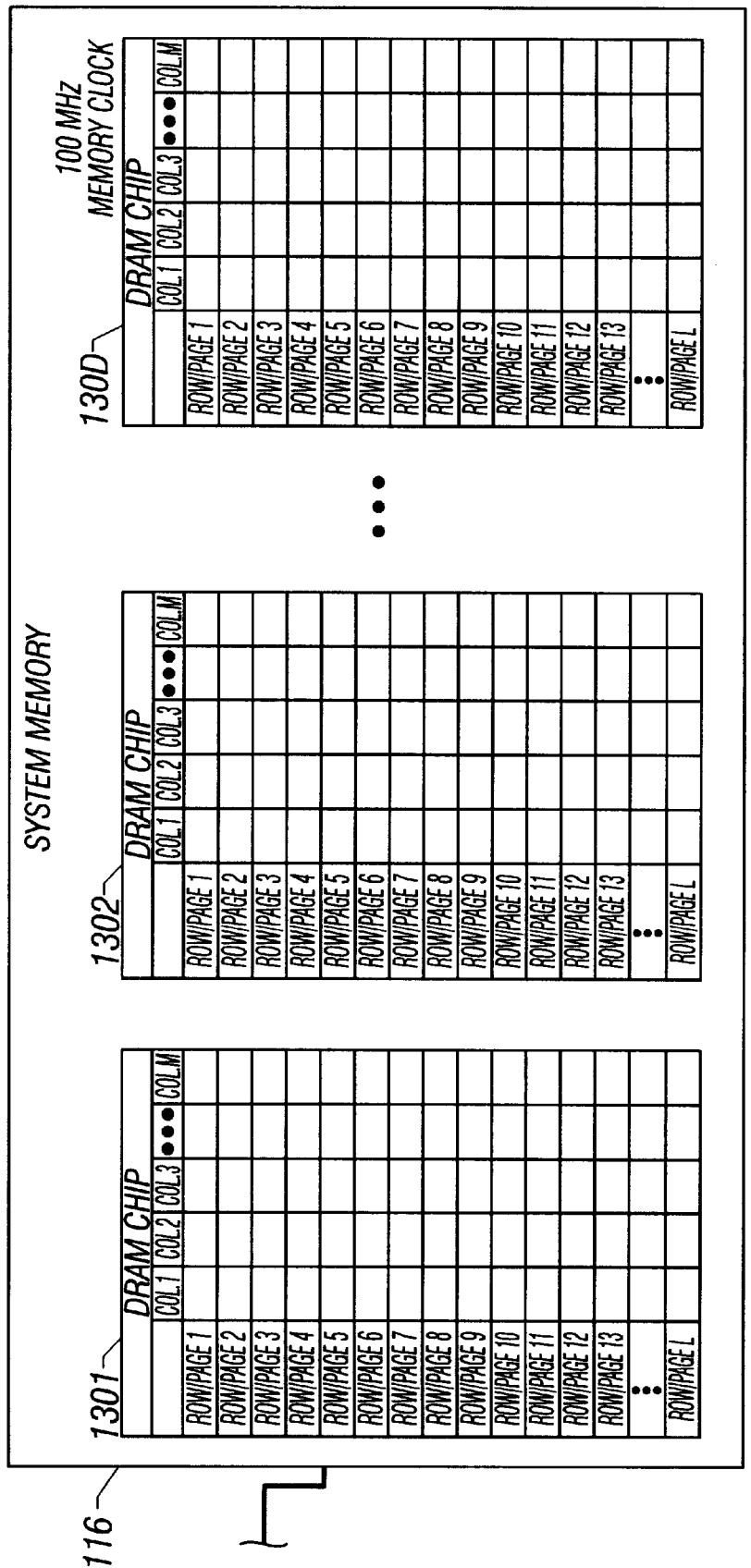

With reference now to FIG. 4, shown is a high-level representation of an embodiment of the present invention. Memory controller 400 contains two devices: origin-sensitive first-stage memory access request reordering device 402, and destination-sensitive second-stage memory access request reordering device 404. Origin-sensitive first-stage memory access request reordering device 402 accepts memory access requests directly over CPU bus 115, AGP Interconnect 102, and PCI bus 118. Origin-sensitive first-stage memory access request reordering device 402 outputs multiple reordered memory access streams 4001–400M (where M is some positive integer) which are accepted by destination-sensitive second-stage memory access request reordering device 404. As shown, destination-sensitive second-stage memory access request reordering device 404 is interposed between origin-sensitive first-stage memory access request reordering device 402 and system memory 116. Accordingly, as will be shown below, various embodiments can utilize the information from origin-sensitive first-stage memory access request reordering device 402 in conjunction with information gleaned relative to the state of system memory 116 in order to again reorder the requested memory accesses for even yet more efficient utilization of system memory 116.

Figure 5A:
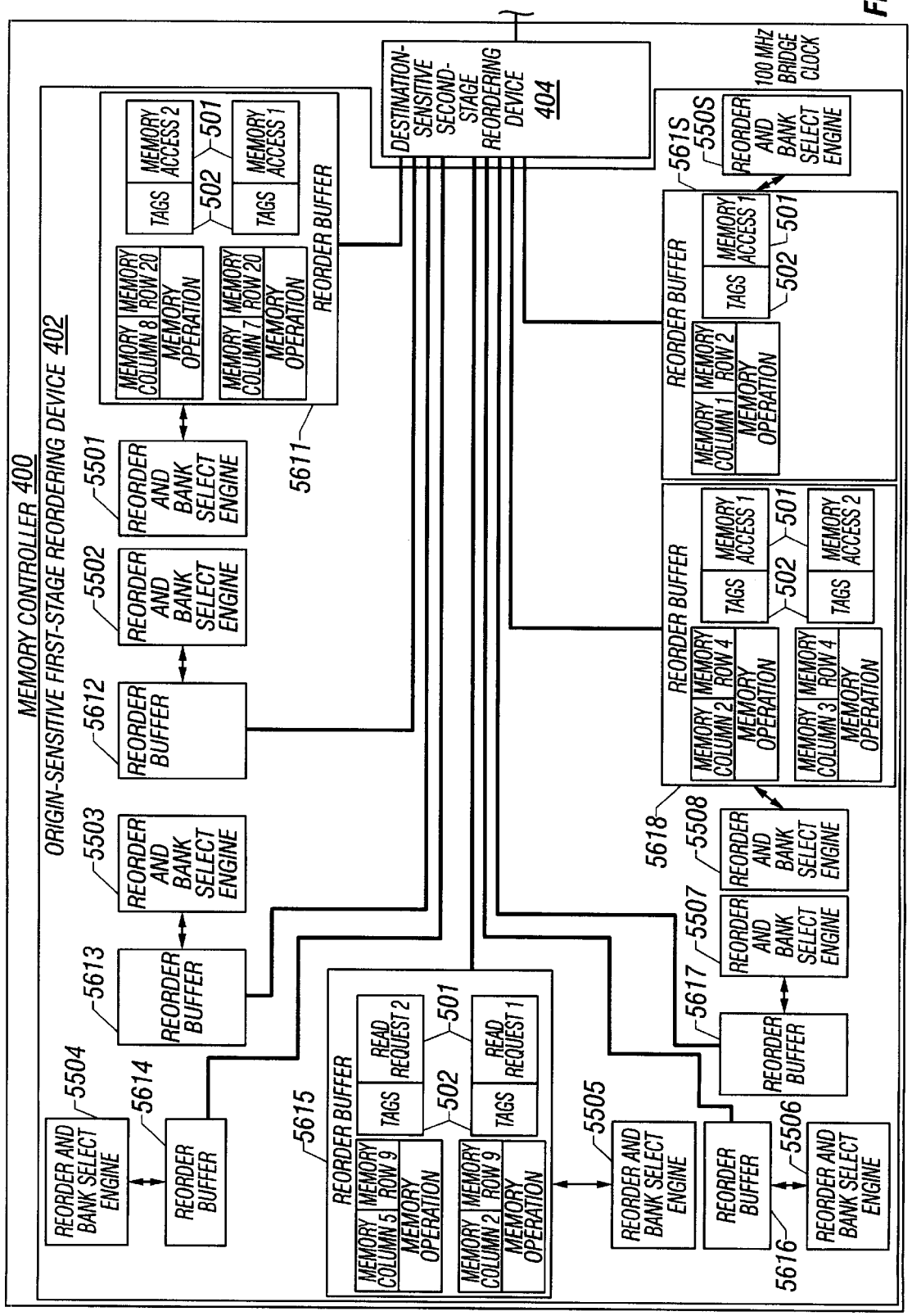
FIG. 5A depicts an expanded view of an embodiment of a memory controller containing an origin-sensitive first-stage memory access request reordering device and a destination-sensitive second-stage memory access request reordering device.

III. Structure and Operation for Origin-Sensitive Memory Control and Access in Data Processing Systems Referring now to FIG. 5A, depicted is an expanded internal view of an embodiment of memory controller 400 containing origin-sensitive first-stage memory access request reordering device 402 and destination-sensitive second-stage memory access request reordering device 404. Origin-sensitive first-stage memory access request reordering device 402 contains S (where S is some positive integer associated with a number of sources of memory access requests attached to any one or more of CPU bus 115, AGP interconnect 102, and PCI bus 118) reorder and bank select engines 5501–550S, which are respectively paired with reorder buffers 5611–561S. (As used herein, the term reorder and bank select engine refers to devices which can optionally reorder, bank select, or reorder and bank select exactly which capability or capabilities may be employed in any particular embodiment will become apparent in the context of the discussion, below.)

Each reorder buffer 5611–561S is paired with a specific source of memory access requests, such as for non-exclusive example processor 114 paired with reorder buffer 5611, graphics engine 100 paired with reorder buffer 5615, PCI I/O device 150 paired with reorder buffer 561S, and 1394 device 125 paired with reorder buffer 5618. Since each source is now associated with a buffer, the initiator of a request is now implicitly indicated by which reorder buffer 5511–551S a request is resident within, which means that it is not necessary for each buffered requested memory operation to be associated with an indicator of the initiator (or source) of the requested memory transaction in order to specify the identity of the initiator. Shown is that each such buffered memory operation may optionally have associated with it an ordinal number delimiter 501 which indicates a request's order relative to other requests from the same source. Further shown is that each such buffered memory operation may (optionally) also have associated with it a "tag" 502 which may contain one or more units indicative of one or more parameters related to the source of the memory operation. Utilizing such information, origin-sensitive first-stage memory access request reordering device 402 can more efficiently reorder the memory requests on the basis of the source from which the memory transaction originates, the ordinal number of the request, or any tags which may be present, or any combination of such information (e.g., source and/or tags and/or ordinal number delimiter) which may be present. In other words, origin-sensitive first-stage memory access request reordering device 402 is capable of utilizing any possible correlations that exist in data received on the basis of various and sundry source attributes, which is not done in the absence of the current invention.

Figure 5B:
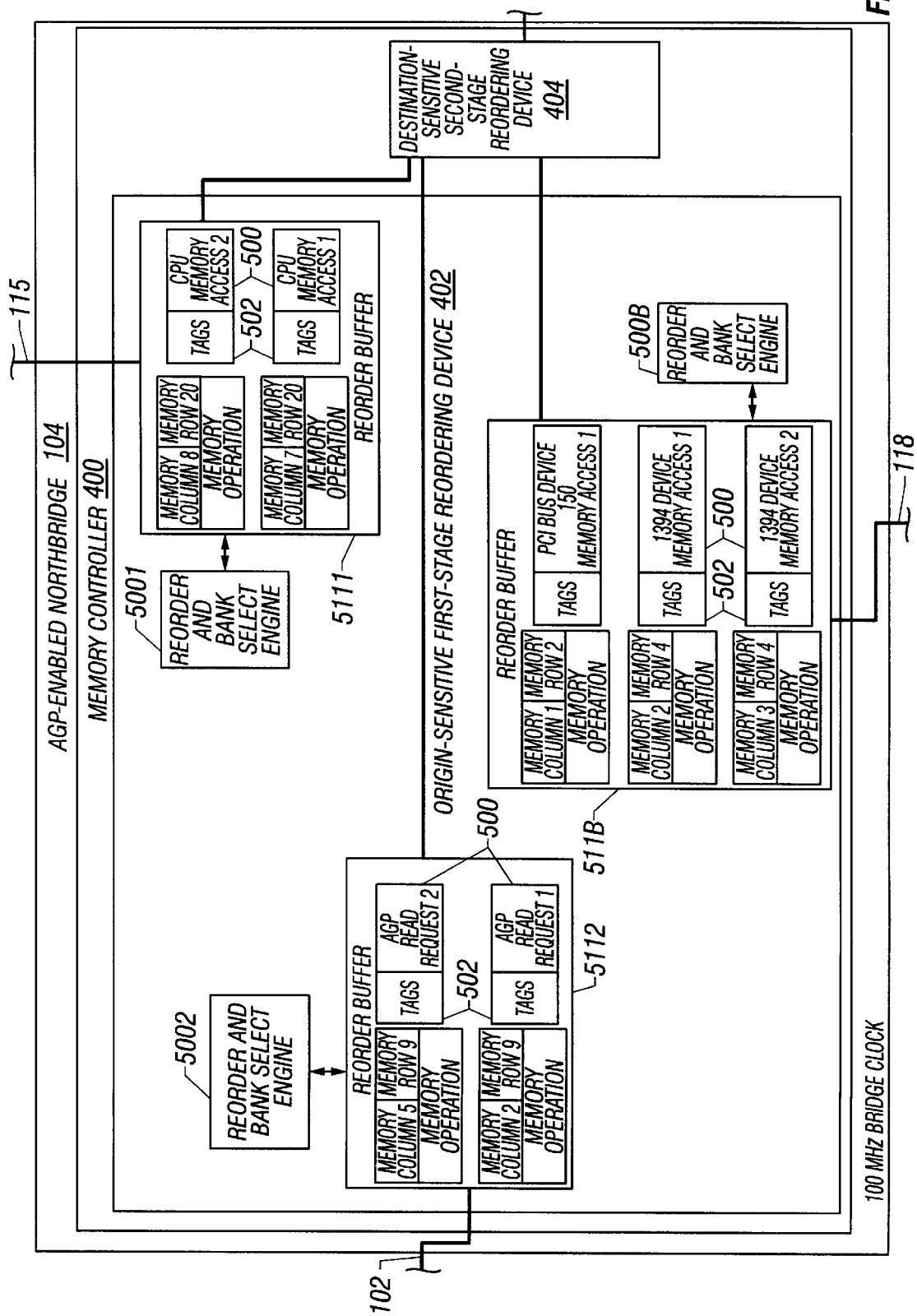
FIG. 5B illustrates an expanded view of another embodiment of a memory controller containing an origin-sensitive first-stage memory access request reordering device and a destination-sensitive second-stage memory access request reordering device.

Referring now to FIG. 5B, depicted is an expanded internal view of Northbridge 104 containing an embodiment of origin-sensitive first-stage memory access request reordering device 402 and destination-sensitive second-stage memory access request reordering device 404. Origin-sensitive first-stage memory access request reordering device 402 contains B (where B is some positive integer associated with a number of buses feeding Northbridge 104) reorder and bank select engines 5001–500B, which are respectively paired with reorder buffers 5111–511B (B equals 3 in the example shown). Each reorder buffer 5111–511B is paired with a specific bus, such as CPU bus 115, AGP Interconnect 102, and PCI bus 118. Within each reorder buffer 5111–511B, the buffered requested memory operations may be associated with an indicator 500 of the initiator of the requested memory transaction. Each such memory operation may also have associated with it a "tag" 502 which may contain one or more units indicative of one or more parameters related to the source of the memory operation. Utilizing such information, origin-sensitive first-stage memory access request reordering device 402 can more efficiently reorder the memory requests on the basis of the bus from which the memory transaction originates, the initiator, or any tags which may be present, or any combination of such information (e.g., bus and/or tags and/or initiator id) which may be present. In other words, origin-sensitive first-stage memory access request reordering device 402 is capable of utilizing any possible correlations that exist in data received on the basis of various and sundry source attributes.

Figure 6A:
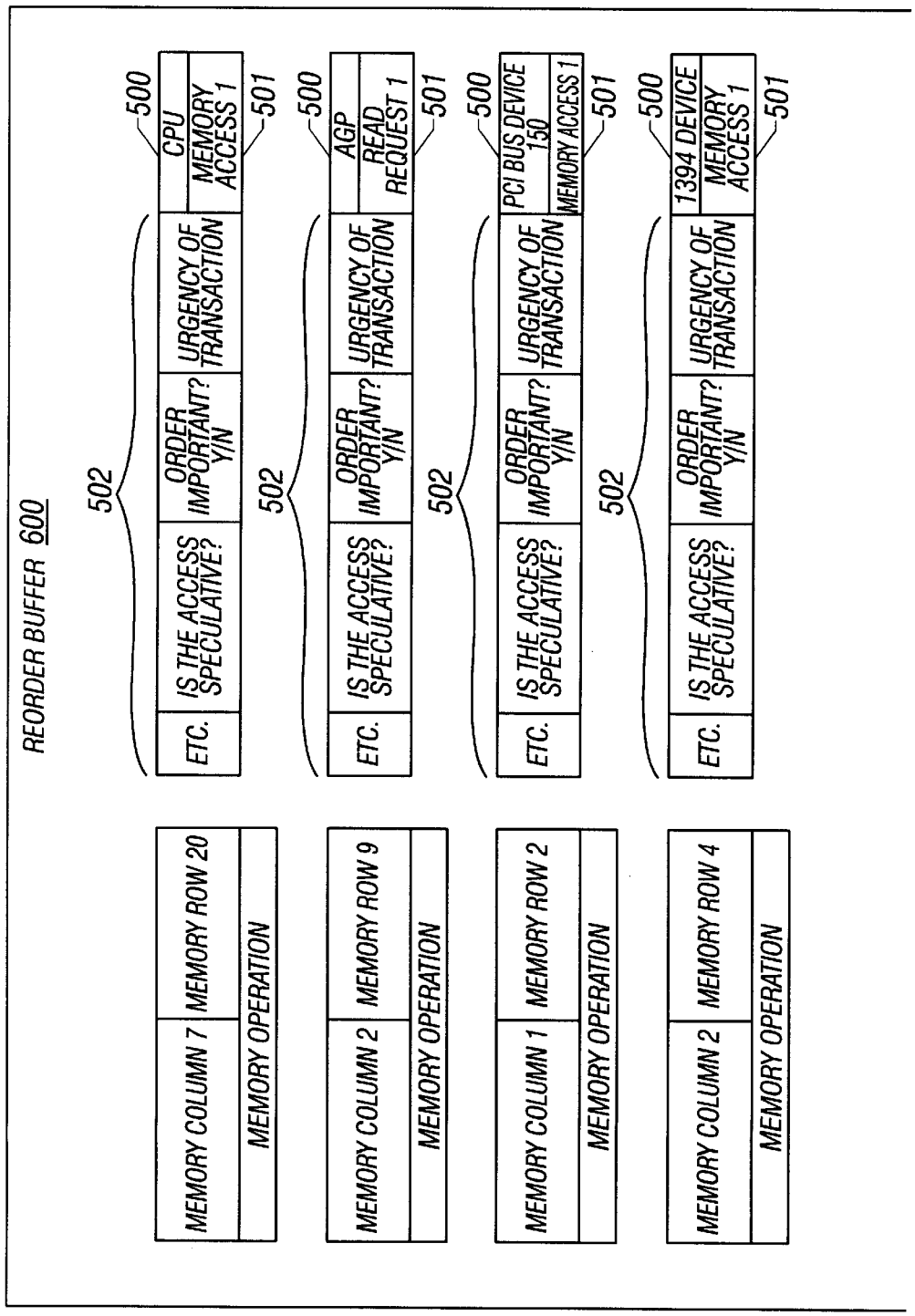
FIG. 6 shows non-exclusive examples of information which may be contained within tags utilized by embodiments of the present invention.
Figure 6B:
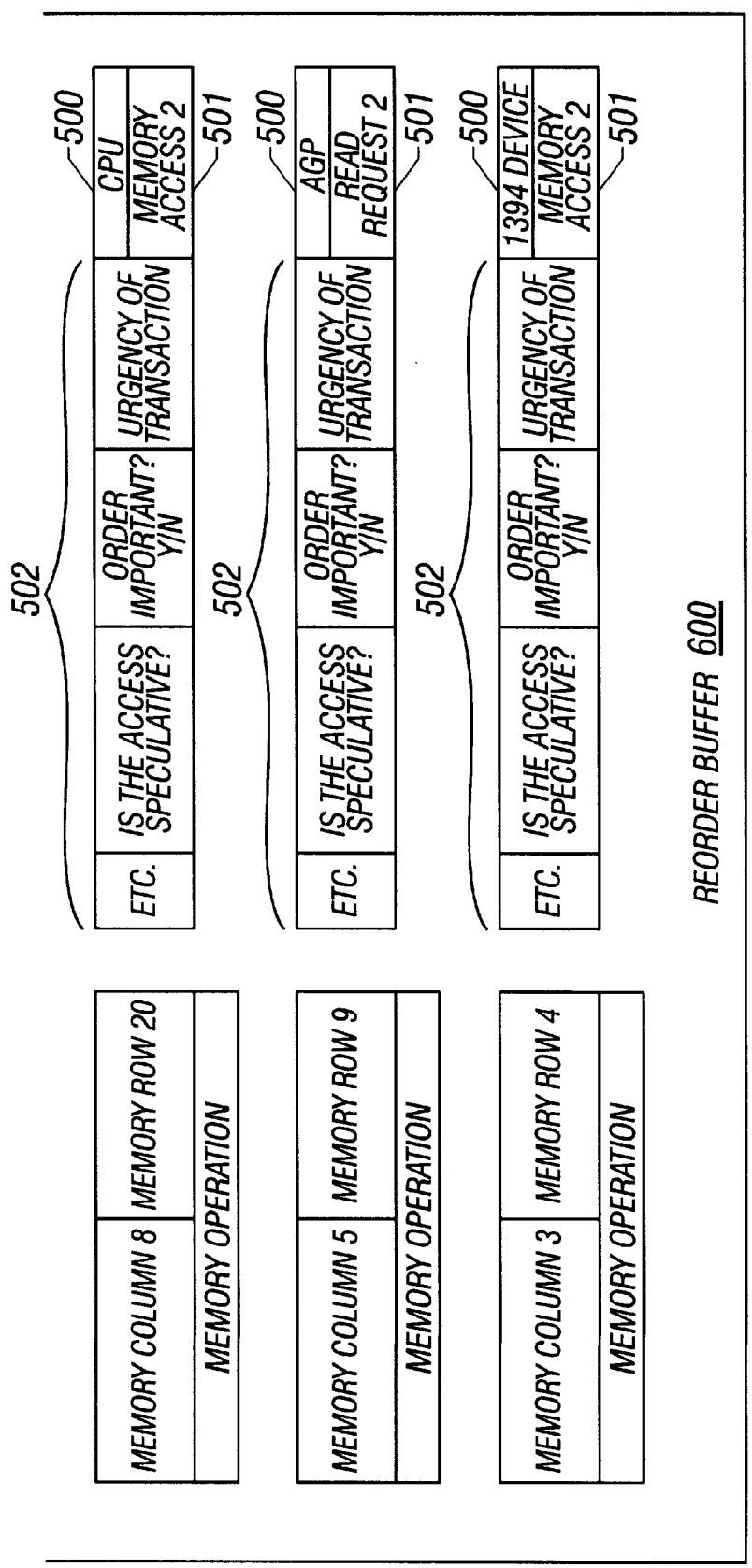

With reference now to FIG. 6, shown are examples of information which may be contained within tags 502. Illustrated is an expanded view of a reorder buffer 600 typical of reorder buffers 5611–561S or 5111–511B. As shown, tags 502 may contain within them information related to the urgency of a transaction (such as a priority), whether the transaction received from an initiating source must be answered in the order received, whether the access is speculative, etc. Also shown are examples of indicator 500 of the initiator and examples of ordinal number delimiter 501. It is to be understood that although the identity of the initiator, the urgency (the ordinal number delimiter 501 gives an indication of ordering relative to other memory access requests originating from a particular memory access request source) of the transaction, the ordering information, and the speculative nature of the requested memory accesses are denoted, such specific items of information are exemplary and are not intended to be limiting, and that each of the items of information shown can appear in isolation or in combination with other items of like information; furthermore, it will be appreciated by those within the art that many other types of information related to each memory transaction are available at each system interface, and that such information is intended to be encompassed within the embodiment shown. Likewise it is to be understood that each tag 502 need not be of the same length nor contain the same type of information in order to fit within the spirit of the embodiment shown. Since indicator 500 of the initiator, ordinal number delimiter 501, and tags 502 can convey information related in some sense to a source of data, they (indicator 500 of initiator, ordinal number delimiter 501, and tags 502) can be thought of as specific instances of "source-specific informants."

Referring again to FIGS. 5A and 5B, it can be seen that, utilizing such information as was described in relation to FIG. 6, a number of different algorithms may be implemented within each reorder and bank select engine respectively paired with each reorder buffer. For example, one implementation could reorder the requests so that all requests sharing a single DRAM 130 page are placed together. When these requests are subsequently processed, the DRAM 130 page miss rate would be reduced, improving overall throughput. The exact choice of reorder algorithm depends on the source of the requests, and the information available within the requests. One advantage of an embodiment of the present invention is that the separate reorder and bank select engines, respectively paired with the separate reorder buffers, give rise to the ability to customize any algorithm utilized by each such pairings, which will allow multiple bus-specific and/or source-specific custom algorithms to be deployed contemporaneously.

Figure 7A:
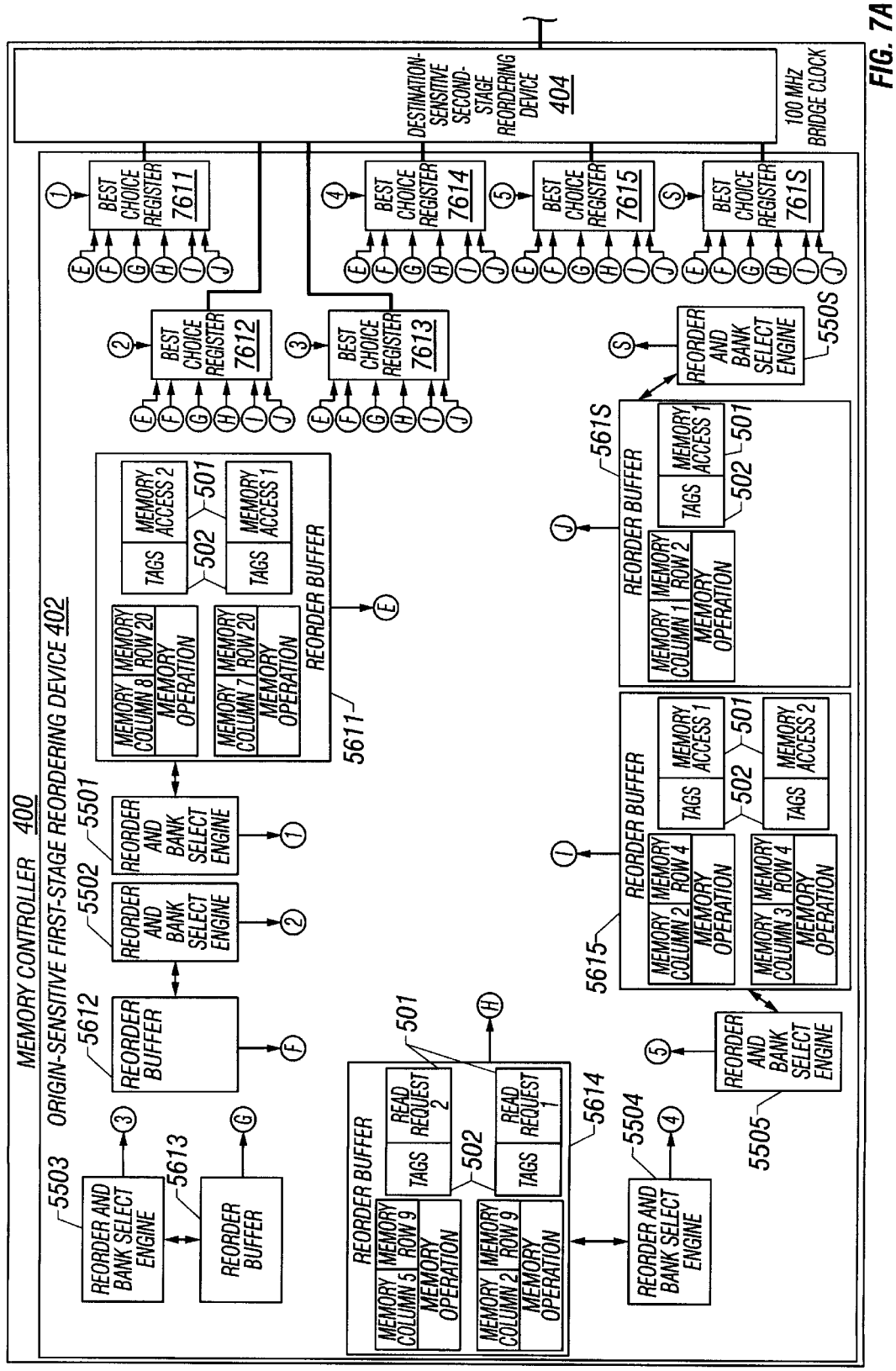
FIG. 7A depicts yet another embodiment wherein best choice registers are interposed between reorder buffers and a destination-sensitive second-stage memory access request reordering device.

With reference now to FIG. 7A, depicted is another embodiment. The embodiment illustrated functions in substantially the same way as that described in relation to FIG. 5A, except illustrated is that best choice registers 7611–761S are interposed between reorder buffers 5611–561S and destination-sensitive second-stage memory access request reordering device 404. Depicted is that each best choice register 7611–761S is connected to and accepts output from all reorder buffers 5611–561S. Shown is that reorder and bank select engines 5501–550S sends control signals 1 to S to best choice registers 7611–761S, which then accept input from a selected reorder buffer 5611–561S in response to the control signals 1 to S. Best choice registers 7611–761S hold the "best choice" request available from each requester, along with specific information about each such best choice request. The information about the request, along with the identity of each requester which is implicit in the existence of the separate result registers for each reorder buffer, form the basis of the decision making within destination-sensitive second-stage memory access request reordering device 404. Destination-sensitive second-stage memory access request reordering device 404 utilizes this information, along with the current state of DRAMs 1301–130D (it will be understood by those within the art that although DRAMs are shown, such DRAMs could also be replaced by banks of memory) in system memory 116, to select the next memory operation for execution.

Those skilled in the art will recognize that a key data item in the information from best choice registers 7611–761S to destination-sensitive second-stage memory access request reordering device 404 is whether or not the current "best choice" cycle falls into the same page as the last request from this source placed into this register. The destination-sensitive second-stage memory access request reordering device 404 can use this data to increase DRAMs 1301–130D page hit percentage by giving preference to any requests for accesses that are in-page (within an open page).

Figure 7B:
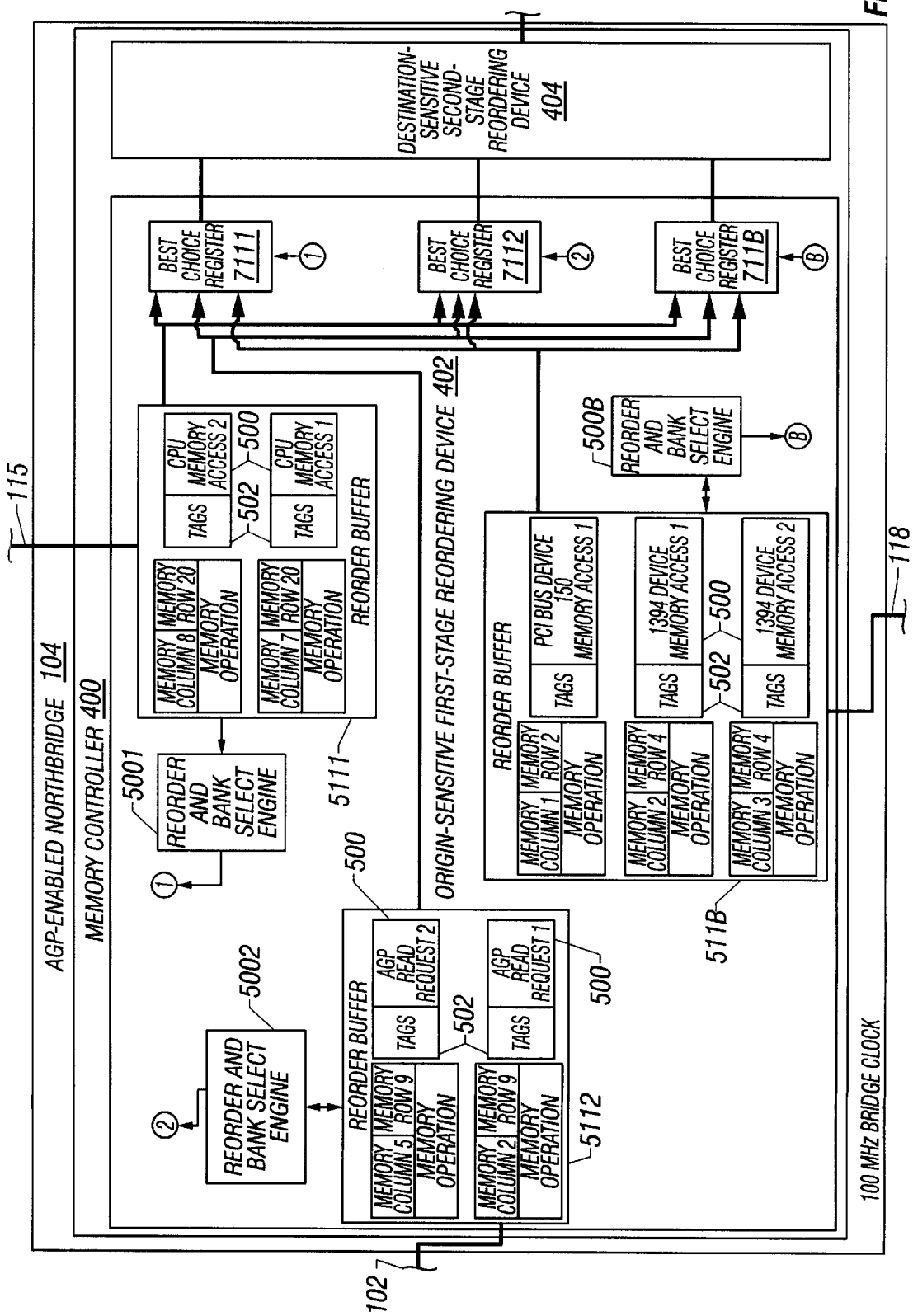
FIG. 7B depicts yet still another embodiment wherein best choice registers are interposed between reorder buffers and a destination-sensitive second-stage memory access request reordering device.

Referring now to FIG. 7B, depicted is another embodiment. The embodiment functions in substantially the same way as the embodiment described in relation to FIG. 5B, except that best choice registers 7111–711B are interposed between reorder buffers 5111–511B and destination-sensitive second-stage reorder device 404. Each best choice register 7111–711B connects to and accepts output from all reorder buffers 5111–511B. Reorder and bank select engines 5001–500B send control signals 1 to S to best choice registers 7111–711B, which then accept input from a selected reorder buffer 5111–511B in response to the control signals 1 to B. Best choice registers 7111–711B hold the "best choice" request available from each requester, along with specific information about each such best choice request. The information about the request, along with the identity of each requester which is implicit in the existence of the separate result registers for each reorder buffer, form the basis of the decision making within destination-sensitive second-stage memory access request reordering device 404. Destination-sensitive second-stage memory access request reordering device 404 utilizes this information, along with the current state of DRAMs 1301–130D (it will be understood by those within the art that although DRAMs are shown, each such DRAMs could also be replaced by banks of memory) in system memory 116, to select the next memory operation for execution.

Those skilled in the art will recognize that a key data item in the information from best choice registers 7111–711B to destination-sensitive second-stage memory access request reordering device 404 is whether or not the current "best choice" cycle falls into the same page as the last request from this source placed into this register. The destination-sensitive second-stage memory access request reordering device 404 can use this data to increase the DRAMs 1301–130D page hit percentage by giving preference to any requests for accesses that are in-page (within an open page).

As a final point, it should be noted that implicit in FIGS. 5A, 5B, 7A, and 7B is that the outputs from each reorder buffer 5611–561S, reorder buffer 5111–511B, best choice register 7611–761S, or best choice register 7111–711B are presented to destination-sensitive second-stage memory access request reordering device 404. It will be noted that in order to allow destination-sensitive second-stage memory access request reordering device 404 to substantially maximize DRAM throughput and achieve low latencies, it is important that any algorithm(s) ultimately employed within destination-sensitive second-stage memory access request reordering device 404 use the information output from origin-sensitive first-stage memory access request reordering device 402.

IV. Structure and Operation for Destination-Sensitive Memory Control and Access in Data Processing Systems With reference now to FIG. 8A1, shown is an expanded view of an embodiment of destination-sensitive second-stage memory access request reordering device 404. Origin-sensitive first-stage memory access request reordering device 402 interfaces with destination-sensitive second-stage memory access request reordering device 404. Origin-sensitive first-stage memory access request reordering device 402 is essentially the embodiment shown in FIG. 5A. However, for sake of clarity the memory operations depicted internal to the reorder buffers shown in FIG. 5A are not shown in FIG. 8A1, although such operations are still presumed to be present.

The outputs of reorder buffers 5611–561S feed into centralized state machine 800. Centralized state machine 800 receives system memory 116 state information related to the states of various devices in system memory 116, such as DRAM chips 1301–130D, via memory status lines 8511–851D. While embodiments set forth herein describe centralized state machines (e.g., 800) and/or components thereof (e.g. device arbiter and state engines 8001–800D) acquiring memory status via memory status lines (e.g., 8511–851D), it is to be understood that those status lines are provided for conceptual clarity. Typically, memory controllers acquire memory status without such memory status lines. In such embodiments, the centralized state machines and/or components thereof are operably connected to one or more memory devices (e.g., DRAM chips 1301–130D) not physically but by logical association whereby memory status is determined based on previous memory access activity (e.g., previous memory requests issued and/or elapsed time since requests issued can be used to determine/acquire the status of the one or more system memory devices).

Within destination-sensitive second-stage memory access request reordering device 404 are memory device buffers 8011–801D, where each memory device buffer 8011–801D is associated with a respective DRAM chip 1301–130D.

As has been discussed in relation to FIG. 5A, the reorder and bank select engines 5501–550S have reordered the entries in their respective reorder buffers 5611–561S such that centralized state machine 800 is presented with what appears to be the most advantageous memory operation to be next executed within the respective reorder buffers 5611–561S. Centralized state machine 800 utilizes such information in conjunction with that information gleaned from memory status lines 8511–851D to dispatch the memory requests received from the various reorder buffers 5611–561S to the various memory device buffers 8011–801D for subsequent accessing of the various memory devices, or DRAM chips 1301–130D, in system memory 116.

Centralized state machine 800 can reorder the requests in each of the memory device buffers 8011–801D. Consequently, upon receipt of requested memory operations from the various reorder buffers 5611–561S, centralized state machine can use these preliminary "guesses" as to the memory operation to be next executed, in conjunction with the state of system memory received via memory status lines 8511–851D, in order both to dispatch the requested operations to an appropriate memory device buffer 8011–801D, and reorder the requests within the buffer to which the request is dispatched such that system memory 116 utilization and access is substantially maximized.

Those skilled in the art will recognize that there are numerous different algorithms which can be employed by centralized state machine 800 to ensure such near optimum system memory 116 utilization. For example, the received memory requests can be placed in the appropriate buffers and subsequently positioned within such buffers to take advantage of any pages in memory that may be open, or are likely to be opened given the current contents of any such memory device buffer 8011–851D. Another example of such algorithms is giving priority to memory access requests that result in not having to change direction of data flow.

With reference now to FIG. 8A2, shown is another embodiment of destination-sensitive second-stage memory access request reordering device 404. The embodiment depicted in FIG. 8A2 is substantially the same as that depicted in FIG. 8A1; however, centralized state machine 800 of FIG. 8A1 has been replaced in FIG. 8A2 by device arbiter and state engines 8001–800D.

Device arbiter and state engines 8001–800D are contained within distributed state machine 850. Device arbiter and state engines 8001–800D are shown as within state machine 850 in order to illustrate that each individual device arbiter and state engine 8001–800D accepts as inputs all of the outputs of reorder buffers 5611–561S. Each device arbiter and state engine 8001–800D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 8001–800D to control the access of each associated DRAM chip 1301–130D.

Referring now to FIG. 8B1 depicted is another embodiment of destination-sensitive second-stage memory access request reordering device 404, which provides an expanded view of memory controller 400. Memory controller 400 contains origin-sensitive first-stage memory access request reordering device 402 and destination-sensitive second-stage memory access request reordering device 404. The embodiment shown of origin-sensitive first-stage memory access request reordering device 402 is substantially that shown in FIG. 5A. FIG. 8B1 is substantially the same as the embodiment shown in FIG. 8A1, except that further shown in FIG. 8B1 is that reorder and bank select engines 5501–550S communicate with centralized state machine 802.

That is, shown is that each reorder and bank select engine 5501–550S has emanating from it a control signal, shown as control signals 1 through S. These control signals are shown as being received by centralized state machine 802.

The control information communicated to centralized state machine 802 can contain any number of types of information such as the various addresses to be accessed by the requests in any particular reorder buffer 5611–561S, whether or not the requests in the various reorder buffers 5601–561S are highly correlated (meaning that they tend to sequentially access memory within various closely associated memory locations), and various other information. Examples of such various other information are direction of data flow (i.e. read or write), whether a request is speculative, source identification, whether request pertains to an isochronous stream, and also heat status of devices. This can also be determined by command history.

Centralized state machine 802 can now utilize this additional control information in conjunction with that information already discussed in relation to FIG. 8A1 to make yet more intelligent decisions as to the memory device buffers 8011–801D to which various memory access requests will be dispatched, as well as decisions related to the ordering of such requests within the memory device buffers 8011–801D to which the requests are dispatched.

With reference now to FIG. 8B2, shown is yet another embodiment of destination-sensitive second-stage memory access request reordering device 404. The embodiment depicted in FIG. 8B2 is substantially the same as that depicted in FIG. 8B1; however, centralized state machine 802 of FIG. 8B1 has been replaced in FIG. 8B2 by device arbiter and state engines 8021–802D.

Device arbiter and state engines 8021–802D are contained within distributed state machine 852. Device arbiter and state engines 8021–802D are shown as such in order to illustrate that each individual device arbiter and state engine 8021–802D accepts as inputs all of the outputs of reorder buffers 5611–561S. Each device arbiter and state engine 8021–802D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 8021–802D to control the access of each associated DRAM chip 1301–130D.

With reference now to FIG. 8C1, shown is yet another embodiment of destination-sensitive second-stage memory access request reordering device 404. Depicted is origin-sensitive first-stage memory access request reordering device 402, which functions in substantially the same way as the embodiment of origin-sensitive first-stage memory access request reordering device 402 discussed in relation to FIG. 7A. The outputs of best choice registers 7611–761S are received by centralized state machine 804.

Centralized state machine 804 utilizes the memory requests contained within best choice registers 7611–761S in conjunction with the other control signals and information, discussed previously in relation to FIGS. 8A1 and 8B1, to dispatch the memory requests received from best choice registers 7611–761S to the various memory device buffers 8011–801D and to reorder the requests within the various memory device buffers 8011–801D such that near optimum utilization of system memory 116 is achieved.

With reference now to FIG. 8C2, shown is yet another embodiment of destination-sensitive second-stage memory access request reordering device 404. The embodiment depicted in FIG. 8C2 is substantially the same as that depicted in FIG. 8C1; however, centralized state machine 804 of FIG. 8C1 has been replaced in FIG. 8C2 by device arbiter and state engines 8041–804D.

Device arbiter and state engines 8041–804D are contained within distributed state machine 854. Device arbiter and state engines 8041–804D are shown as so contained in order to illustrate that each individual device arbiter and state engine 8041–804D accepts as inputs all of the outputs of best choice registers 7611–761S. Each device arbiter and state engine 8041–804D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 8041–804D to control the access of each associated DRAM chip 1301–130D.

With reference now to FIG. 9A1, shown is an expanded view of an embodiment of destination-sensitive second-stage memory access request reordering device 404. Origin-sensitive first-stage memory access request reordering device 402 interfaces with destination-sensitive second-stage memory access request reordering device 404. Origin-sensitive first-stage memory access request reordering device 402 is essentially the embodiment shown in FIG. 5B. However, for sake of clarity the memory operations depicted internal to the reorder buffers shown in FIG. 5B are not shown in FIG. 9A1, although such operations are still presumed to be present.

Outputs of reorder buffers 5111–511B feed into centralized state machine 900. Centralized state machine 900 receives system memory 116 state information related to the states of various devices in system memory 116, such as DRAM chips 1301–130D, via memory status lines 9511–951D. Within destination-sensitive second-stage memory access request reordering device 404 are memory device buffers 9011–901D, where each memory device buffer 9011–901D is associated with a respective DRAM chip 1301–130D.

As has been discussed in relation to FIG. 5B, the reorder and bank select engines 5001–500B have reordered the entries in their respective reorder buffers 5111–511B such that centralized state machine 900 is presented with what appears to be the most advantageous memory operation to be next executed within the respective reorder buffers 5111–511B. Centralized state machine 900 utilizes such information in conjunction with that information gleaned from memory status lines 9511–951D to dispatch the memory requests received from the various reorder buffers 5111–511B to the various memory device buffers 9011–901D for subsequent accessing of the various memory devices, or DRAM chips 1301–130D in system memory 116.

Centralized state machine 900 can reorder the requests in each of the memory device buffers 9011–901D. Consequently, upon receipt of requested memory operations from the various reorder buffers 5111–511B, centralized state machine can use these preliminary "guesses" as to the memory operation to be next executed, in conjunction with the state of system memory received via memory status lines 9511–951D, in order to both dispatch the requested operations to the appropriate memory device buffer 9011–901D, and reorder the requests within the buffer to which the request is dispatched such that system memory 116 utilization and access is substantially maximized.

Those skilled in the art will recognize that there are numerous different algorithms which can be employed by centralized state machine 900 to ensure such near optimum system memory 116 utilization. For example, the received memory requests can be placed in the appropriate buffers and subsequently positioned within such buffers to take advantage of any pages in memory that may be open, or are likely to be opened given the current contents of any such memory device buffer 9011–951D.

With reference now to FIG. 9A2, shown is yet another embodiment of destination-sensitive second-stage memory access request reordering device 404. The embodiment depicted in FIG. 9A2 is substantially the same as that depicted in FIG. 9A1; however, centralized state machine 900 of FIG. 9A1 has been replaced in FIG. 9A2 by device arbiter and state engines 9001–900D.

Device arbiter and state engines 9001–900D are contained within distributed state machine 950. Device arbiter and state engines 9001–900D are shown as so contained in order to illustrate that each individual device arbiter and state engine 9001–900D accepts as inputs all of the outputs of reorder buffers 5111–511B. Each device arbiter and state engine 9001–900D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 9001–900D to control the access of each associated DRAM chip 1301–130D.

Referring now to FIG. 9B1, depicted is another embodiment of destination-sensitive second-stage memory access request reordering device 404. Memory controller 400 contains origin-sensitive first-stage memory access request reordering device 402 and destination-sensitive second-stage memory access request reordering device 404. The embodiment shown of origin-sensitive first-stage memory access request reordering device 402 is substantially that shown in relation to FIG. 5B. FIG. 9B1 is substantially the same as the embodiment shown in relation to FIG. 9A1, except that further shown in FIG. 9B1 is that reorder and bank select engines 5001–500B communicate with centralized state machine 902.

That is, shown is that each reorder and bank select engine 5001–500B has emanating from it a control signal shown as control signals 1 through S. These control signals are shown as being received by centralized state machine 902.

The control information communicated to centralized state machine 902 can contain any number of types of information such as the various addresses to be accessed by the requests in any particular reorder buffer 5111–511B, whether or not the requests in the various reorder buffers 5101–511B are highly correlated (meaning that they tend to sequentially access memory within various closely associated memory locations), and various other information. Special requirements or alerts (such as buffer-full conditions) are requesting the memory access requests.

Centralized state machine 902 can now utilize this additional control information in conjunction with that information already discussed in relation to FIG. 9A1 to make yet more intelligent decisions as to the memory device buffers 9011–901D to which various memory access requests will be dispatched as well as the ordering of such requests within such memory device buffers 9011–901D.

With reference now to FIG. 9B2, shown is yet another embodiment of destination-sensitive second-stage memory access request reordering device 404. The embodiment depicted in FIG. 9B2 is substantially the same as that depicted in FIG. 9B1; however, centralized state machine 902 of FIG. 9B1 has been replaced in FIG. 9B2 by device arbiter and state engines 9021–902D.

Device arbiter and state engines 9021–902D are contained within distributed state machine 952. Device arbiter and state engines 9021–902D are shown as so contained in order to illustrate that each individual device arbiter and state engine 9021–902D accepts as inputs all of the outputs of reorder buffers 5111–511B. Depicted is that each device arbiter and state engine 9021–902D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 9021–902D to control the access of each associated DRAM chip 1301–130D.

With reference now to FIG. 9C1, shown is yet another embodiment of destination-sensitive second-stage memory access request reordering device 404. Depicted is origin-sensitive first-stage memory access request reordering device 402, which functions in substantially the same way as the embodiment of origin-sensitive first-stage memory access request reordering device 402 discussed in relation to FIG. 7B. Illustrated is that the outputs of best choice registers 7111–711B are received by centralized state machine 904.

Centralized state machine 904 utilizes the memory requests contained within best choice registers 7111–711B in conjunction with the other control signals and information, discussed previously in relation to FIGS. 9A1 and 9B1, to dispatch the memory requests received from best choice registers 7111–711B to the various memory device buffers 9011–901D and to reorder the requests within the various memory device buffers 9011–901D such that near optimum utilization of system memory 116 is achieved.

With reference now to FIG. 9C2, shown is yet another embodiment of destination-sensitive second-stage memory access request reordering device 404. The embodiment depicted in FIG. 9C2 is substantially the same as that depicted in FIG. 9C1; however, centralized state machine 904 of FIG. 9C1 has been replaced in FIG. 9C2 by device arbiter and state engines 9041–904D.

Device arbiter and state engines 9041–904D are contained within distributed state machine 954. Device arbiter and state engines 9041–904D are shown as so contained in order to illustrate that each individual device arbiter and state engine 9041–904D accepts as inputs the outputs of best choice registers 7111–711B. Each device arbiter and state engine 9041–904D is respectively paired with a particular memory device, or DRAM chip 1301–130D. That is, each device arbiter and state engine shown accepts the state of a particular system memory device (e.g., a DRAM chip 1301–130D) which allows independent algorithms to be utilized by each device arbiter and state machine 9041–904D to control the access of each associated DRAM chip 1301–130D.

V. Structure and Operation for Generating and Utilizing Speculative Memory Access Requests in Data Processing Systems The foregoing description has set forth the various ways in which memory latency can be reduced. It has been discovered that another way in which observed latency from memory accesses can be reduced is to begin a memory access request before a request is actually issued by a requester. This method relies on a speculative cycle generator.

Referring now to FIG. 10A1, shown is an expanded view of an embodiment of memory controller 400 wherein is contained an embodiment of a speculative memory access request generation and utilization structure and operation. FIG. 10A1 is substantially the same as the embodiment shown in FIG. 8A1, except that further shown in FIG. 10A1 is that each reorder and bank select engine 5501–550S is now associated with a respective origin-sensitive speculative memory access request cycle generator 1501–150S. Also shown is that centralized state machine 800 has been replaced by centralized state machine 1800.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative memory access requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle request generators 1501–150S, which change the status flag from a default "true access" value to a value indicating "speculative access."

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycle s is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10A1, depicted is that centralized state machine 1800 has internal to it speculative buffer checking and control logic 1002 and speculative cycle response buffer 1004. As has been noted, destination-sensitive second-stage memory access request reordering device 404 receives memory requests as either speculative or true memory access requests. Thus, in light of the discussion set forth above, it is clear that centralized state machine 1800 will also receive such requests in that all memory access requests pass through it in the embodiments described herein.

Assuming that a request so received is a speculative request, centralized state machine 1800 will determine, using its control algorithms, whether the current pending memory operations in memory device buffers 8011–801D make the execution of such speculative request advantageous. Assuming that such execution is advantageous, centralized state machine 1800 will execute the speculative memory operation request. Typically, the speculative memory operation request will be a read request. When data is received by centralized state machine 1800 in response to a speculative read request, that data is placed in speculative cycle response buffer 1004.

Thereafter, when centralized state machine 1800 receives a memory access read request, which is not a speculative request, centralized state machine 1800 utilizes speculative buffer checking and control logic 1002 to determine whether speculative cycle response buffer has within it data associated with the address of such a received memory access read request. That is, a speculative memory access request will not hit in the speculative cycle response buffer 1004, but rather will be passed through as a candidate for subsequent execution.

In the event that data associated with the non-speculative memory access read request address is in the speculative cycle response buffer, centralized state machine 1800 can then satisfy the request merely by retrieving the data from the speculative cycle response buffer 1004 thereby avoiding the latency associated with accessing system memory 116. It should be noted that in the event that centralized state machine 1800 receives a write request to an address which corresponds to data with the same address in speculative cycle response buffer 1004, centralized state machine 1800 will utilize speculative buffer checking and control logic 1002 to remove such data from speculative cycle response buffer, since it is likely that the write request will change the data in system memory 116 and thus gives rise to the likelihood that the data in speculative cycle response buffer 1004 will not be current. Alternatively, centralized state machine 1800 could replace the data associated with the address in speculative cycle response buffer 1004 with the data in the write request while simultaneously writing the data to system memory 116.

Referring now to FIG. 10A2, shown is an expanded view of an embodiment of memory controller 400 which contains another embodiment of a speculative memory access request generation and utilization structure and operation. FIG. 10A2 is substantially the same as the embodiment shown in FIG. 8A2, except that further shown in FIG. 10A2 is that each reorder and bank select engine 5501–550S is now associated with a respective origin-sensitive speculative memory access request cycle generator 1501–150S. Also shown is that centralized state machine 850 has been replaced by centralized state machine 1850.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative cycle requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generators 1501–150S, which change the status flag from a default "true access" value to a value indicating "speculative access."

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10A2, depicted is that centralized state machine 1850 has internal to it speculative buffer checking and control logic 1006 and speculative cycle response buffer 1008. As has been noted, destination-sensitive second-stage memory access request reordering device 404 receives memory requests as either speculative or true memory access requests. Thus, in light of the discussion set forth above, it is clear that centralized state machine 1850 will also receive such requests in that all memory access requests pass through it in the embodiments described herein.

Assuming that a request so received is a speculative request, centralized state machine 1850 will determine, using its control algorithms, whether the current pending memory operations in memory device buffers 801I–801D makes the execution of such speculative request advantageous. Assuming that such execution is advantageous, centralized state machine 1850 will execute the speculative memory operation request. Typically, the speculative memory operation request will be a read request. When data is received by centralized state machine 1850 in response to a speculative read request, that data is placed in speculative cycle response buffer 1008.

Thereafter, when centralized state machine 1850 receives a memory access read request, which is not a speculative request, centralized state machine 1850 utilizes speculative buffer checking and control logic 1006 to determine whether speculative cycle response buffer has within it data associated with the address of such a received memory access read request. That is, a speculative memory access request will not hit in the speculative cycle response buffer 1008, but rather will be passed through as a candidate for subsequent execution.

In the event that data associated with the non-speculative memory access read request address is in the speculative cycle response buffer, centralized state machine 1850 can then satisfy the request merely by retrieving the data from the speculative cycle response buffer 1008 thereby avoiding the latency associated with accessing system memory 116. It should be noted that in the event that centralized state machine 1850 receives a write request to an address which is correspondent to data with the same address in speculative cycle response buffer 1008, centralized state machine 1850 will utilize speculative buffer checking and control logic 1000 to remove such data from speculative cycle response buffer, since it is likely that the write request will change the data in system memory 116 and thus gives rise to the likelihood that the data in speculative cycle response buffer 1008 will not be current. Alternatively, centralized state machine 1850 could replace the data associated with the address in speculative cycle response buffer 1008 with the data in the write request while simultaneously writing the data to system memory 116.

Referring now to FIG. 10B1, shown is an expanded view of an embodiment of memory controller 400 wherein is contained another embodiment of a speculative memory access request generation and utilization structure and operation. FIG. 10B1 is substantially the same as the embodiment shown in FIG. 8B1, except that further shown in FIG. 10B1 is that each reorder and bank select engine 5501–550S is now associated with a respective origin-sensitive speculative memory access request cycle generator 1501–150S. Also shown is that centralized state machine 802 has been replaced by centralized state machine 1802.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative cycle requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generators 1501–150S, which change the status flag from a default "true access" value to a value indicating "speculative access." In another embodiment, origin-sensitive speculative memory access request cycle generators 1501–150S communicate with their respectively paired reorder and bank select engines 5501–550S, which subsequently transmit information indicating whether certain pending requests are speculative or not over control signal lines 1–S, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10B1, depicted is that centralized state machine 1802 has internal to it speculative buffer checking and control logic 1010 and speculative cycle response buffer 1012. As has been noted, destination-sensitive second-stage memory access request reordering device 404 receives memory requests as either speculative or true memory access requests. Thus, in light of the discussion set forth above, it is clear that centralized state machine 1802 will also receive such requests in that all memory access requests pass through it in the embodiments described herein.

Assuming that a request so received is a speculative request, centralized state machine 1802 will determine, using its control algorithms, whether the current pending memory operations in memory device buffers 8011–801D makes the execution of such speculative request advantageous. Assuming that such execution is advantageous, centralized state machine 1802 will execute the speculative memory operation request. Typically, the speculative memory operation request will be a read request. When data is received by centralized state machine 1802 in response to a speculative read request, that data is placed in speculative cycle response buffer 1012.

Thereafter, when centralized state machine 1802 receives a memory access read request, which is not a speculative request, centralized state machine 1802 utilizes speculative buffer checking and control logic 1010 to determine whether speculative cycle response buffer has within it data associated with the address of such a received memory access read request. That is, a speculative memory access request will not hit in the speculative cycle response buffer 1012, but rather will be passed through as a candidate for subsequent execution.

In the event that data associated with the non-speculative memory access read request address is in the speculative cycle response buffer, centralized state machine 1802 can then satisfy the request merely by retrieving the data from the speculative cycle response buffer 1012 thereby avoiding the latency associated with accessing system memory 116. It should be noted that in the event that centralized state machine 1802 receives a write request to an address which is correspondent to data with the same address in speculative cycle response buffer 1012, centralized state machine 1802 will utilize speculative buffer checking and control logic 1010 to remove such data from speculative cycle response buffer, since it is likely that the write request will change the data in system memory 116 and thus gives rise to the likelihood that the data in speculative cycle response buffer 1012 will not be current. Alternatively, centralized state machine 1802 could replace the data associated with the address in speculative cycle response buffer 1012 with the data in the write request while simultaneously writing the data to system memory 116.

Referring now to FIG. 10B2, shown is an expanded view of an embodiment of memory controller 400 wherein is contained another embodiment of a speculative memory access request generation and utilization structure and operation. FIG. 10B2 is substantially the same as the embodiment shown in FIG. 8B2, except that further shown in FIG. 10B2 is that each reorder and bank select engine 5501–550S is now associated with a respective origin-sensitive speculative memory access request cycle generator 1501–150S. Also shown is that centralized state machine 852 has been replaced by centralized state machine 1852.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative cycle requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generators 1501–150S, which change the status flag from a default "true access" value to a value indicating "speculative access." In another embodiment, origin-sensitive speculative memory access request cycle generators 1501–150S communicate with their respectively paired reorder and bank select engines 5501–550S, which subsequently transmit information indicating whether certain pending requests are speculative or not over control signal lines 1–S, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10B2, depicted is that centralized state machine 1852 has internal to it speculative buffer checking and control logic 1014 and speculative cycle response buffer 1016. As has been noted, destination-sensitive second-stage memory access request reordering device 404 receives memory requests as either speculative or true memory access requests. Thus, in light of the discussion set forth above, it is clear that centralized state machine 1852 will also receive such requests in that all memory access requests pass through it in the embodiments described herein.

Assuming that a request so received is a speculative request, centralized state machine 1852 will determine, using its control algorithms, whether the current pending memory operations in memory device buffers 801I–801D makes the execution of such speculative request advantageous. Assuming that such execution is advantageous, centralized state machine 1852 will execute the speculative memory operation request. Typically, the speculative memory operation request will be a read request. When data is received by centralized state machine 1852 in response to a speculative read request, that data is placed in speculative cycle response buffer 1016.

Thereafter, when centralized state machine 1852 receives a memory access read request, which is not a speculative request, centralized state machine 1852 utilizes speculative buffer checking and control logic 1014 to determine whether speculative cycle response buffer has within it data associated with the address of such a received memory access read request. That is, a speculative memory access request will not hit in the speculative cycle response buffer 1016, but rather will be passed through as a candidate for subsequent execution.

In the event that data associated with the non-speculative memory access read request address is in the speculative cycle response buffer, centralized state machine 1852 can then satisfy the request merely by retrieving the data from the speculative cycle response buffer 1016 thereby avoiding the latency associated with accessing system memory 116. It should be noted that in the event that centralized state machine 1852 receives a write request to an address which is correspondent to data with the same address in speculative cycle response buffer 1016, centralized state machine 1852 will utilize speculative buffer checking and control logic 1014 to remove such data from speculative cycle response buffer, since it is likely that the write request will change the data in system memory 116 and thus gives rise to the likelihood that the data in speculative cycle response buffer 1016 will not be current. Alternatively, centralized state machine 1852 could replace the data associated with the address in speculative cycle response buffer 1016 with the data in the write request while simultaneously writing the data to system memory 116.

Referring now to FIG. 10C1, shown is an expanded view of an embodiment of memory controller 400 wherein is contained another embodiment of a speculative memory access request generation and utilization structure and operation. FIG. 10C1 is substantially the same as the embodiment shown in FIG. 8C1, except that further shown in FIG. 10C1 is that each reorder and bank select engine 5501–550S is now associated with a respective origin-sensitive speculative memory access request cycle generator 1501–150S. Also shown is that centralized state machine 804 has been replaced by centralized state machine 1804.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative cycle requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1501–150S, which change the status flag from a default "true access" value to a value indicating "speculative access." In another embodiment, origin-sensitive speculative memory access request cycle generators 1501–150S communicate with their respectively paired reorder and bank select engines 5501–550S, which subsequently transmit information indicating whether certain pending requests are speculative or not over control signal lines 1–S, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10C1, depicted is that centralized state machine 1804 has internal to it speculative buffer checking and control logic 1018 and speculative cycle response buffer 1020. As has been noted, destination-sensitive second-stage memory access request reordering device 404 receives memory requests as either speculative or true memory access requests. Thus, in light of the discussion set forth above, it is clear that centralized state machine 1804 will also receive such requests in that all memory access requests pass through it in the embodiments described herein.

Assuming that a request so received is a speculative request, centralized state machine 1804 will determine, using its control algorithms, whether the current pending memory operations in memory device buffers 8011–801D makes the execution of such speculative request advantageous. Assuming that such execution is advantageous, centralized state machine 1804 will execute the speculative memory operation request. Typically, the speculative memory operation request will be a read request. When data is received by centralized state machine 1804 in response to a speculative read request, that data is placed in speculative cycle response buffer 1020.

Thereafter, when centralized state machine 1804 receives a memory access read request, which is not a speculative request, centralized state machine 1804 utilizes speculative buffer checking and control logic 1018 to determine whether speculative cycle response buffer has within it data associated with the address of such a received memory access read request. That is, a speculative memory access request will not hit in the speculative cycle response buffer 1020, but rather will be passed through as a candidate for subsequent execution.

In the event that data associated with the non-speculative memory access read request address is in the speculative cycle response buffer, centralized state machine 1804 can then satisfy the request merely by retrieving the data from the speculative cycle response buffer 1020 thereby avoiding the latency associated with accessing system memory 116. It should be noted that in the event that centralized state machine 1804 receives a write request to an address which is correspondent to data with the same address in speculative cycle response buffer 1020, centralized state machine 1804 will utilize speculative buffer checking and control logic 1018 to remove such data from speculative cycle response buffer, since it is likely that the write request will change the data in system memory 116 and thus gives rise to the likelihood that the data in speculative cycle response buffer 1020 will not be current. Alternatively, centralized state machine 1804 could replace the data associated with the address in speculative cycle response buffer 1020 with the data in the write request while simultaneously writing the data to system memory 116.

Referring now to FIG. 10C2, shown is an expanded view of an embodiment of memory controller 400 wherein is contained another embodiment of a speculative memory access request generation and utilization structure and operation. FIG. 10C2 is substantially the same as the embodiment shown in FIG. 8C2, except that further shown in FIG. 10C2 is that each reorder and bank select engine 5501–550S is now associated with a respective origin-sensitive speculative memory access request cycle generator 1501–150S. Also shown is that centralized state machine 854 has been replaced by centralized state machine 1854.

Each origin-sensitive speculative memory access request cycle generator 1501–150S operates in tandem with its respectively paired reorder and bank select engine 5501–550S. Each origin-sensitive speculative memory access request cycle generator 1501–150S is respectively paired with a reorder buffer 5611–561S, and uses as input the memory access requests present in each respectively paired reorder buffer 5611–561S; furthermore, each origin-sensitive speculative memory access request cycle generator 1501–150S may also maintain cycle history in memory or registers (not shown) private to each such origin-sensitive speculative memory access request cycle generator. Each origin-sensitive speculative memory access request cycle generator 1501–150S uses algorithms that are specific to each source 1 through S in order to generate speculative cycle requests.

Each origin-sensitive speculative memory access request cycle generator 1501–150S places speculative cycle requests into its associated reorder buffer 5611–561S. Speculative cycle requests are reordered along with other requests by reorder and bank select engines 5501–550S and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1501–150S, which change the status flag from a default "true access" value to a value indicating "speculative access." In another embodiment, origin-sensitive speculative memory access request cycle generators 1501–150S communicate with their respectively paired reorder and bank select engines 5501–550S, which subsequently transmit information indicating whether certain pending requests are speculative or not over control signal lines 1–S, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or source. The origin-sensitive speculative memory access request cycle generator for each buffer can employ different algorithms suited to the sources. This is in contrast to a solution that looks at cycle requests from all sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other sources. Alternative solutions that do not allow rejection of the speculative prefetch cycles can decrease system performance when loading is high.

Further referring to FIG. 10C2, depicted is that centralized state machine 1854 has internal to it speculative buffer checking and control logic 1022 and speculative cycle response buffer 1024. As has been noted, destination-sensitive second-stage memory access request reordering device 404 receives memory requests as either speculative or true memory access requests. Thus, in light of the discussion set forth above, it is clear that centralized state machine 1854 will also receive such requests in that all memory access requests pass through it in the embodiments described herein.

Assuming that a request so received is a speculative request, centralized state machine 1854 will determine, using its control algorithms, whether the current pending memory operations in memory device buffers 801I–801D makes the execution of such speculative request advantageous. Assuming that such execution is advantageous, centralized state machine 1854 will execute the speculative memory operation request. Typically, the speculative memory operation request will be a read request. When data is received by centralized state machine 1854 in response to a speculative read request, that data is placed in speculative cycle response buffer 1024.

Thereafter, when centralized state machine 1854 receives a memory access read request, which is not a speculative request, centralized state machine 1854 utilizes speculative buffer checking and control logic 1022 to determine whether speculative cycle response buffer has within it data associated with the address of such a received memory access read request. That is, a speculative memory access request will not hit in the speculative cycle response buffer 1024, but rather will be passed through as a candidate for subsequent execution.

In the event that data associated with the non-speculative memory access read request address is in the speculative cycle response buffer, centralized state machine 1854 can then satisfy the request merely by retrieving the data from the speculative cycle response buffer 1024 thereby avoiding the latency associated with accessing system memory 116. It should be noted that in the event that centralized state machine 1854 receives a write request to an address which is correspondent to data with the same address in speculative cycle response buffer 1024, centralized state machine 1854 will utilize speculative buffer checking and control logic 1022 to remove such data from speculative cycle response buffer, since it is likely that the write request will change the data in system memory 116 and thus gives rise to the likelihood that the data in speculative cycle response buffer 1024 will not be current. Alternatively, centralized state machine 1854 could replace the data associated with the address in speculative cycle response buffer 1024 with the data in the write request while simultaneously writing the data to system memory 116.

Referring now to FIG. 11A1, shown is an expanded view of an embodiment of memory controller 400 wherein is contained another embodiment of a speculative memory access request generation and utilization structure and operation. FIG. 11A1 is substantially the same as the embodiment shown in FIG. 9A1, except that further shown in FIG. 11A1 is that each reorder and bank select engine 5001–501B is now associated with a respective origin-sensitive speculative memory access request cycle generator 1101–110B. Also shown is that centralized state machine 900 has been replaced by centralized state machine 1900.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access."

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11A1, depicted is that centralized state machine 1900 has internal to it speculative buffer checking and control logic 1026 and speculative cycle response buffer 1028. As has been noted, destination-sensitive second-stage memory access request reordering device 404 receives memory requests as either speculative or true memory access requests. Thus, in light of the discussion set forth above, it is clear that centralized state machine 1900 will also receive such requests in that all memory access requests pass through it in the embodiments described herein.

Assuming that a request so received is a speculative request, centralized state machine 1900 will determine, using its control algorithms, whether the current pending memory operations in memory device buffers 8011–801D makes the execution of such speculative request advantageous. Assuming that such execution is advantageous, centralized state machine 1900 will execute the speculative memory operation request. Typically, the speculative memory operation request will be a read request. When data is received by centralized state machine 1900 in response to a speculative read request, that data is placed in speculative cycle response buffer 1028.

Thereafter, when centralized state machine 1900 receives a memory access read request, which is not a speculative request, centralized state machine 1900 utilizes speculative buffer checking and control logic 1026 to determine whether speculative cycle response buffer has within it data associated with the address of such a received memory access read request. That is, a speculative memory access request will not hit in the speculative cycle response buffer 1028, but rather will be passed through as a candidate for subsequent execution.

In the event that data associated with the non-speculative memory access read request address is in the speculative cycle response buffer, centralized state machine 1900 can then satisfy the request merely by retrieving the data from the speculative cycle response buffer 1028 thereby avoiding the latency associated with accessing system memory 116. It should be noted that in the event that centralized state machine 1900 receives a write request to an address which is correspondent to data with the same address in speculative cycle response buffer 1028, centralized state machine 1900 will utilize speculative buffer checking and control logic 1026 to remove such data from speculative cycle response buffer, since it is likely that the write request will change the data in system memory 116 and thus gives rise to the likelihood that the data in speculative cycle response buffer 1028 will not be current. Alternatively, centralized state machine 1900 could replace the data associated with the address in speculative cycle response buffer 1028 with the data in the write request while simultaneously writing the data to system memory 116.

Referring now to FIG. 11A2, shown is an expanded view of an embodiment of memory controller 400 wherein is contained another embodiment of a speculative memory access request generation and utilization structure and operation. FIG. 11A2 is substantially the same as the embodiment shown in FIG. 9A2, except that further shown in FIG. 11A2 is that each reorder and bank select engine 5001–501B is now associated with a respective origin-sensitive speculative memory access request cycle generator 1101–110B. Also shown is that centralized state machine 950 has been replaced by centralized state machine 1950.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access."

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11A2, depicted is that centralized state machine 1950 has internal to it speculative buffer checking and control logic 1030 and speculative cycle response buffer 1032. As has been noted, destination-sensitive second-stage memory access request reordering device 404 receives memory requests as either speculative or true memory access requests. Thus, in light of the discussion set forth above, it is clear that centralized state machine 1950 will also receive such requests in that all memory access requests pass through it in the embodiments described herein.

Assuming that a request so received is a speculative request, centralized state machine 1950 will determine, using its control algorithms, whether the current pending memory operations in memory device buffers 8011–801D makes the execution of such speculative request advantageous. Assuming that such execution is advantageous, centralized state machine 1950 will execute the speculative memory operation request. Typically, the speculative memory operation request will be a read request. When data is received by centralized state machine 1950 in response to a speculative read request, that data is placed in speculative cycle response buffer 1032.

Thereafter, when centralized state machine 1950 receives a memory access read request, which is not a speculative request, centralized state machine 1950 utilizes speculative buffer checking and control logic 1030 to determine whether speculative cycle response buffer has within it data associated with the address of such a received memory access read request. That is, a speculative memory access request will not hit in the speculative cycle response buffer 1032, but rather will be passed through as a candidate for subsequent execution.

In the event that data associated with the non-speculative memory access read request address is in the speculative cycle response buffer, centralized state machine 1950 can then satisfy the request merely by retrieving the data from the speculative cycle response buffer 1032 thereby avoiding the latency associated with accessing system memory 116. It should be noted that in the event that centralized state machine 1950 receives a write request to an address which is correspondent to data with the same address in speculative cycle response buffer 1032, centralized state machine 1950 will utilize speculative buffer checking and control logic 1030 to remove such data from speculative cycle response buffer, since it is likely that the write request will change the data in system memory 116 and thus gives rise to the likelihood that the data in speculative cycle response buffer 1032 will not be current. Alternatively, centralized state machine 1950 could replace the data associated with the address in speculative cycle response buffer 1032 with the data in the write request while simultaneously writing the data to system memory 116.

Referring now to FIG. 11B1, shown is an expanded view of an embodiment of memory controller 400 wherein is contained another embodiment of a speculative memory access request generation and utilization structure and operation. FIG. 11B1 is substantially the same as the embodiment shown in FIG. 9B1, except that further shown in FIG. 11B1 is that each reorder and bank select engine 5001–501B is now associated with a respective origin-sensitive speculative memory access request cycle generator 1101–110B. Also shown is that centralized state machine 902 has been replaced by centralized state machine 1902.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access." In another embodiment, origin-sensitive speculative memory access request cycle generators 1101–110B communicate with their respectively paired reorder and bank select engines 5001–500B, which subsequently transmit information indicating whether certain pending requests are speculative or not over control signal lines 1–B, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11B1, depicted is that centralized state machine 1902 has internal to it speculative buffer checking and control logic 1034 and speculative cycle response buffer 1036. As has been noted, destination-sensitive second-stage memory access request reordering device 404 receives memory requests as either speculative or true memory access requests. Thus, in light of the discussion set forth above, it is clear that centralized state machine 1902 will also receive such requests in that all memory access requests pass through it in the embodiments described herein.

Assuming that a request so received is a speculative request, centralized state machine 1902 will determine, using its control algorithms, whether the current pending memory operations in memory device buffers 8011–801D makes the execution of such speculative request advantageous. Assuming that such execution is advantageous, centralized state machine 1902 will execute the speculative memory operation request. Typically, the speculative memory operation request will be a read request. When data is received by centralized state machine 1902 in response to a speculative read request, that data is placed in speculative cycle response buffer 1036.

Thereafter, when centralized state machine 1902 receives a memory access read request, which is not a speculative request, centralized state machine 1902 utilizes speculative buffer checking and control logic 1034 to determine whether speculative cycle response buffer has within it data associated with the address of such a received memory access read request. That is, a speculative memory access request will not hit in the speculative cycle response buffer 1036, but rather will be passed through as a candidate for subsequent execution.

In the event that data associated with the non-speculative memory access read request address is in the speculative cycle response buffer, centralized state machine 1902 can then satisfy the request merely by retrieving the data from the speculative cycle response buffer 1036 thereby avoiding the latency associated with accessing system memory 116. It should be noted that in the event that centralized state machine 1902 receives a write request to an address which is correspondent to data with the same address in speculative cycle response buffer 1036, centralized state machine 1902 will utilize speculative buffer checking and control logic 1034 to remove such data from speculative cycle response buffer, since it is likely that the write request will change the data in system memory 116 and thus gives rise to the likelihood that the data in speculative cycle response buffer 1036 will not be current. Alternatively, centralized state machine 1900 could replace the data associated with the address in speculative cycle response buffer 1036 with the data in the write request while simultaneously writing the data to system memory 116.

Referring now to FIG. 11B2, shown is an expanded view of an embodiment of memory controller 400 wherein is contained another embodiment of a speculative memory access request generation and utilization structure and operation. FIG. 11B2 is substantially the same as the embodiment shown in FIG. 9B2, except that further shown in FIG. 11B2 is that each reorder and bank select engine 5001–501B is now associated with a respective origin-sensitive speculative memory access request cycle generator 1101–110B. Also shown is that centralized state machine 952 has been replaced by centralized state machine 1952.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access." In another embodiment, origin-sensitive speculative memory access request cycle generators 1101–110B communicate with their respectively paired reorder and bank select engines 5001–500B, which subsequently transmit information indicating whether certain pending requests are speculative or not over control signal lines 1–B, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11B2, depicted is that centralized state machine 1952 has internal to it speculative buffer checking and control logic 1038 and speculative cycle response buffer 1040. As has been noted, destination-sensitive second-stage memory access request reordering device 404 receives memory requests as either speculative or true memory access requests. Thus, in light of the discussion set forth above, it is clear that centralized state machine 1952 will also receive such requests in that all memory access requests pass through it in the embodiments described herein.

Assuming that a request so received is a speculative request, centralized state machine 1952 will determine, using its control algorithms, whether the current pending memory operations in memory device buffers 8011–801D makes the execution of such speculative request advantageous. Assuming that such execution is advantageous, centralized state machine 1952 will execute the speculative memory operation request. Typically, the speculative memory operation request will be a read request. When data is received by centralized state machine 1952 in response to a speculative read request, that data is placed in speculative cycle response buffer 1040.

Thereafter, when centralized state machine 1952 receives a memory access read request, which is not a speculative request, centralized state machine 1952 utilizes speculative buffer checking and control logic 1038 to determine whether speculative cycle response buffer has within it data associated with the address of such a received memory access read request. That is, a speculative memory access request will not hit in the speculative cycle response buffer 1040, but rather will be passed through as a candidate for subsequent execution.

In the event that data associated with the non-speculative memory access read request address is in the speculative cycle response buffer, centralized state machine 1952 can then satisfy the request merely by retrieving the data from the speculative cycle response buffer 1040 thereby avoiding the latency associated with accessing system memory 116. It should be noted that in the event that centralized state machine 1952 receives a write request to an address which is correspondent to data with the same address in speculative cycle response buffer 1040, centralized state machine 1952 will utilize speculative buffer checking and control logic 1038 to remove such data from speculative cycle response buffer, since it is likely that the write request will change the data in system memory 116 and thus gives rise to the likelihood that the data in speculative cycle response buffer 1040 will not be current. Alternatively, centralized state machine 1952 could replace the data associated with the address in speculative cycle response buffer 1040 with the data in the write request while simultaneously writing the data to system memory 116.

Referring now to FIG. 11C1, shown is an expanded view of an embodiment of memory controller 400 wherein is contained another embodiment of a speculative memory access request generation and utilization structure and operation. FIG. 11C1 is substantially the same as the embodiment shown in FIG. 9C1, except that further shown in FIG. 11C1 is that each reorder and bank select engine 5001–501B is now associated with a respective origin-sensitive speculative memory access request cycle generator 1101–110B. Also shown is that centralized state machine 904 has been replaced by centralized state machine 1904.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access." In another embodiment, origin-sensitive speculative memory access request cycle generators 1101–110B communicate with their respectively paired reorder and bank select engines 5001–500B, which subsequently transmit information indicating whether certain pending requests are speculative or not over control signal lines 1–B, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11C1, depicted is that centralized state machine 1904 has internal to it speculative buffer checking and control logic 1042 and speculative cycle response buffer 1044. As has been noted, destination-sensitive second-stage memory access request reordering device 404 receives memory requests as either speculative or true memory access requests. Thus, in light of the discussion set forth above, it is clear that centralized state machine 1904 will also receive such requests in that all memory access requests pass through it in the embodiments described herein.

Assuming that a request so received is a speculative request, centralized state machine 1904 will determine, using its control algorithms, whether the current pending memory operations in memory device buffers 8011–801D makes the execution of such speculative request advantageous. Assuming that such execution is advantageous, centralized state machine 1904 will execute the speculative memory operation request. Typically, the speculative memory operation request will be a read request. When data is received by centralized state machine 1904 in response to a speculative read request, that data is placed in speculative cycle response buffer 1044.

Thereafter, when centralized state machine 1904 receives a memory access read request, which is not a speculative request, centralized state machine 1904 utilizes speculative buffer checking and control logic 1042 to determine whether speculative cycle response buffer has within it data associated with the address of such a received memory access read request. That is, a speculative memory access request will not hit in the speculative cycle response buffer 1044, but rather will be passed through as a candidate for subsequent execution.

In the event that data associated with the non-speculative memory access read request address is in the speculative cycle response buffer, centralized state machine 1904 can then satisfy the request merely by retrieving the data from the speculative cycle response buffer 1044 thereby avoiding the latency associated with accessing system memory 116. It should be noted that in the event that centralized state machine 1904 receives a write request to an address which is correspondent to data with the same address in speculative cycle response buffer 1044, centralized state machine 1904 will utilize speculative buffer checking and control logic 1042 to remove such data from speculative cycle response buffer, since it is likely that the write request will change the data in system memory 116 and thus gives rise to the likelihood that the data in speculative cycle response buffer 1044 will not be current. Alternatively, centralized state machine 1904 could replace the data associated with the address in speculative cycle response buffer 1044 with the data in the write request while simultaneously writing the data to system memory 116.

Referring now to FIG. 11C2, shown is an expanded view of an embodiment of memory controller 400 wherein is contained another embodiment of a speculative memory access request generation and utilization structure and operation. FIG. 11C2 is substantially the same as the embodiment shown in FIG. 9C2, except that further shown in FIG. 11C2 is that each reorder and bank select engine 5001–501B is now associated with a respective origin-sensitive speculative memory access request cycle generator 1101–110B. Also shown is that centralized state machine 954 has been replaced by centralized state machine 1954.

Each origin-sensitive speculative memory access request cycle generator 1101–110B operates in tandem with its respectively paired reorder and bank select engine 5001–501B. Each origin-sensitive speculative memory access request cycle generator 1101–110B is respectively paired with a reorder buffer 5111–511B, and uses as input the memory access requests present in each respectively paired reorder buffer 5111–511B; furthermore, each origin-sensitive speculative memory access request cycle generator 1101–110B may also maintain cycle history in memory or registers (not shown) private to each such origin-sensitive speculative memory access request cycle generator. Each origin-sensitive speculative memory access request cycle generator 1101–110B uses algorithms that are specific to each buffer 1 through B in order to generate speculative cycle requests.

Each origin-sensitive speculative memory access request cycle generator 1101–110B places speculative cycle requests into its associated reorder buffer 5111–511B. Speculative cycle requests are reordered along with other requests by reorder and bank select engines 5001–501B and are ultimately presented to destination-sensitive second-stage memory access request reordering device 404 as potential memory access candidates in the fashion described above. In one embodiment, each memory operation candidate is flagged with information that characterizes its relationship to the last cycle request accepted by the second stage, and also with a status flag indicating whether the candidate is a true memory operation request or a speculative memory access, or cycle, request. Such flagging can be accomplished by use of tags 502, described above, and is performed by speculative memory access request cycle generator 1101–110B, which change the status flag from a default "true access" value to a value indicating "speculative access." In another embodiment, origin-sensitive speculative memory access request cycle generators 1101–110B communicate with their respectively paired reorder and bank select engines 5001–500B, which subsequently transmit information indicating whether certain pending requests are speculative or not over control signal lines 1–B, thereby eliminating the need to add on explicit flags (or tags) to each request.

For each active cycle request, destination-sensitive second-stage memory access request reordering device 404 uses a combination of the priority of the requester, the address status, the speculative status, the current state of the DRAM, and any other data which may be present, such as that described in relation to tags 502, above, for determining which candidate is selected as the next cycle issued to the DRAM (that is destination-sensitive second-stage memory access request reordering device 404 engages in the activity described above with the additional capability of responding to and taking notice of requests marked as speculative). In one embodiment, destination-sensitive second-stage memory access request reordering device 404 uses a "cost based" algorithm for determining which candidate is to be selected as the next memory access request cycle issued to a particular DRAM 1301–130D. A high cost is assigned to operations that will take longer to complete, and a low cost is assigned to operations that will be completed sooner (when such operations are compared to system memory state, and other information gleaned from other components within the system as has been discussed above). Such cost assessments may be further modified by the priority of the memory request initiator, and/or the speculative nature (real or speculative) of a request.

Destination-sensitive second-stage memory access request reordering device 404 may choose to disregard a speculative request when the cost of issuing the request would be high in comparison to the cost of other requests pending. The ability to discard the speculative requests under speculative loading situations reduces the worst case effects of speculative memory access request cycles while allowing them to occur when they can provide benefit at low cost.

A key advantage of the foregoing described embodiment is that this embodiment allows each origin-sensitive speculative memory access request cycle generator algorithm to be customized for each individual reorder buffer, or bus/source. The origin-sensitive speculative memory access request cycle generator for each buffer can employ different algorithms suited to the buses/sources. This is in contrast to a solution that looks at cycle requests from all buses/sources lumped together and attempts to make cycle predictions from a unified request buffer.

The origin-sensitive speculative memory access request cycle generator paired with a respective reorder buffer embodiment also allows the benefits of speculative memory access request cycles to be obtained while at the same time eliminating the worst case interference problems. Essential to eliminating the adverse impact of speculative memory access request cycles is the ability of destination-sensitive second-stage memory access request reordering device 404 to discard speculative memory operation requests when loading dictates. This ability is enabled because the destination-sensitive second-stage has the information as to the speculative nature of the request, the address (page) status with respect to the last cycle, the state of any one or more DRAMs 1301–130D present, and the outstanding requests from all other buses/sources. Alternative solutions that do not allow rejection of the speculative prefetch cycles can decrease system performance when loading is high.

Further referring to FIG. 11C2, depicted is that centralized state machine 1954 has internal to it speculative buffer checking and control logic 1046 and speculative cycle response buffer 1048. As has been noted, destination-sensitive second-stage memory access request reordering device 404 receives memory requests as either speculative or true memory access requests. Thus, in light of the discussion set forth above, it is clear that centralized state machine 1954 will also receive such requests in that all memory access requests pass through it in the embodiments described herein.

Assuming that a request so received is a speculative request, centralized state machine 1954 will determine, using its control algorithms, whether the current pending memory operations in memory device buffers 801I–801D makes the execution of such speculative request advantageous. Assuming that such execution is advantageous, centralized state machine 1954 will execute the speculative memory operation request. Typically, the speculative memory operation request will be a read request. When data is received by centralized state machine 1954 in response to a speculative read request, that data is placed in speculative cycle response buffer 1048.

Thereafter, when centralized state machine 1954 receives a memory access read request, which is not a speculative request, centralized state machine 1954 utilizes speculative buffer checking and control logic 1046 to determine whether speculative cycle response buffer has within it data associated with the address of such a received memory access read request. That is, a speculative memory access request will not hit in the speculative cycle response buffer 1048, but rather will be passed through as a candidate for subsequent execution.

In the event that data associated with the non-speculative memory access read request address is in the speculative cycle response buffer, centralized state machine 1954 can then satisfy the request merely by retrieving the data from the speculative cycle response buffer 1048 thereby avoiding the latency associated with accessing system memory 116. It should be noted that in the event that centralized state machine 1954 receives a write request to an address which is correspondent to data with the same address in speculative cycle response buffer 1048, centralized state machine 1954 will utilize speculative buffer checking and control logic 1046 to remove such data from speculative cycle response buffer, since it is likely that the write request will change the data in system memory 116 and thus gives rise to the likelihood that the data in speculative cycle response buffer 1048 will not be current. Alternatively, centralized state machine 1954 could replace the data associated with the address in speculative cycle response buffer 1048 with the data in the write request while simultaneously writing the data to system memory 116.

VI. Structure and Operation for Speculative Opening and Accessing Pages in Memory Based on Data Stream Type The foregoing has described various embodiments of a memory controller incorporating an origin-sensitive first stage and a destination-sensitive second stage. One aspect of origin sensitivity that may be utilized for efficient memory control operation is knowledge of the type of data stream making access requests. That knowledge may be utilized to open a new page speculatively when approaching the end of a current page. For example, when a current access is approaching the end of a page and the data stream is highly correlated (e.g. an isochronous data stream), it would be advantageous to speculatively open a next page under the assumption that the data stream will continue to access system memory sequentially. When the access request is received for the new page, access can begin immediately without taking the time to precharge and open the new page. In addition, it is also possible to speculative read data out of the newly opened page. That may be accomplished both in the two-stage memory controller described above as well as in other memory controllers, an exemplary one of which is described further herein.

The type of data stream for which such speculative opening is appropriate can vary. In fact, such speculative opening can be useful for any data stream that is correlated to large sequential memory access operations such as data streams for video and audio applications. However, one example of such a data stream is an isochronous data stream.

Figure 12:
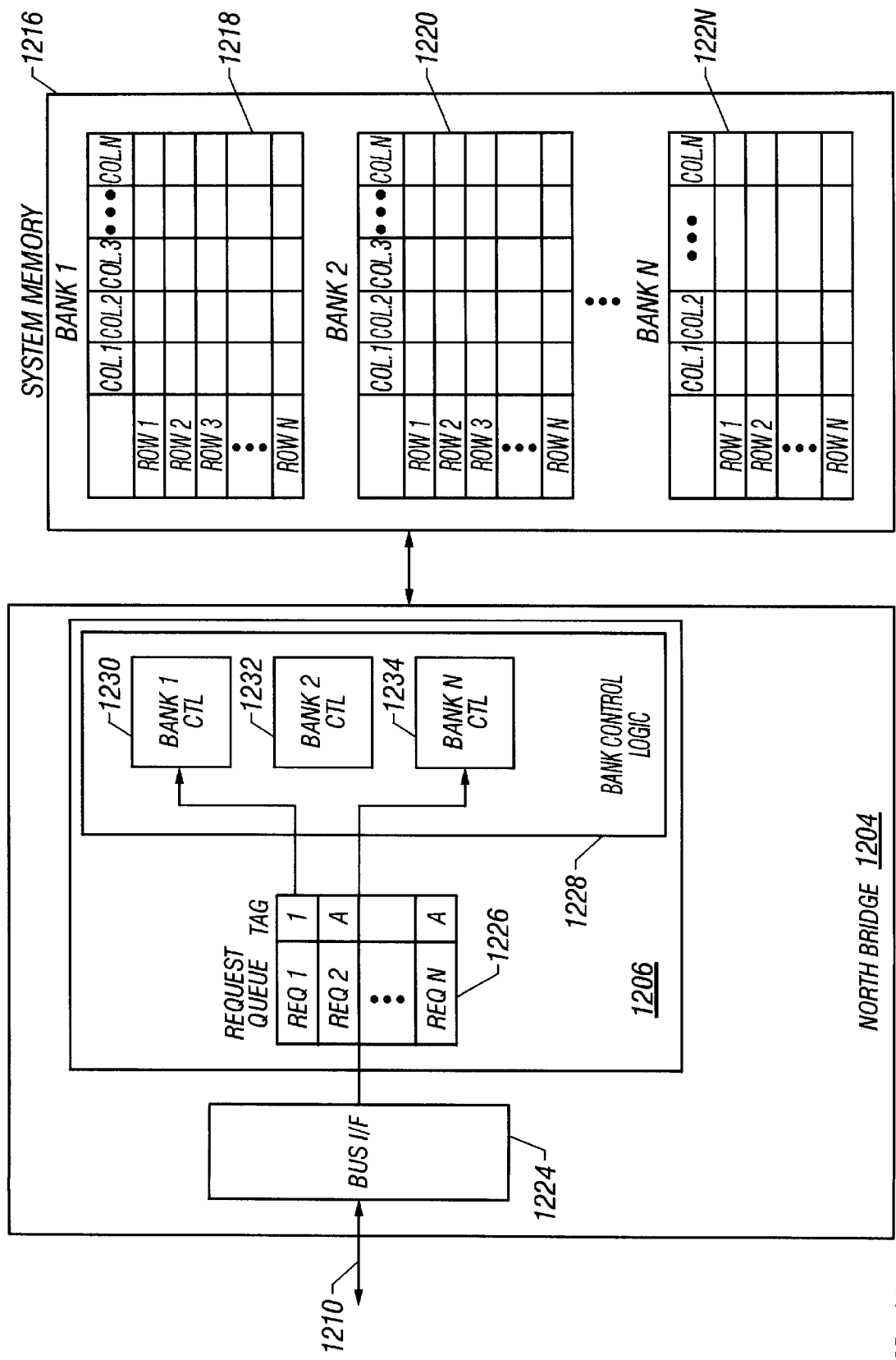
FIG. 12 shows a high-level block diagram that illustrates one embodiment of a memory controller in which knowledge of data stream type can be used advantageously.

Referring to FIG. 12, a high-level block diagram illustrates one embodiment of a memory controller in which knowledge of data stream type can be used advantageously. Bus 1210 couples external devices (not shown) to Northbridge 1204. Northbridge 1204 includes memory controller 1206, which corresponds to memory controller 400 in that it provides a memory control function to control system memory 1216. Bus 1210 may be any of a variety of buses, including a PCI bus, an AGP bus or a packet based bus described further herein. In addition, note that Northbridge 1204 may couple to one or more of those or other buses. Note also, that in other embodiments, microprocessor 114 (see FIG. 1), including CPU 104, L1 cache 111 and L2 cache 112, may be integrated onto the same integrated circuit with memory controller 1204.

As shown in FIG. 12, system memory 1216 includes a number of banks of memory 1218–122N. Each bank of memory includes a number of rows (or pages), each of the rows including a plurality of columns. As an example, each bank may include 4K rows by 512 columns by 8.

In order to more efficiently utilize system memory 1218, memory controller 1206 speculatively opens an appropriate page in the appropriate bank in system memory 116 when the data stream currently accessing the memory comes within a predetermined distance to the end of a page and when the data stream is of a particular type. For instance, if an isochronous stream is accessing the memory, it is a reasonable assumption that the stream will continue to access sequential data in the near future. Thus, as the data stream approaches the end of a page in memory, it would be advantageous to speculatively open a next page in memory that holds the next sequential data for the stream on the assumption that the stream will soon need that data. For example, assume that the current access that is beginning, accesses the last 8 bytes in row 2 of bank 1. That means that at the end of the current access, the final column (column N) will have been accessed. If the isochronous stream continues, the memory controller 1206 will need to access a new row. If the next logical address maps to a page in the same memory bank (bank 1), then efficiencies cannot be gained since typically only one page in a bank may be opened at a time. Thus, the memory controller, under such circumstances, would have to wait until the current access is complete before opening another page in the same bank.

However, assuming that the next logical address maps to a different bank, e.g., bank 2 (1220), row 2, memory controller 1206 will check to see if that page is open and if not, speculatively opens that page prior to an access request for row from the data stream. Opening the new row may involve precharging that particular row or the entire bank in which the row resides depending upon such factors as the type of DRAM used. Once the row is precharged, the row can be opened using the appropriate activate command. When the memory controller 1206 later receives the memory access request from the isochronous stream for the data residing in the newly opened page, the access operation is more efficient because memory controller does not have to precharge the particular page and open that page.

Even if the memory access requested is a write operation for a stream of data, efficiencies are still achieved because the opening of the next row can proceed prior to the actual write request, thus saving memory cycles.

In addition to opening a page speculatively, the memory controller may also prefetch data out the speculatively opened page, for read operations, to provide even greater efficiencies. The prefetch operation may utilize the speculative cycle generators 1501–150S illustrated in FIGS. 10A1–10C2 or the speculative cycle generators 1101–110B illustrated in FIGS. 11A1–11C2.

The speculative cycle generators may determine based on origin of the data that the data stream is a highly correlated data stream meaning that the data stream is likely to sequentially access memory. The origin information may be considered as a surrogate for the type of data stream. For example, if the data stream is AGP related or if the data stream is 1394 related, that knowledge may be sufficient to indicate that the data is likely to be highly correlated and a speculative access should be generated by the speculative cycle generator(s). Thus, the speculative cycle generator 1102, shown in FIGS. 11A1–11C2, which is associated with AGP 102 may generate speculative access requests when the source is AGP and the operation is a read operation.

However, rather than request a speculative read, the memory controller may limit speculative actions based on type of data stream to opening the "next" page. In one such embodiment, origin-sensitive first stage 402 may provide tag information such as indicator 500 (see FIG. 6), indicating, e.g., an AGP read request, to destination-sensitive second-stage 404, for use in determining whether to speculatively open a next page. In particular, centralized state machine 800 (FIG. 8A1) or distributed state machine 850 (FIG. 8A2) may utilize that tag information provided from the reorder buffers 5611–561S, in conjunction with information relating to the approaching end of a page in a current access, to speculatively open a next page. The approaching end of a page is determined by control logic associated with each bank as described further below.

Thus, the two-stage memory controller may be utilized to speculatively open pages based on type of data stream and approaching end of a page utilizing the tag information described above. The two-stage memory controller may also be used to speculatively read data in a manner described previously herein.

In one embodiment, bus 1210 is a packet-based point to point bus which multiplexes packets from a variety of sources onto the bus. Thus, during a particular time period on the bus, a packet from one source may be followed by a packet from a completely different source. Each packet is typically made up of a plurality of bytes. The packet multiplexing provides "virtual channel" capability between a plurality of I/O devices and such destinations as system memory. Thus, one channel may be from an isochronous source such as a 1394 bus or a Universal Serial Bus (USB), while another channel may carry traffic for a network interface card. In fact, one channel may be dedicated to carry only isochronous data.

Each packet provides information as to its source and destination, either directly or via the channel over which it is carried. Thus, the channel identity may provide, an origin identity in a similar manner to transactions over AGP being associated with the AGP.ource as AGP bus. Alternatively, packet information may specifically identify the source. An exemplary packet multiplexed bus is described in U.S. application Ser. No. 09/326,034 entitled "Computer Interconnection Bus Link Layer" and in U.S. application Ser. No. 09/098,854, entitled "Bus Optimized for Personal Computer Data Traffic", which applications are incorporated herein by reference.

While the two-stage memory controller may advantageously utilize the information relating to type of data stream, a two-stage memory controller is not necessary in order to exploit the advantage provided by utilizing knowledge as to the type of data stream. Referring again to FIG. 12, an high level block diagram illustrates a memory controller that speculatively opens a new page based on the type of data stream and the approaching end of a page currently being accessed. Bus interface (I/F) 1224 receives memory access requests over bus 1210. Bus I/F 1224 provides those requests in turn to request queue 1226, which as shown includes request 1, request 2 and request N. Tags are associated with each of the requests. Those tags identify the type of data that is associated with the request. For example, the bus interface may be associated with an AGP bus and requests over that bus are then assumed to be associated with graphics data.

Assume that request 1 came from an isochronous source. That knowledge may be determined because of the identify of a virtual channel from which request 1 was received, ascertained from the source device (e.g. it was received from a 1394 bus) or determined from the bus that the request came in one, e.g., the AGP, or any other suitable manner. As shown in FIG. 12, request 1 has associated an isochronous tag "I" indicating that the request relates to isochronous data. Request 2 and request N each have an asynchronous request tag A indicating that the memory access associated with those requests relate to asynchronous data. Thus, for example, request 1 may relate to a video data stream while requests 2 and N relate to system memory accesses from the network card.

The requests are provided to bank control logic 1228. Each bank 1218–122N in memory has associated bank control logic that tracks, among other things, which pages are open in each bank, and when an end of page is approaching. Note that logical to physical mapping takes place to translate the logical addresses provided by memory access requests from bus 1210 to physical addresses in the appropriate bank(s) of memory. The bank control 1228 can respond to the type of data stream (e.g. isochronous) and the approaching end of an access to a first page, by determining what is the next page to open assuming that the data stream continues its sequential access. The bank control logic then causes the appropriate page in the appropriate bank to be precharged and opened if that page is not already open.

In addition to opening the next page, the bank control logic can also speculatively read a portion of the next page, e.g., the next cache line size as well. That means that the memory controller requires a speculative cycle response buffer such as speculative cycle response buffer 1028 illustrated in FIG. 11A1 as well as requiring appropriate checking of the buffer for non-speculative read requests to determine if the requested data resides in the response buffer. In addition, as previously described, the speculative cycle response buffer is checked for writes to ensure that coherency is maintained between the speculative buffer and system memory.

Figure 13:
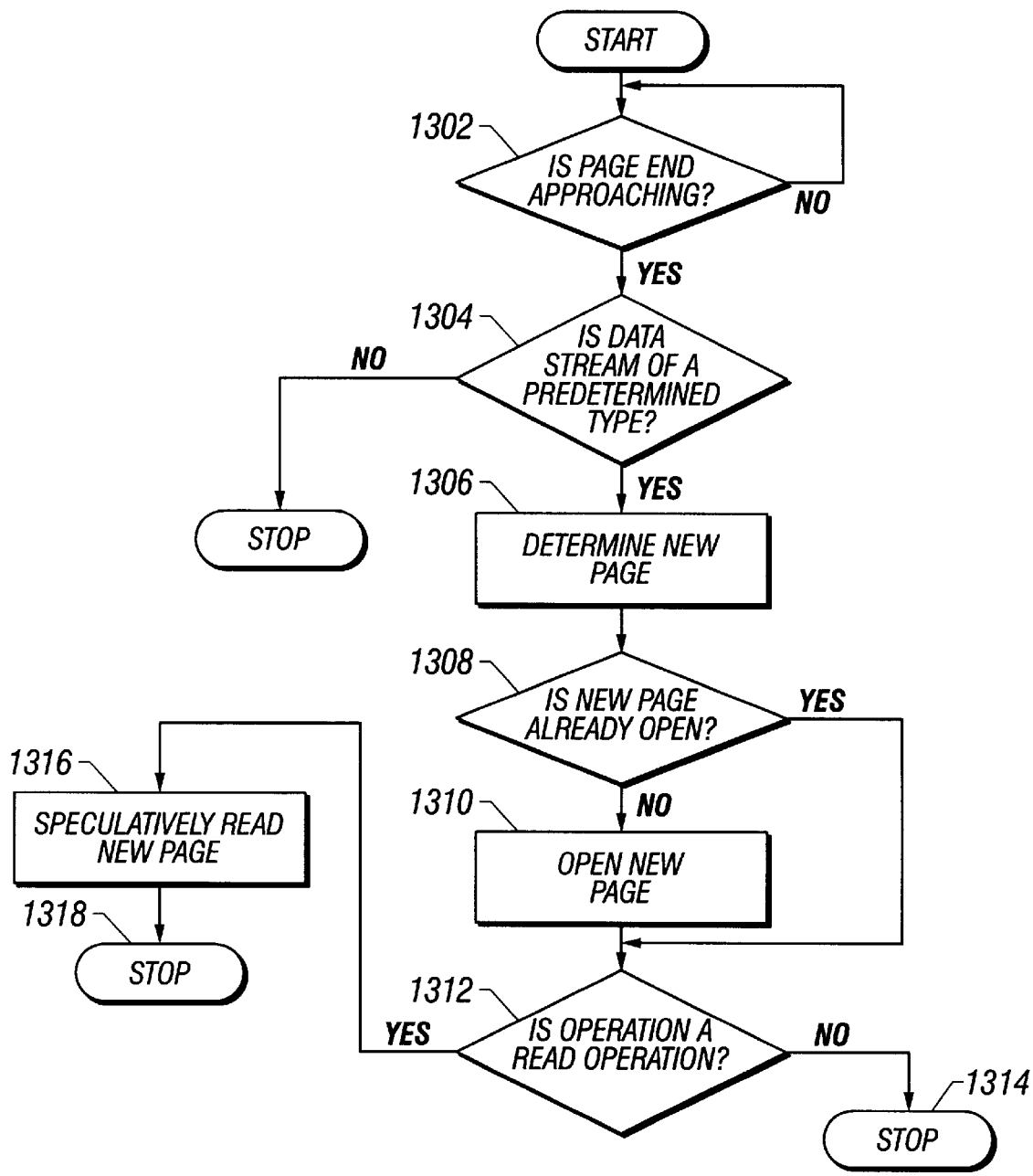
FIG. 13 is a flow chart that illustrates the high level operation of the memory controller using knowledge of data stream type and an approaching end of page indication according to one embodiment of the invention.

Referring to FIG. 13, a flow chart illustrates the high level operation of the memory controller according to one embodiment of the invention. Assume that each page in system memory 1216 holds 512 bytes and that each access to a page reads or writes 64 bytes. The access size is intended only to be exemplary and sizes of pages and accesses will vary. Assume also that each bank in system memory 1216 has respective control logic 1230–1234 associated with it that tracks bank accesses. In particular, the control logic tracks when any particular access for a particular page in a particular bank get within a predetermined distance from the end of an open page. Finally, assume in this embodiment, that the predetermined distance from the end of an open page is 64 bytes, and thus an approaching end of page indication is provided when a memory access request for the last 64 bytes in a page is executed.

Assume an access request for bank 11218 is provided to bank control logic 1228, from request queue 1226. As shown in 1302, the bank 1 control logic 1230 determines if that access to bank 1 is approaching the end of the page (the last sixty-four bytes in the page in the example given). If so, then bank one control logic 1230 determines that the current memory access is approaching the end of the page and provides a signal indicative of the approaching page end. If not, the bank one control logic continues to monitor accesses in 1302 to determine if the approaching end of page condition becomes true. Note that determining how close a page is to its end (e.g. 64 bytes or 1 byte) before it should be considered as an approaching end of page will depend on such factors as time to open another page in system memory and how long a current access takes. As a particular memory controller may be used with a variety of types and speeds of DRAMs, it may be advantageous to make programmable how close to the end of page is sufficient to trigger the approaching end of page indication. That may provide advantages when interfacing with DRAMs of different speeds, e.g., "tuning" for new devices without the need for redesign of the memory controller.

The indication of approaching end of page (not shown) is provided to bank control logic 1228. Bank control logic 1228, which also receives the tag indicating data stream type from request queue 1226, determines in 1304 if the type of data associated with the approaching end of page access is of the predetermined type warranting speculatively opening a page. Thus, the bank control logic logically combines that fact with the approaching end of page signal to determine whether to speculatively open the next page. The logical combination may be implemented as an AND function. If the data type is of the predetermined type, in 1306 control logic 1228 determines the next address and thus the next page to open. It is possible that the next address crosses a logical page boundary and thus maps to a different physical page than the one currently being accessed. If so, speculative opening of the next page may be inhibited.

Once the next page is determined in 1306, the bank control logic determines if the page corresponding to that address is already open in 1308. If the page is already open, the control logic can proceed to 1312 to determine the appropriate course of action to take based on whether the access was a read or write operation. If the page is not already open, the control logic opens the new page in 1310. If the operation is a write operation, or if the particular implementation of the memory controller limits speculative activity to opening the page, the control logic stops at 1314.

If on the other hand, the operation is a read operation and the memory controller implements speculative reads, then the speculative read takes place in 1316 before the controller stops in 1318. As described elsewhere herein, other speculative accesses may occur based on other criteria.

The foregoing detailed description has set forth various embodiments of the present invention via the use of block diagrams, pictographic representations, and examples. It will be understood as notorious by those within the art that each component, step, and operation illustrated by the use of block diagrams, pictographic representations, and examples can be implemented, individually and/or collectively, by a wide range of hardware, software, firmware, or any combination thereof. In one embodiment, the present invention is implemented via Application Specific Integrated Circuits (ASICs). However, those skilled in the art will recognize that the embodiments disclosed herein, in whole or in part, can be equivalently implemented in standard Integrated Circuits, as a computer program running on a computer, as firmware, or as virtually any combination thereof and that designing the circuitry and/or writing the code for the software or firmware would be well within the skill of one of ordinary skill in the art in light of this specification.

OTHER EMBODIMENTS

Several various embodiments have been described above, and it will be obvious to those skilled in the art that, based upon the teachings herein, changes and modifications may be made without departing from this invention and its broader aspects. That is, all examples set forth herein are intended to be exemplary and non-limiting.

For example, while the foregoing described embodiments have been described in the context of a single processor for the sake of clarity, it will be understood by those within the art that the present invention could be used in multiple processor environments. Accordingly, the described architectures are not intended to be limiting.

For example, it was mentioned in relation to the foregoing described embodiments that the memory status lines need not equate to physically connected devices; that is, it was explained that embodiments exist whereby operable connection is achieved and memory status obtained by system components (e.g., centralized state machines, device arbiter and state engines, or memory controllers) tracking past memory access activities and inferring the status of one or more memory devices from that past activity. Likewise, embodiments exist whereby other of the above-described connections can be achieved by analogous logical associations such that the desired functionality of the above-described connections can be achieved, and such alternate embodiments are intended to be covered by such connectivity of the above-set-forth embodiments; that is, it is to be understood that any reference to connection between components, as used herein, is intended to be representative of both the physical and logical connections. Accordingly, the described architectures are not intended to be limiting.

Also for example, while the embodiments have been described in the context of the AGP interface standard, it will be recognized that the embodiments herein can be applied to other similar problems which exist in other non-AGP interface standard systems wherein similar problems analogous to those solved by the present invention exist. For example, data processing systems wherein the AGP interface standard is not utilized, such as standard PCI and ISA systems. Thus, the specific protocols described are not intended to be limiting.

The foregoing described embodiments wherein the different components are contained within different other components (e.g., the speculative memory request response buffer checking and control logic unit contained within centralized state machine). It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when same claim includes the introductory phrases "one or more" or "at least one" and indefinite articles such as "a" or "an"; the same holds true for the use of definite articles.

What is claimed is:

1. A method of operating a memory controller comprising:
    detecting an approaching end of a currently open page in a memory for a memory access operation for a data stream; and
    opening a next page in the memory according to the detection of the approaching end and the data steam being of a predetermined type.

2. The method as recited in claim 1 wherein the predetermined type of data stream is isochronous.

3. The method as recited in claim 1 wherein the predetermined type of data stream is correlated to large sequential memory access operations.

4. The method as recited in claim 1 further comprising performing a speculative read operation from the next page according to the detection of the approaching end and the predetermined type of data stream being isochronous.

5. The method as recited in claim 1 wherein the memory access operation is a read operation.

6. The method as recited in claim 1 wherein the memory access operation is a write operation.

7. The method as recited in claim 1 wherein the type of data stream is detected according to an identification associated with the data stream, the data stream being received over a bus coupled to the memory controller.

8. The method as recited in claim 7 wherein the type of data stream is determined according to the identification provided in a packet over the bus, and wherein the bus is a packet multiplexed bus.

9. The method as recited in claim 8 wherein the identification identifies the type of data stream as being an isochronous data stream.

10. The method as recited in claim 7 wherein the identification is determined according to a channel identifier provided with the data stream as graphics data, the channel identifier indicating a channel on the bus carrying isochronous data.

11. The method as recited in claim 1 wherein the next page is a next logical page for the data stream and contains a first physical address after an address that accesses a last entry in the current page.

12. An integrated circuit including a memory controller, the memory controller comprising:
    at least a first end of page detecting circuit, corresponding to a first bank of a memory having multiple banks, the first end of page detecting circuit responsive to an approaching end of an open page in the first bank, caused by a memory access by a data stream, to generate an approaching end of open page indication at a predetermined number of memory locations before a last location in the open page; and
    speculative page opening logic, coupled to receive a type of data stream indication corresponding to the data stream, and coupled to receive the approaching end of page indication, the speculative page opening logic being responsive to the approaching end of page indication and the type of data stream indication to cause a next page to be opened if the approaching end of page indication is asserted and the type of data being utilized during the memory operation is of a predetermined type.

13. The integrated circuit as recited in claim 12 wherein the next page contains data that follows the current page when the data stream is sequential.

14. The integrated circuit as recited in claim 12 wherein the first end of page detecting circuit includes a comparator for comparing an address being currently accessed with the last address to determine the approaching end of the page.

15. The integrated circuit as recited in claim 12 further comprising access logic, responsive to the speculative page opening logic opening the next page, to access the next page speculatively.

16. The integrated circuit as recited in claim 12 wherein the next page is opened by issuing an activate command to the next page.

17. The integrated circuit as recited in claim 12 wherein the type of data stream is isochronous.

18. The integrated circuit as recited in claim 12 wherein the memory access operation is a read operation.

19. The integrated circuit as recited in claim 12 wherein the memory access operation is a write operation.

20. The integrated circuit as recited in claim 12 wherein the type of data stream is detected according to a source identification received over a bus coupled to the memory controller.

21. The integrated circuit as recited in claim 12 wherein the type of data stream is determined according to a source identification provided in a packet over the bus.

22. The integrated circuit as recited in claim 12 wherein the source identification identifies the data stream as an isochronous data stream.

23. The integrated circuit as recited in claim 12 further comprising a central processing unit coupled to the memory controller.

24. The integrated circuit in claim 12 wherein the predetermined number of locations before the last location is programmable.

25. A memory controller comprising:

means for detecting an approaching end of a currently open page in a memory for a memory access operation; and means for opening a next page in the memory according to detection of the approaching end and data steam associated with the memory access operation being of a predetermined type.

26. The method as recited in claim 25 wherein the predetermined type of data stream is correlated to large sequential memory access operations.

* * * * *